United States Patent [19]
Wada et al.

[11] Patent Number: 5,966,324
[45] Date of Patent: Oct. 12, 1999

[54] STATIC SEMICONDUCTOR MEMORY DEVICE DRIVING BIT LINE POTENTIAL BY BIPOLAR TRANSISTOR SHARED BY ADJACENT MEMORY CELLS

[75] Inventors: Tomohisa Wada; Yutaka Arita, both of Hyogo, Japan

[73] Assignee: Mitsubishi Denki Kabushiki Kaisha, Tokyo, Japan

[21] Appl. No.: 08/896,333

[22] Filed: Jul. 17, 1997

[30] Foreign Application Priority Data

Dec. 5, 1996 [JP] Japan ..................... 8-325699

[51] Int. Cl.⁶ ............................................ G11C 11/34
[52] U.S. Cl. ...................... 365/177; 365/155; 365/179; 365/225.6
[58] Field of Search ............................. 365/177, 203, 365/154, 156, 155, 179, 225.6

[56] References Cited

U.S. PATENT DOCUMENTS

| | | | |
|---|---|---|---|
| 5,016,214 | 5/1991 | Laymoun | 365/154 |
| 5,483,383 | 1/1996 | Choi et al. | 365/177 |
| 5,673,230 | 9/1997 | Kuriyama | 365/203 |
| 5,677,866 | 10/1997 | Kinoshita | 365/156 |

*Primary Examiner*—David Nelms
*Assistant Examiner*—Thong Le
*Attorney, Agent, or Firm*—McDermott, Will & Emery

[57] ABSTRACT

Memory cells which are adjacent to each other along a column direction share a bipolar transistor driving the potential level of a corresponding bit line. Other memory cells which are adjacent to each other in the column direction share another bipolar transistor driving the potential level of another corresponding bit line. Each bipolar transistor drives the potential level of the corresponding bit line in response to storage information of a selected memory cell, whereby data can be read at a high speed with a low power supply voltage.

15 Claims, 33 Drawing Sheets

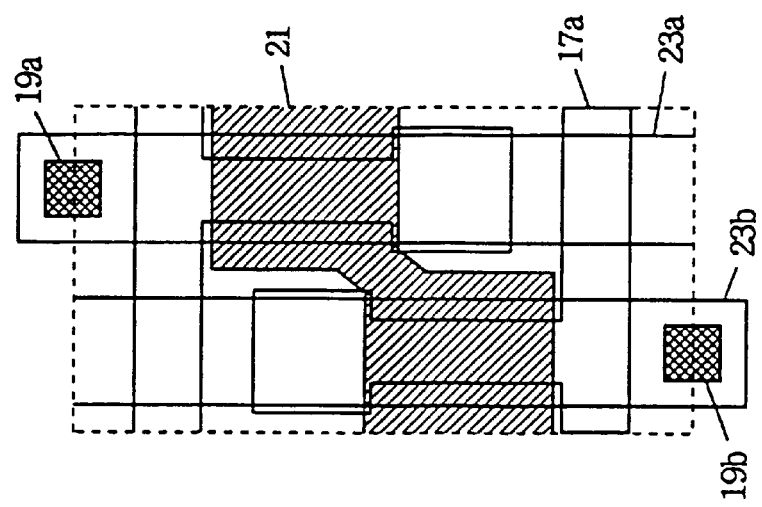
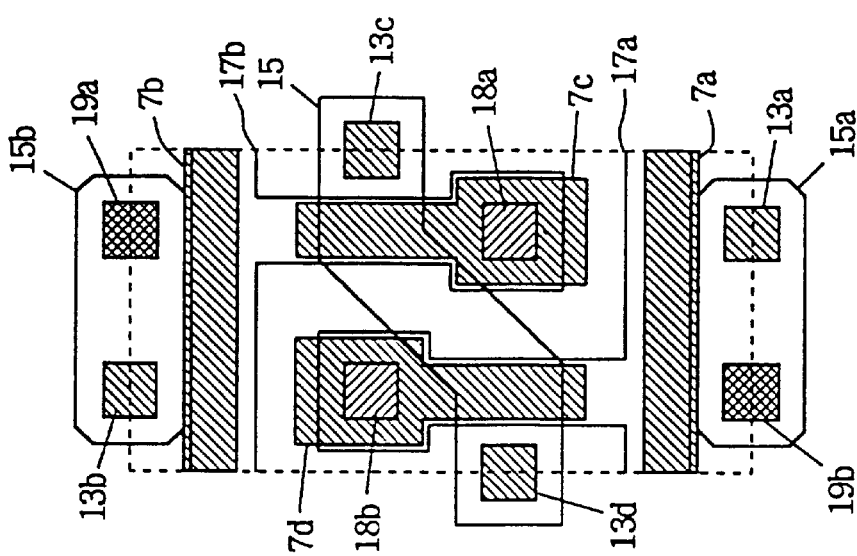
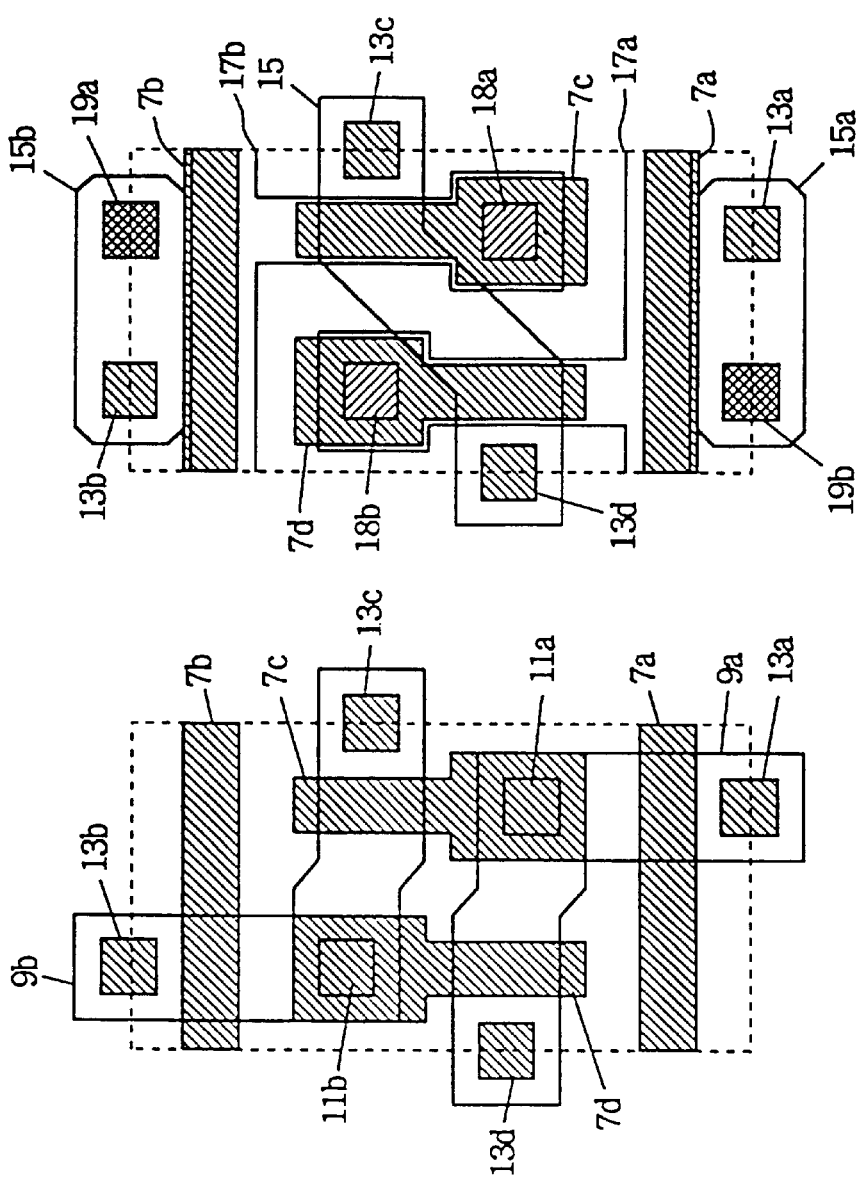

WORD LINE WL0
WORD LINE WL1

STATIC SEMICONDUCTOR MEMORY DEVICE DRIVING BIT LINE POTENTIAL BY BIPOLAR TRANSISTOR SHARED BY ADJACENT MEMORY CELLS

BACKGROUND OF THE INVENTION

1. Field of the Invention

The present invention relates to a structure of a static semiconductor memory device, and more particularly, it relates to a structure of a static semiconductor memory device which can implement a high-speed operation with low power consumption while suppressing increase of a memory cell area at a low power supply voltage.

2. Description of the Background Art

A conventional static semiconductor memory device is now described with reference to a static random access memory (hereinafter referred to as SRAM).

FIG. 43 is a schematic block diagram showing the structure of a read-system circuit of a conventional SRAM 3000.

The read-system circuit of the conventional SRAM 3000 comprises a precharge circuit 3002 for precharging a pair of bit lines BL and /BL at an internal power supply potential before starting a read operation, a memory cell 3004 connected with the pair of bit lines BL and /BL, constant current sources 3006a and 3006b for supplying prescribed constant currents to the bit lines BL and /BL respectively, and a read circuit 3008 for receiving the potentials of the pair of bit lines BL and /BL and outputting read data.

The memory cell 3004 includes a static latch circuit which is formed by invertors 3010 and 3012 whose inputs and outputs are connected with each other, and access transistors 3014 and 3016 for switching connection between the pair of bit lines BL and /BL and input/output nodes of the static latch circuit in response to the potential level of a word line WL.

FIG. 44 is a circuit diagram showing the structure of the memory cell 3004 shown in FIG. 43 in detail.

Referring to FIG. 44, the memory cell of the conventional SRAM includes driver transistors Q1 and Q2, access transistors Q3 and Q4, and high-resistance elements R1 and R2. The driver transistors Q1 and Q2 and the access transistors Q3 and Q4 are N-channel MOS transistors. The high-resistance elements R1 and R2 are employed as load elements of the memory cell.

The gate of the driver transistor Q1 is connected with the drain (storage node N2) of the driver transistor Q2, while the gate of the driver transistor Q2 is connected with the drain (storage node N1) of the driver transistor Q1.

Namely, an invertor formed by the high-resistance element R1 and the driver transistor Q1 is cross-connected with an invertor formed by the high-resistance element R2 and the driver transistor Q2, thereby forming a latch circuit. The access transistor Q3 is connected between the bit line BL and the storage node N1, and its gate is connected to the word line W.

The access transistor Q4 is connected between the bit line /BL and the storage node N2, and its gate is connected to the word line WL. The high-resistance element R1 is connected between a node which is supplied with a power supply potential Vcc and the storage node N1. The high-resistance element R2 is connected between another node which is supplied with the power supply potential Vcc and the storage node N2.

Such a memory cell is generally called a high-resistance load memory cell.

Such a high-resistance load memory cell generally has the following stereoscopic structure, in order to reduce the area of the memory cell:

The driver transistors Q1 and Q2 and the access transistors Q3 and Q4 are formed on a major surface of a silicon substrate (not shown). Load elements (the high-resistance elements R1 and R2) of the high-resistance load memory cell, which are made of polysilicon, are formed above the major surface through an insulating layer.

FIG. 45 is a circuit diagram showing a memory cell of another conventional SRAM. Portions similar to those in FIG. 44 are denoted by the same reference numerals, to omit redundant description.

Referring to FIG. 45, the memory cell of the conventional SRAM includes driver transistors Q1 and Q2, access transistors Q3 and Q4, and P-channel MOS transistors Q5 and Q6.

The P-channel MOS transistor Q5 is connected between a node which is supplied with a power supply potential Vcc and a storage node N1, and its gate is connected to another storage node N2.

The P-channel MOS transistor Q6 is connected between another node which is supplied with the power supply potential Vcc and the storage node N2, and its gate is connected to the storage node N1. The P-channel MOS transistors Q5 and Q6 are employed as load elements of the memory cell. Such a memory cell is generally called a CMOS memory cell.

The P-channel MOS transistors Q5 and Q6 serving as load elements are formed by thin-film transistors. These thin-film transistors are formed above a major surface of a silicon substrate (not shown) which is provided with the transistors Q1 to Q4, through an insulating layer (not shown).

FIG. 46 shows transfer characteristics of the memory cell of the conventional SRAM shown in FIG. 44 or 45 obtained when the word line WL is in a selected state. It is assumed here that the SRAM is supplied with a power supply potential Vcc of 3 V, for example.

Referring to FIG. 46, the axes of ordinates and abscissas show the potentials of the storage nodes N1 and N2 shown in FIG. 44 or 45 respectively. With reference to FIGS. 44 or 45 and 46, a first problem of the conventional SRAM is now described.

Referring to FIG. 46, arrow A shows two stable points of the memory cell. Presence of the two stable points is necessary for reliably holding data stored in the memory cell, i.e., for preventing the data stored in the memory cell from destruction.

The two stable points can be ensured by sufficiently increasing the size of regions (hereinafter referred to as "eyes of the memory cell") shown by arrow B. The eyes of the memory cell may also be referred to as static noise margins.

The inclination of a curve shown by arrow C shows the gain levels of the invertors of the memory cell. The invertors of the memory cell have high gains when the curve shown by arrow C is steeply inclined, while the invertors have low gains when the curve C is loosely inclined.

When the load elements of the memory cell are formed by the high-resistance elements R1 and R2 or the thin-film transistors Q5 and Q6, ON-state resistances of these load elements are considerably larger than those of the driver transistors Q1 and Q2 and the access transistors Q3 and Q4. When the word line WL is selected, i.e., supplied with the power supply potential Vcc, therefore, the invertor gains of the memory cell are lowered and the eyes thereof are reduced in size.

In other words, the characteristics of the memory cell are not decided by the invertor formed by the high-resistance element R and the transistor Q1 and that formed by the high-resistance element R2 and the transistor Q2 in FIG. 44 or 45, for example, but the static noise margins are rather decided by the characteristics of a circuit formed by serially connecting the access transistor Q3 with the driver transistor Q1 and that formed by serially connecting the access transistor Q4 with the driver transistor Q2. Namely, this is equivalent to such a state that the load elements are formed by the N-channel MOS transistors Q3 and Q4, and hence the gains of the invertors are lowered and the eyes of the memory cell are disadvantageously reduced in size.

In order to reliably hold the data of the memory cell, therefore, the following design is necessary: Assuming that Wd and Ld represent the channel width and the channel length of the driver transistors Q1 and Q2 respectively, and Wa and La represent those of the access transistors Q3 and Q4 respectively, the ratio Wd/Ld must generally be at least about three times the ratio Wa/La, in order to increase the gains thereby increasing the eyes of the memory cell in size. Thus, the areas of the driver transistors Q1 and Q2 are disadvantageously increased, to inhibit reduction of the area of the memory cell. This is the first problem of the conventional SRAM.

FIG. 47 shows transfer characteristics of the memory cell obtained when the conventional SRAM is driven at a power supply potential Vcc of 2 V and the word line WL is in a selected state.

Referring to FIG. 47, the axes of ordinates and abscissas show the potentials of the storage nodes N1 and N2 shown in FIG. 44 or 45 respectively. A second problem of the conventional SRAM is now described.

Referring to FIG. 47, eyes of the memory cell are disadvantageously reduced in size in the conventional SRAM having the memory cell shown in FIG. 44 or 45 when a low power supply potential Vcc of 2 V is employed. Thus, two stable points may disappear in a high possibility, and the memory cell cannot hold the data in this case. This is the second problem of the conventional SRAM.

SUMMARY OF THE INVENTION

An object of the present invention is to provide a static semiconductor memory device which can reduce a memory cell area.

Another object of the present invention is to provide a static semiconductor memory device which can implement reduction of a power supply potential without causing a latch-up phenomenon or increasing a memory cell area.

Still another object of the present invention is to provide a static semiconductor memory device which can read data at a high speed with low power consumption.

Briefly stated, the present invention provides a static semiconductor memory device, which comprises a plurality of word lines, a plurality of bit lines, a memory cell array, and a plurality of bipolar transistors.

The plurality of bit lines are provided across the word lines. The memory cell array includes a plurality of memory cells which are arranged in the form of a matrix in correspondence to the intersections of the word lines and the bit lines. Each memory cell includes two input/output nodes, a bistable element for holding data to be stored, and a switching circuit for switching connection between the bistable element and the input/output nodes in response to selection of the corresponding word line. Each of the plurality of bipolar transistors is provided at least every two input/output nodes belonging to adjacent memory cells respectively, for driving the potential level of the corresponding bit line in response to the potential levels of the input/output nodes of a selected memory cell.

Preferably, the word lines are provided in correspondence to respective rows of the memory cell array, and the bit lines are provided in pairs in correspondence to respective columns of the memory cell array. Each bistable element has first and second storage nodes. Each switching circuit includes first and second access MOS transistors for switching connection between the first storage node and a first one of the two input/output nodes and connection between the second storage node and a second one of the two input/output nodes respectively in response to selection of the corresponding word line. The plurality of bipolar transistors include a plurality of first bipolar transistors which are provided between first ones of the pairs of bit lines and the memory cells belonging to the corresponding columns for respective pairs of memory cells adjacently arranged in the column direction, and a plurality of second bipolar transistors which are provided between second ones of the pairs of bit lines and the memory cells belonging to the corresponding columns for respective pairs of memory cells deviating from the pairs of memory cells connected with the first bipolar transistors by single memory cells in the column direction. Each first bipolar transistor has an emitter which is connected with the corresponding bit line, and a base which is connected with two first input/output nodes of the corresponding memory cells. Each second bipolar transistor has an emitter which is connected with the corresponding bit line, and a base which is connected with two second input/output nodes of the corresponding memory cells. The first and second bipolar transistors have collectors which are connected with back gates of the first and second access MOS transistors respectively.

More preferably, the first and second bipolar transistors and the first and second access MOS transistors are formed on a major surface of a semiconductor substrate provided with the static semiconductor memory device, and base regions of the first bipolar transistors, the first input/output nodes and either source or drain regions of the first access MOS transistors share regions on the major surface. Base regions of the second bipolar transistors, the second input/output nodes and either source or drain regions of the second access MOS transistors share regions on the major surface.

In another preferred mode of the present invention, the word lines are provided in pairs in correspondence to the respective rows of the memory cell array. The bit lines are provided in correspondence to the respective columns of the memory cell array. Each bistable element has first and second storage nodes. Each switching circuit includes first and second access MOS transistors for switching connection between the first storage node and a first one of the two input/output nodes and connection between the second storage node and a second one of the two input/output nodes respectively in response to selection of the corresponding word line. The pairs of word lines are connected with gates of the first and second MOS transistors alternately with respect to the memory cells belonging to the corresponding rows. Each of the plurality of bipolar transistors is provided in correspondence to every two memory cells which are adjacently arranged along the row direction. Each bipolar transistor has an emitter which is connected with the corresponding bit line, and a base which is connected with the first input/output node of a first one of the corresponding memory cells and the second input/output node of another one of the corresponding memory cells. The collector of each bipolar transistor is connected with back gates of the first and second access MOS transistors.

In still another preferred mode of the present invention, the word lines are provided in pairs in correspondence to the respective rows of the memory cell array. The bit lines are provided in correspondence to the respective columns of the memory cell array. Each bistable element has first and second storage nodes. Each switching circuit includes first and second access MOS transistors for switching connection between the first storage node and one of the two input/output nodes and connection between the second storage node and the other one of the two input/output nodes in response to selection of the corresponding word line. The pairs of word lines are connected with the gates of the first and second access MOS transistors alternately with respect to the memory cells belonging to the corresponding rows. Each of the plurality of bipolar transistors is provided in correspondence to four input/output nodes belonging to two rows and two columns of adjacent memory cells respectively. Each bipolar transistor is so arranged that another most approximate bipolar transistor is present in a diagonal direction of the memory cell array. Each bipolar transistor has an emitter which is connected with the corresponding bit line, and a base connected with four input/output nodes of the corresponding memory cells. The collector of each bipolar transistor is connected with back gates of the first and second access MOS transistors.

In a further preferred mode of the present invention, the word lines are provided in pairs in correspondence to the respective rows of the memory cell array. The bit lines are provided in correspondence to the respective columns of the memory cell array. Each bistable element includes first and second storage nodes, and first and second invertors which are cross-connected with each other so that connection points thereof correspond to the first and second storage nodes respectively. The first and second invertors have first and second operating current control circuits controlling operation currents. Each switching circuit includes a first access MOS transistor for switching connection between the first storage node and a first one of the two input/output nodes in response to selection of a first one of the corresponding pair of word lines, and a second access MOS transistor for switching connection between the second storage node and a second one of the two input/output nodes in response to selection of a second one of the corresponding pair of word lines. The first and second operating current control circuits limit the operating currents in comparison with that in selection when the second and first word lines are in non-selected states respectively. The plurality of bipolar transistors include a plurality of first bipolar transistors which are provided between first ones of the pairs of bit lines and the memory cells belonging to the corresponding columns for respective pairs of memory cells adjacently arranged in the column direction, and a plurality of second bipolar transistors which are provided between second ones of the pairs of bit lines and the memory cells belonging to the corresponding columns for respective pairs of memory cells deviating from the pairs of memory cells connected with the first bipolar transistors by single memory cells in the column direction. Each first bipolar transistor has an emitter which is connected with the corresponding bit line, and a base which is connected with two first input/output nodes of the corresponding memory cells. Each second bipolar transistor has an emitter which is connected with the corresponding bit line, and a base which is connected with two second input/output nodes of the corresponding memory cells. The collectors of the first and second bipolar transistors are connected with back gates of the first and second access MOS transistors.

In a further preferred mode of the present invention, the word lines are provided in pairs in correspondence to the respective rows of the memory cell array. The bit lines are provided in correspondence to the respective columns of the memory cell array. Each bistable element has first and second storage nodes, and each switching element includes a first access MOS transistor for switching connection between the first storage node and a first one of the two input/output nodes in response to selection of a first one of the corresponding pair of word lines, and a second access MOS transistor for switching connection between the second storage node and a second one of the two input/output nodes in response to selection of a second one of the corresponding pair of word lines. The plurality of bipolar transistors include a plurality of first bipolar transistors which are provided between the bit lines and the memory cells belonging to the corresponding columns for respective pairs of memory cells adjacently arranged in the column direction in response to the potential levels of the first input/output nodes of the corresponding memory cells, and a plurality of second bipolar transistors which are provided between the bit lines and the memory cells belonging to the corresponding columns for respective pairs of memory cells deviating from the pairs of memory cells connected with the first bipolar transistors by single memory cells in the column direction for driving the potential levels of the corresponding bit lines in response to the potential levels of the second input/output nodes of the corresponding memory cells. Each first bipolar transistor has an emitter which is connected with the corresponding bit line and a base which is connected with two first input/output nodes of the corresponding memory cells, while each second bipolar transistor has an emitter which is connected with the corresponding bit line and a base which is connected with two second input/output nodes of the corresponding memory cells, and the collectors of the first and second bipolar transistors are connected with back gates of the first and second access MOS transistors.

Thus, a principal advantage of the present invention resides in that at least two input/output nodes belonging to adjacent memory cells respectively share each bipolar transistor for driving the potential level of the corresponding bit line, whereby the memory cell area can be reduced thereby reducing the chip area as well as the fabrication cost.

Another advantage of the present invention resides in that each bipolar transistor drives the potential level of the corresponding bit line, whereby reduction of the power supply potential can be implemented without causing a latch-up phenomenon or increasing the memory cell area.

Still another advantage of the present invention resides in that the base regions of the bipolar transistors and either source or drain regions of the access MOS transistors share regions on the major surface of the semiconductor substrate, whereby increase of the memory cell area resulting from provision of the bipolar transistors can be suppressed.

A further advantage of the present invention resides in that corresponding storage nodes can limit operating currents for charged invertors in data writing, whereby power consumption can be reduced in the write operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 13A 13B and 13C are plan views showing the plane pattern of each memory cell according to the embodiment 2 of the present invention, with an active region and a first polysilicon layer, with second and third polysilicon layers, and with a fourth polysilicon layer and a metal wire layer respectively;

DESCRIPTION OF THE PREFERRED EMBODIMENTS

Embodiment 1

Figure 1:
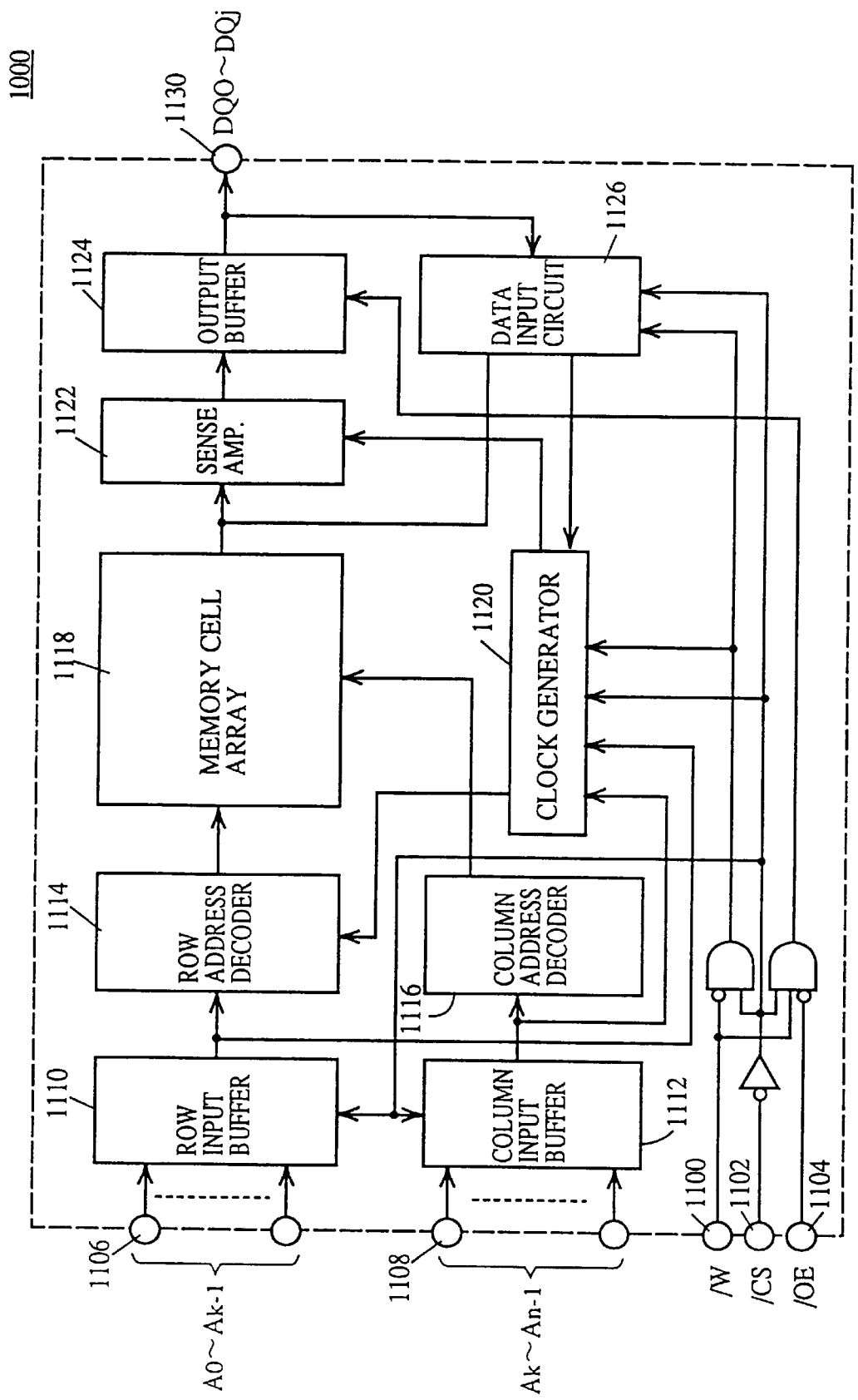
FIG. 1 is a schematic block diagram showing the structure of a static semiconductor memory device 1000 according to an embodiment 1 of the present invention.

FIG. 1 is a schematic block diagram showing the structure of a static semiconductor memory device 1000 according to an embodiment 1 of the present invention.

Referring to FIG. 1, the SRAM 1000 according to the embodiment 1 includes a memory cell array 1118. The memory cell array 1118 includes a plurality of two-dimensionally arranged memory cells. The memory cells are connected with word lines WL and pairs of bit lines BL and /BL, as described later.

The SRAM 1000 further includes a row input buffer 1110 receiving row address signals A0 to Ak-1 which are supplied to row address input terminals 1106, a column input buffer 1112 receiving column address signals Ak to An-1 which are supplied to column address input terminals 1108, a row address decoder 1114 for decoding an output from the row input buffer 1110 and selecting a corresponding row of the memory cell array 1118, a column address decoder 1116 for decoding an output from the column input buffer 1112 and selecting a corresponding column of the memory cell array 1118, a clock generator 1120 receiving signals which are responsive to a write enable signal /W, a chip select signal /CS and an output enable signal /OE supplied through external control signal input terminals 1100, 1102 and 1104 and signals from the row and column input buffers 1110 and 1112 and outputting a clock signal for controlling the circuit operation of the SRAM 1110, a sense amplifier 1122 which is controlled by the clock generator 1120 for amplifying data from a selected memory cell in a read operation, an output buffer 1124 receiving an output from the sense amplifier 1122 and outputting read data to a data input/output terminal 1130, and a data input circuit 1126 which is controlled by the clock generator 1120 for receiving the data supplied to the data input/output terminal 1130 and outputting write data in the selected memory cell in a write operation mode.

The write enable signal /W supplied to the external control signal input terminal 1100 is adapted to instruct data writing in activation (low level). The chip select signal /CS supplied to the external control signal input terminal 1102 is adapted to activate an operation of the SRAM 1000 in activation (low level), for indicating selection of this chip. The output enable signal /OE supplied to the external control signal input terminal 1104 is adapted to activate a data output from the output buffer 1124 in activation (low level).

Figure 2:
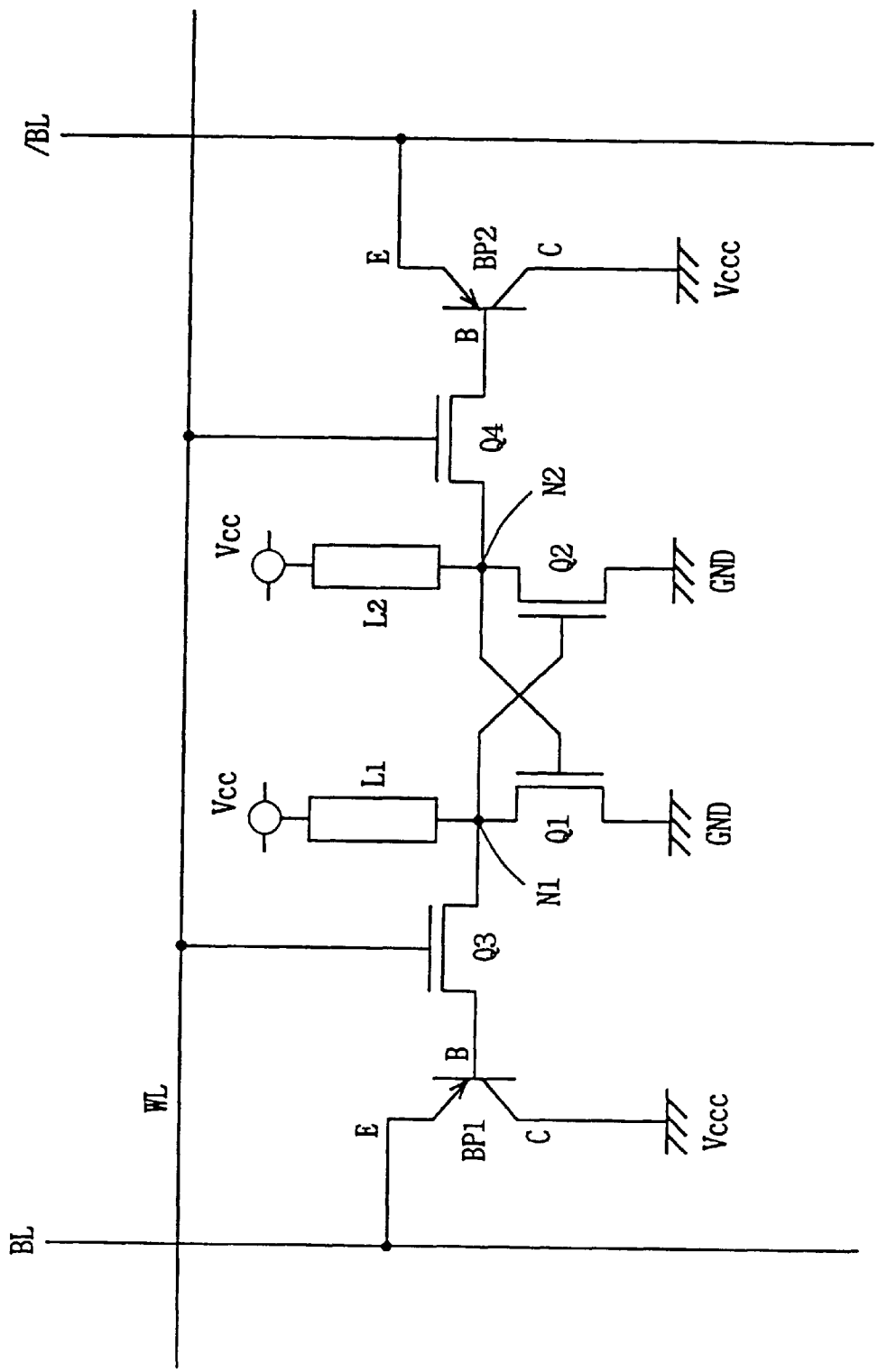
FIG. 2 is a circuit diagram showing the structure of each memory cell according to the embodiment 1.

FIG. 2 is a circuit diagram showing each memory cell of the SRAM 1000 according to the embodiment 1 of the present invention in detail. Referring to FIG. 2, the memory cell of the SRAM 1000 according to the embodiment 1 includes driver transistors Q1 and Q2, access transistors Q3 and Q4, bipolar transistors BP1 and BP2 and load elements L1 and L2.

The driver transistor Q1 is connected between a storage node N1 and a node which is supplied with a ground potential GND, and its gate is connected to a storage node N2. The driver transistor Q2 is connected between the storage node N2 and another node which is supplied with the ground potential GND, and its gate is connected to the storage node N1.

The load element L1 is connected between a node which is supplied with a power supply potential Vcc and the storage node N1. The load element L2 is connected between another node which is supplied with the power supply potential Vcc and the storage node N2. The access transistor Q3 is connected between a base B of the bipolar transistor BP1 and the storage node N1, and its gate is connected to a word line WL. The access transistor Q4 is connected between the storage node N2 and a base B of the bipolar transistor BP2, and its gate is connected to the word line WL. The bipolar transistor BP1 has an emitter E which is connected with a bit line BL, the base B which is connected with the access transistor Q3, and a collector C which is connected with a node having a collector power supply potential Vccc. The bipolar transistor BP2 has an emitter E which is connected with a bit line /BL, the base B which is connected with the access transistor Q4, and a collector C which is connected with another node having the collector power supply potential Vccc.

Figure 44:
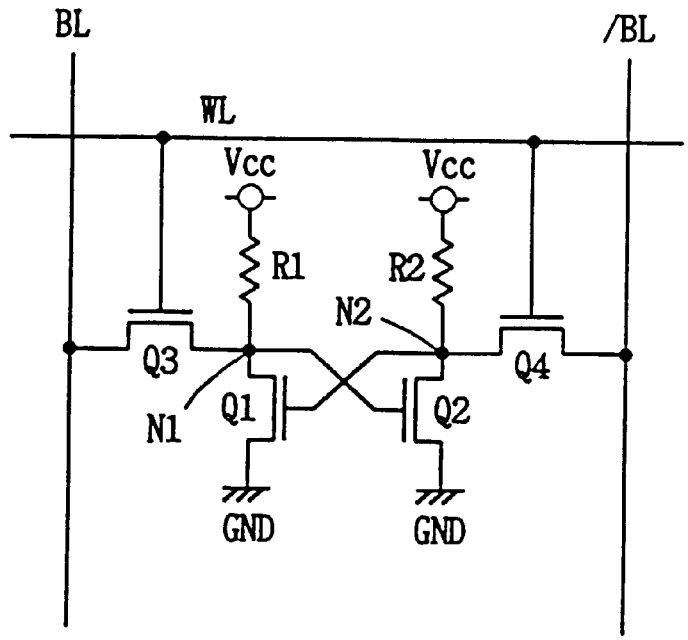
FIG. 44 is a circuit diagram showing the structure of a conventional high-resistance load memory cell.
Figure 45:
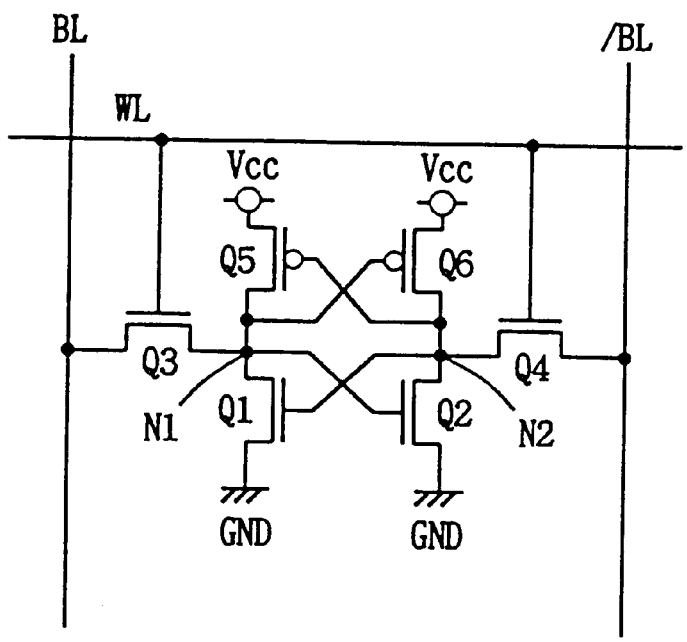
FIG. 45 is a circuit diagram showing the structure of a conventional CMOS latch memory cell.
Figure 46:
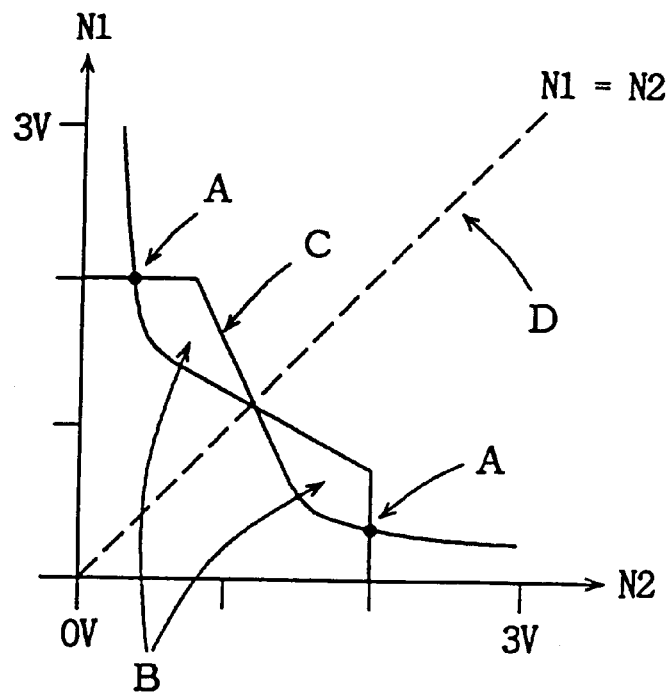
FIG. 46 illustrates transfer characteristics of the memory cell of the conventional SRAM with a power supply potential of 3 V.
Figure 47:
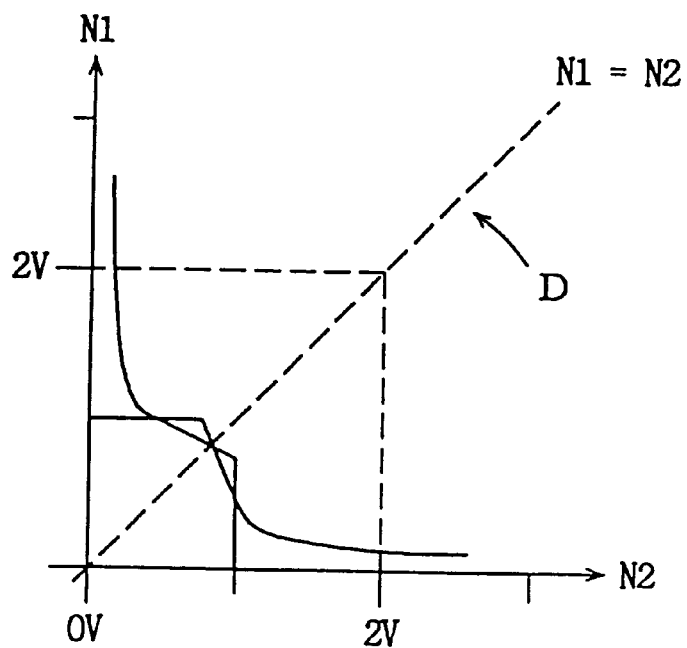
FIG. 47 illustrates transfer characteristics of the memory cell of the conventional SRAM with a power supply potential of 2 V.

The load elements L1 and L2 can be prepared from the high-resistance elements R1 and R2 shown in FIG. 44, or the P-channel MOS transistors (thin-film transistors) Q5 and Q6 shown in FIG. 45.

In the following description, the load elements L1 and L2 are prepared from high-resistance elements.

The collector power supply potential Vccc which is supplied to the collectors C of the bipolar transistors BP1 and BP2 serves as the back gate potential of the driver transistors Q1 and Q2 and the access transistors Q3 and Q4. This back gate potential (collector power supply potential Vccc) can be set at the ground potential GND, which is the source potential of the driver transistors Q1 and Q2.

Alternatively, the back gate potential (collector power supply potential Vccc) can be set at a level (negative potential) lower than the ground potential GND. The driver transistors Q1 and Q2 and the access transistors Q3 and Q4 are N-channel MOS transistors. On the other hand, the bipolar transistors BP1 and BP2 are PNP transistors.

Figure 3:
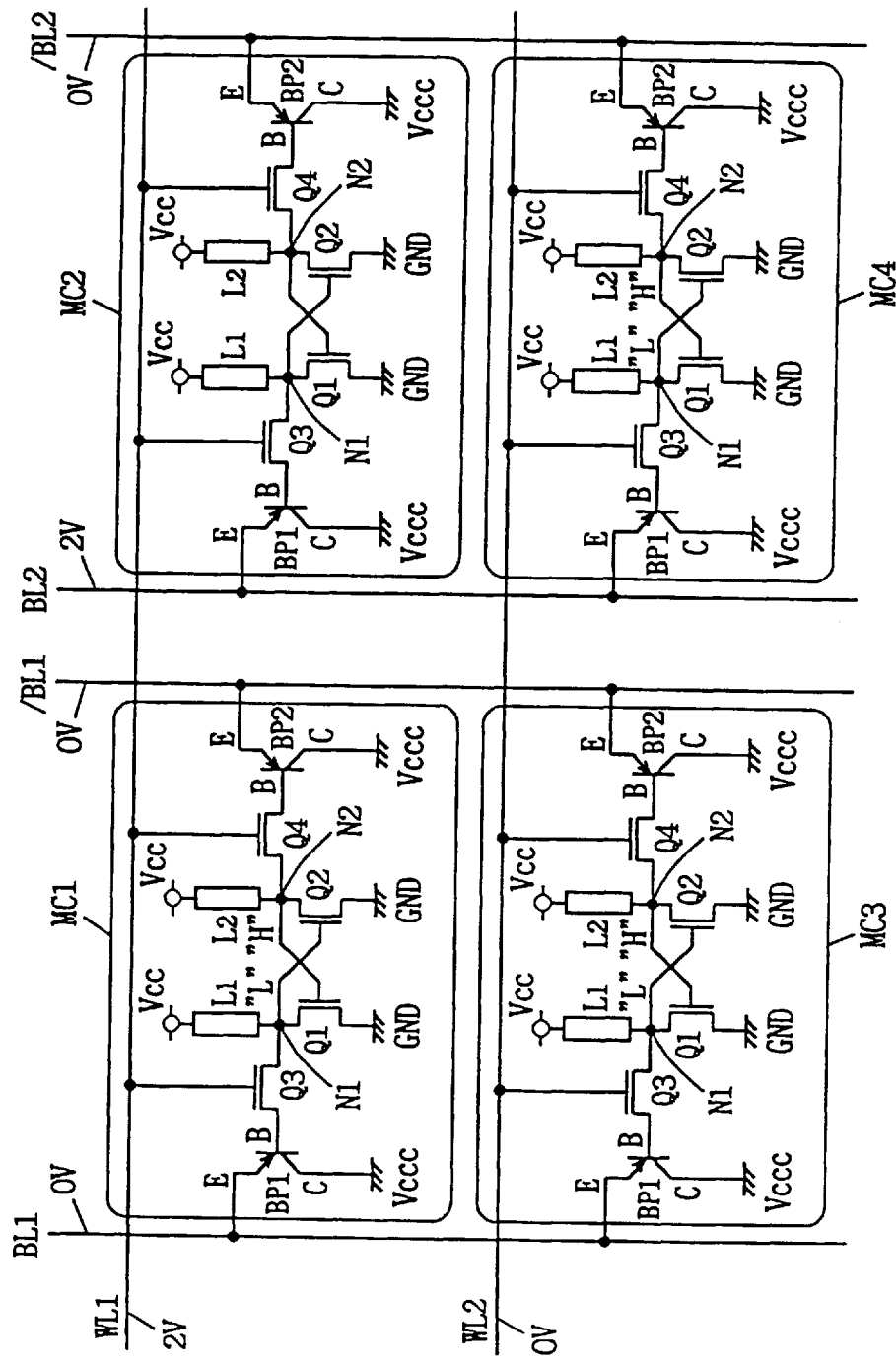
FIG. 3 is adapted to illustrate a write operation of the SRAM 1000 according to the embodiment 1.

FIG. 3 is adapted to illustrate a write operation of the SRAM 1000 according to the embodiment 1 of the present invention for a memory cell. Portions identical to those in FIG. 2 are denoted by the same reference numerals, to omit redundant description.

In general, memory cells are two-dimensionally arranged to form a memory cell array. FIG. 3 shows an exemplary memory cell array of two rows by two columns, for simplifying the illustration. In order to actualize the illustration, it is assumed that the power supply potential Vcc is 2 V. However, the power supply potential Vcc is not restricted to 2 V, as a matter of course. It is also assumed that the collector power supply potential Vccc is the ground potential GND.

[Write Operation of SRAM 1000]

A memory cell included in the memory cell array is specified by selection along the row and column directions. Referring to FIG. 3, a word line WL1 which is connected with memory cells MC1 and MC2 is in a selected state. In other words, the word line WL1 is at 2 V. On the other hand, a word line WL2 which is connected with memory cells MC3 and MC4 is in a non-selected state. In other words, the word line WL2 is at 0 V. Thus, the row of the memory cell array is selected through the word lines WL1 and WL2.

A pair of bit lines BL1 and /BL1 which are connected with the memory cells MC1 and MC3 are in non-selected states. Thus, the pair of bit lines BL1 and /BL1 corresponding to the non-selected column are at low potential levels. In the example shown in FIG. 3, both bit lines BL1 and /BL1 are at 0 V.

On the other hand, another pair of bit lines BL2 and /BL2 which are connected with the memory cells MC2 and MC4 are in selected states. In the write operation, the bit lines BL2 and /BL2 corresponding to the selected column are driven to high and low levels in response to write data respectively. Referring to FIG. 3, the bit line BL2 is at 2 V, and the bit line /BL2 is at 0 V.

An operation of the non-selected memory cell MC1 is now described. The word line WL1 connected with the memory cell MC1 is in a selected state, while the pair of bit lines BL1 and /BL1 connected with the memory cell MC1 are in non-selected states. At this time, both access transistors Q3 and Q4 are in conducting states. Therefore, the bases B of the bipolar transistors BP1 and BP2 are connected to the storage nodes N1 and N2 through the access transistors Q3 and Q4 respectively.

However, the emitters and the collectors of the bipolar transistors BP1 and BP2 are at the ground potential GND, i.e., 0 V. Therefore, the base-to-emitter potential difference is below the threshold voltage of the bipolar transistors BP1 and BP2, and hence the bipolar transistors BP1 and BP2 are in non-conducting states. Namely, potentials of low and high levels which are stored in the storage nodes N1 and N2 respectively are not influenced by data supplied from the exterior through the bit lines BL1 and /BL1 although the word line WL1 is in a selected state.

The non-selected memory cell MC3 is now described. The word line WL2 which is connected with the memory cell MC3 is in a non-selected state, and the pair of bit lines BL1 and /BL1 which are connected with the memory cell MC3 are also in non-selected states. At this time, the access transistors Q3 and Q4 are in non-conducting states. Therefore, data of the memory cell MC3 located on non-selected row and column is held with no influence by external write data. In other words, potentials of low and high levels stored in the storage nodes N1 and N2 respectively are held as such.

Further, the bipolar transistors BP1 and BP2 are in non-conducting states similarly to the above description of the memory cell MC1, whereby no excessive current is consumed through this memory cell MC2.

An operation of the selected memory cell MC2 is now described. In the following description, potentials of low and high levels which are stored in the storage nodes N1 and N2 of the memory cell MC2 are reloaded with potentials of high and low levels respectively. The word line WL1 and the pair of bit lines BL2 and /BL2 which are connected with the memory cell MC2 are in selected states. At this time, the access transistors Q3 and Q4 are in conducting states. Further, the bit line BL2 is at a high potential of 2 V.

The storage node N1 is at a low potential level, and hence a potential difference beyond the threshold voltage of the bipolar transistor BP1 results in a P-N diode between the emitter E and the base B of the bipolar transistor BP1. Thus, currents flow from the emitter E to the collector C and the base B in the bipolar transistor BP1. The ratio of the base current to the collector current flowing in the bipolar transistor BP1 at this time is provided by the current amplification factor of the bipolar transistor BP1, and the collector current occupies a higher percentage in general.

The base current of the bipolar transistor BP1 flows into the storage node N1, and increases its potential. Assuming that the threshold voltage (E-to-B voltage) Vbe of the bipolar transistor BP1 is 0.7 V, for example, the voltage of the storage node N1 is 1.3, since the potential of the bit line BL2 is 2 V. When the potential of the storage node N1 exceeds the threshold voltage of the driver transistor Q2, the drive transistor Q2 enters an ON state. Thus, the potential of the storage node N2 which is connected with the driver transistor Q2 is reduced. The storage node N2 having the reduced potential is connected with the gate of the driver transistor Q1, and hence the driver transistor Q1 enters a cutoff state. When the driver transistor Q1 enters the cutoff state, the base and collector currents of the bipolar transistor BP1 are cut off. Therefore, a high current temporarily flows from the emitter E to the collector C of the bipolar transistor BP1 in writing, while this current is immediately cut off after writing. On the other hand, the bit line /BL2 is at a low potential of 0 V, and the bipolar transistor BP2 remains in a non-conducting state.

In order to reduce the temporary high current in writing described with reference to the write operation of the memory cell MC2, resistors can be serially connected with the collectors C of the bipolar transistors BP1 and BP2.

An operation of the non-selected memory cell MC4 is now described. The word line WL2 which is connected with the memory cell MC4 is in a non-selected state, while the pair of bit lines BL2 and /BL2 which are connected with the memory cell MC4 are in selected states.

At this time, the access transistors Q3 and Q4 are in non-conducting states. Thus, data stored in the memory cell MC4 is held as such with no influence by data writing from the exterior. In other words, the storage nodes N1 and N2 remain holding potentials of low and high levels respectively.

Namely, a base current of the bipolar transistor BP1 connected with the bit line BL2 which is at a high potential of 2 V is cut off by the access transistor Q3 which is in a cutoff state. Thus, no current flows between the emitter E and the collector C of the bipolar transistor BP1.

[Read Operation of SRAM 1000]

Figure 4:
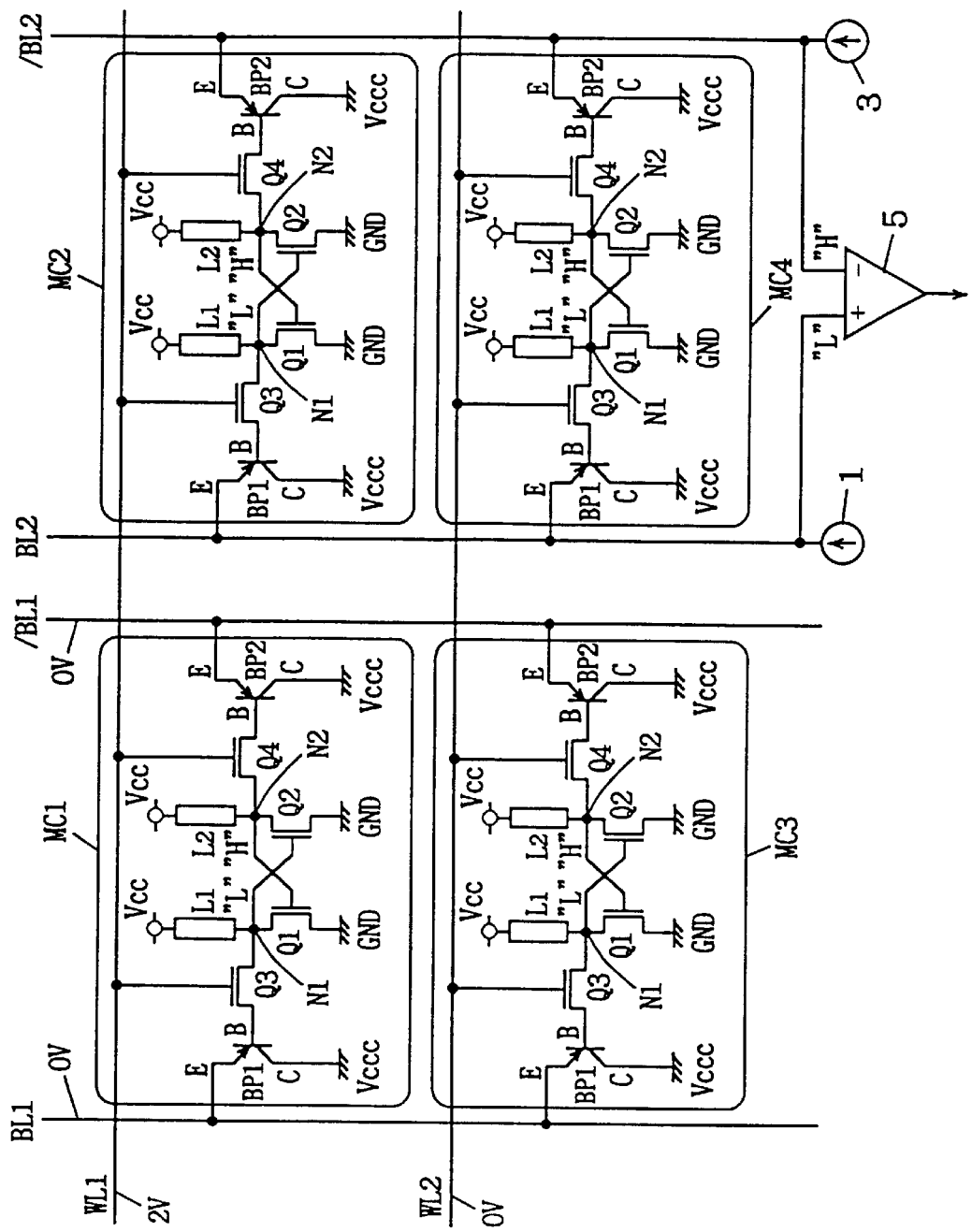
FIG. 4 is adapted to illustrate a read operation of the SRAM 1000 according to the embodiment 1.

FIG. 4 is adapted to illustrate a read operation of the SRAM 1000 according to the embodiment 1 of the present invention. Portions identical to those in FIG. 3 are denoted by the same reference numerals, to omit redundant description.

In the read operation, operations of the transistors forming the memory cells MC1 and MC3 corresponding to a non-selected column are essentially identical to those in the write operation, and hence redundant description is omitted.

Operations of the memory cells MC2 and MC4 which are present on a selected column are now described. It is assumed that data is read from the memory cell MC2.

Before starting the read operation, the bit lines BL1, /BL2, BL2 and /BL2 are precharged at a low level of 0 V. When the read operation is started, the bit lines BL2 and /BL2 of the selected column are pulled up to high levels by current sources 1 and 3. Thereafter the word line WL1 which is located on the selected column is activated. In other words, the word line WL1 is supplied with a voltage of 2 V.

The current operation of the memory cell MC2 is now described. The word line WL1 and the pair of bit lines BL2 and /BL2 which are connected with the memory cell MC2 are in selected states. Thus, the access transistors Q3 and Q4 are in conducting states. It is assumed that the storage nodes N1 and N2 of the memory cell MC2 store potentials of low and high levels respectively.

In case of reading the data stored in such a memory cell MC2, the current sources 1 and 3 supply currents of proper magnitudes to the pair of bit lines BL2 and /BL2 respectively. In these currents, those decided by the current amplification factors of the bipolar transistors BP1 and BP2 flow into the memory cell MC2 through the bases B. Therefore, the current sources 1 and 3 must be set at current values not destroying the data of the memory cell MC2. Referring to FIG. 4, the current sources 1 and 3 of 200 $\mu$A are employed, for example. It is assumed that currents of 20 $\mu$A corresponding to 10% of these values flow into the memory cell MC2.

The driver transistor Q1 is in a conducting state, while the driver transistor Q2 is in a cutoff state. Therefore, a base current flows in the bipolar transistor BP1 which is connected with the conducting driver transistor Q1. Thus, the bipolar transistor BP1 enters an ON state, and the current from the current source 1 flows into the memory cell MC2. Therefore, the potential of the bit line BL2 is reduced.

On the other hand, the bipolar transistor BP2 remains in the cutoff state, and hence the potential of the bit line /BL2 is increased.

Thus, a potential difference is caused between the bit lines BL2 and /BL2. The data of the memory cell MC2 can be read to the exterior by sensing and amplifying this potential difference with a differential amplifier (sense amplifier) 5.

As hereinabove described, the potential difference between the bit lines BL2 and /BL2 is generated by the current (emitter current) flowing in the bipolar transistor BP1. This current is larger than the current (base current) flowing into the storage node N1 of the memory cell MC2 through the base B by a percentage substantially equivalent to the current amplification factor of the bipolar transistor BP1. Therefore, potential change of the bit line BL2 can be increased as compared with that in the read operation of the conventional SRAM employing the memory cell shown in FIG. 44 or 45. Thus, the SRAM 1000 according to the embodiment 1 can implement a high-speed read operation.

The non-selected memory cell MC4 is now described. The word line WL2 which is connected with the memory cell MC4 is in a non-selected state, while the pair of bit lines BL2 and /BL2 which are connected with the memory cell MC4 are in selected states. At this time, the access transistors Q3 and Q4 are in cutoff states. Thus, no currents flow in the bipolar transistors BP1 and BP2. Therefore, data stored in the memory cell MC4 is held as such, to exert no influence on the data read operation from the memory cell MC2.

In the SRAM 1000 according to the embodiment 1, as hereinabove described, the bipolar transistors BP1 and BP2 are provided between the access transistors Q3 and Q4 of each memory cell and the pair of bit lines BL and /BL. In operations other than the write operation, therefore, no high currents flow into the storage nodes N1 and N2 of each memory cell through the access transistors Q3 and Q4. Also in the write operation, no high currents flow into the storage nodes N1 and N2 through the access transistors Q3 and Q4 in the memory cells other than that for writing.

In other words, the above corresponds to increase of invertor gains of each memory cell. Namely, this corresponds to increase of eyes (static noise margins) of each memory cell. While the conventional SRAM employing the memory cell shown in FIG. 44 or 45 increases the invertor gains of each memory cell by setting the ratio Wd/Ld at a value of at least about three times the ratio Wa/La, the SRAM 1000 according to the embodiment 1 has no such restriction.

Even if the driver transistors Q1 and Q2 have small driving force (small channel width Wd), the bipolar transistors BP1 and BP2 can amplify potentials flowing into the ground. Assuming that Wd1 and Ld1 represent the channel width and the channel length of the driver transistors Q1 and Q2 shown in FIG. 2 and Wa1 and La1 represent those of the access transistors Q3 and Q4, therefore, the channel width Wd1 of the driver transistors Q1 and Q2 can be reduced. In other words, the ratio (Wd1/Ld1)/(Wa1/La1) can be reduced substantially to 1 or less. Thus, the memory cell area can be reduced in the SRAM 1000 according to the embodiment 1.

[Structure of Memory Cell]

Figure 5:
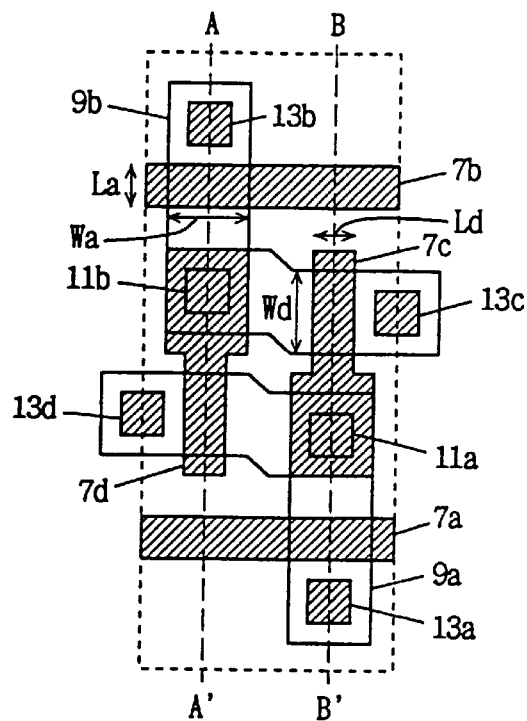
FIG. 5 illustrates the plane pattern of driver transistors Q1 and Q2 and access transistors Q3 and Q4 of the memory cell shown in FIG. 2.

FIG. 5 is a plan view showing the arrangement of the gates (first polysilicon layers) of the driver transistors Q1 and Q2 and the access transistors Q3 and Q4 in the memory cell shown in FIG. 2.

Referring to FIG. 5, active layers 9a and 9b are formed on the major surface (not shown) of the silicon substrate in the memory cell shown in FIG. 2. First polysilicon layers 7a, 7b, 7c and 7d are formed on the active layers 9a and 9b through an insulating layer (not shown). The first polysilicon layer 7c is connected with the active layer 9a through a first buried contact 11a. The first buried contact 11a is formed by providing a connection port in the insulating layer (gate oxide film) formed between the active layer 9a and the first polysilicon layer 7c. Similarly, the first polysilicon layer 7d is connected with the active layer 9b through a first buried contact 11b.

The access transistor Q4 is formed by the first polysilicon layer 7a defining the gate and the active layer 9a defining source/drain regions. The driver transistor Q1 is formed by the first polysilicon layer 7c defining the gate and the active layer 9b defining source/drain regions. The driver transistor Q2 is formed by the first polysilicon layer 7d defining the gate and the active layer 9a defining source/drain regions. The access transistor Q3 is formed by the first polysilicon layer 7b defining the gate and the active layer 9b defining source/drain regions.

Figure 6:
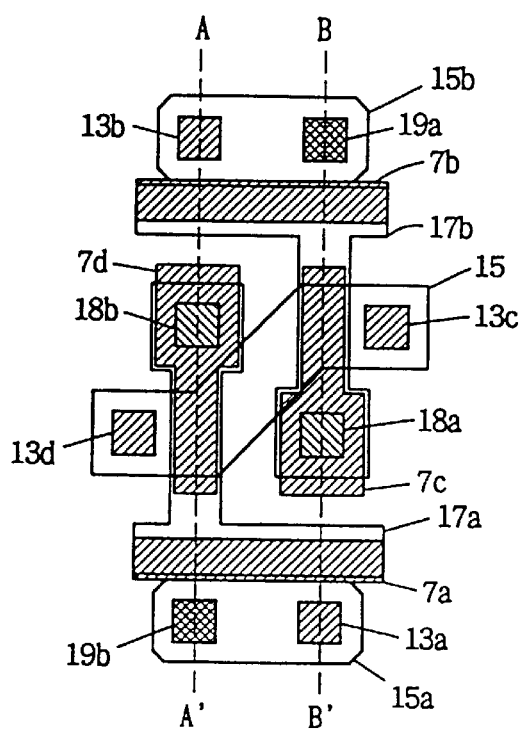
FIG. 6 illustrates the plane pattern of the memory cell shown in FIG. 5, with addition of load elements L1 and L2.

FIG. 6 illustrates the plane pattern of the memory cell shown in FIG. 5 with addition of the load elements L1 and L2. Lower layers appearing in FIG. 5 as viewed from the major surface of the silicon substrate are properly omitted. Portions similar to those in FIG. 5 are denoted by the same reference numerals, to omit redundant description.

Second polysilicon layers 15, 15a and 15b are formed on the first polysilicon layers 7a to 7d through an insulating layer (not shown). The second polysilicon layer is connected with the active layer 9b (FIG. 5) through a second buried contact 13c. The second polysilicon layer 15 is also connected with the active layer 9a (FIG. 5) through a second buried contact 13d. The second polysilicon layer 15a is connected with the active layer 9a (FIG. 5) through a second buried contact 13a. The second buried polysilicon layer 15b is connected with the active layer 9b (FIG. 5) through a second buried contact 13b. Third polysilicon layers 17b and 17a are formed on the second polysilicon layers 15, 15b and 15c. The second polysilicon layer 17b is connected with the first polysilicon layer 7c through a first contact hole 18a. The third polysilicon layer 17a is connected with the first polysilicon layer 7d through a first contact hole 18b.

Figure 7:
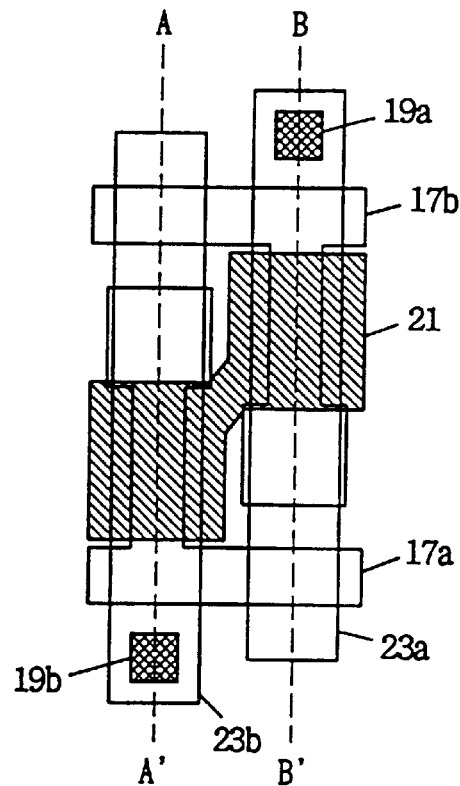
FIG. 7 illustrates the plane pattern of the memory cell shown in FIG. 6, with addition of a pair of bit lines BL and /BL.

FIG. 7 is a plan view showing the bit lines BL and /BL which are formed further on the plane pattern shown in FIG. 6. Portions similar to those in FIG. 6 are denoted by the same reference numerals, to omit redundant description.

A resist film having the shape of a plane pattern 21 is employed as a mask for implanting ions into the third polysilicon layers 17a and 17b. Thus, portions of the third polysilicon layers 17a and 17b not overlapping with the pattern 21 are reduced in resistance, and employed as wires, particularly those supplying the power supply potential Vcc. The remaining portions of the third polysilicon layers 17a and 17b overlapping with the pattern 21 are increased in resistance, and employed as the load elements L1 and L2 of the memory cell.

Metal wires 23a and 23b are formed on the third polysilicon layers 17a and 17b through an insulating layer (not shown). The metal wire 23a is connected with the second polysilicon layer 15b (FIG. 6) through a second contact hole 19a. The metal wire 23b is connected with the second polysilicon layer 15a through a second contact hole 19b. The metal wires 23a and 23b are employed as the bit lines BL and /BL (FIG. 2) respectively.

Figure 8:
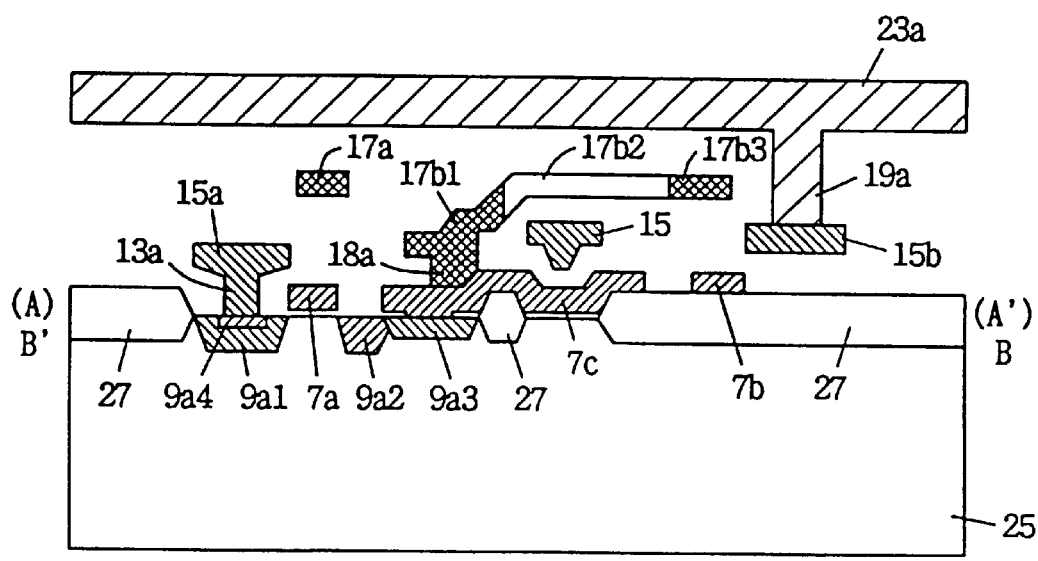
FIG. 8 is a sectional view taken along the line A–A' or B–B' in FIG. 7.

FIG. 8 is a sectional view taken along the line A–A' or B–B' in FIG. 7. The sectional view taken along the line A–A' is identical to that obtained by rotating the sectional view taken along the line B–B' about the center of the memory cell. Namely, the sectional views taken along the lines A–A' and B–B' are 180E rotation-symmetrical with each other about the center of the memory cell. The following description is made with reference to the sectional view taken along the line B–B'. Portions similar to those in FIGS. 5 to 7 are denoted by the same reference numerals, to omit redundant description.

Referring to FIG. 8, field oxide films 27 are formed on a major surface of a silicon substrate 25. A part of the major surface of the silicon substrate 25 provided with no field oxide films 27 defines an active layer (active region). First and second source/drain regions 9a1 and 9a2 of the access transistor Q4 are formed in the active layer (active region) of the silicon substrate 25. The first polysilicon layer 7a (the gate of the access transistor Q4) is formed on a portion of the active layer between the first and second source/drain regions 9a1 and 9a2 through the insulating layer (gate oxide film; not shown). A part of the active layer immediately under the first polysilicon layer 7a (gate) defines a channel region of the access transistor Q4.

An emitter 9a4 of the bipolar transistor BP2 is formed in the first source/drain region 9a1 of the access transistor Q4. The first source/drain region 9a1 of the access transistor Q4 also serves as the base of the bipolar transistor BP2. Namely, the region 9a1 serves both as the first source/drain region of the access transistor Q4 and the base region of the bipolar transistor BP2.

The silicon substrate 25 is employed as the collector C of the bipolar transistor BP2. Namely, back gate terminals of the driver transistors Q1 and Q2 and the access transistors Q3 and Q4 define the collector C of the bipolar transistor BP2.

An impurity region 9a3 is formed in the active layer of the silicon substrate 25. The first polysilicon layer 7c is formed on the impurity region 9a3 through the insulating layer (not shown). The first polysilicon layer 7c is connected with the impurity region 9a3 through the connection port of the insulating layer (gate oxide film; not shown). Namely, the impurity region 9a3 and the first polysilicon layer 7c are connected with each other through the first buried contact 11a (FIG. 5). The regions 9a1 to 9a4 and the channel region of the access transistor Q4 are parts of the active layer 9a shown in FIG. 5. The first polysilicon layer 7c is employed as the gate of the driver transistor Q1. A part of the active layer of the silicon substrate 25, provided with no impurity region 9a3, immediately under the first polysilicon layer 7c defines a channel region of the driver transistor Q1. The first polysilicon layer 7b is formed on the field oxide film 27. Thus, the first polysilicon layer 7b serves as a wire.

The second polysilicon layers 15, 15a and 15b are formed on the first polysilicon layers 7a to 7c through the insulating layer (not shown). The second polysilicon layer 15a is connected with the emitter region 9a4 of the bipolar transistor BP2 through the second buried contact 13a. Third polysilicon layers 17a, 17b1, 17b2 and 17b3 are formed on the second polysilicon layers 15, 15a and 15b through the insulating layer (not shown). The third polysilicon layer 17b1 is connected with the first polysilicon layer 7c through the first contact hole 18a.

The third polysilicon layer 17b2 corresponds to a high-resistance part of the third polysilicon layer 17b shown in FIG. 7 overlapping with the pattern 21. Namely, the third polysilicon layer 17b2 defines the load element L2.

The third polysilicon layers 17b1 and 17b3 are low-resistance parts of the third polysilicon layer 17b shown in FIG. 7 not overlapping with the pattern 21.

The metal wire 23a is formed on the third polysilicon layers 17a, 17b1 to 17b3 through the insulating layer (not shown). The metal wire 23a is connected with the second polysilicon layer 15b through the second contact hole 19a. The metal wire 23a is employed as the bit line BL (FIG. 2).

In the SRAM 1000 according to the embodiment 1, as hereinabove described, the invertor gains of the memory cell are increased (the eyes of the memory cell are increased in size) due to provision of the bipolar transistors BP1 and BP2, whereby the ratio (Wd/Ld)/(Wa/La) can be reduced substantially to 1 or less. As shown in FIG. 5, the ratio (Wd/Ld)/(Wa/La) is substantially 1.

The emitter E of the bipolar transistor BP2 (BP1) is formed in the first source/drain region 9a1 of the access transistor Q4 (Q3). The first source/drain region 9a1 of the access transistor Q4 (Q3) is employed as the base B, and the back gate terminals (silicon substrate 25) of the driver transistors Q1 and Q2 and the access transistors Q3 and Q4 are employed as the collector C.

Thus, the memory cell area is inhibited from being increased due to the provision of the bipolar transistors BP1 and BP2. Further, the load elements L1 and L2 are provided on the driver transistors Q1 and Q2 and the access transistors Q3 and Q4. This also contributes to the inhibition of the increase in the memory cell area.

In the SRAM 1000 according to the embodiment 1, as hereinabove described, the bipolar transistors BP1 and BP2 are provided for increasing the invertor gains of the memory cell, whereby the memory cell area can be reduced.

In the SRAM 1000 according to the embodiment 1, further, the invertor gains of the memory cell can be increased with a low power supply potential of 2 V due to provision of the bipolar transistors BP1 and BP2, as hereinabove described. Thus, the SRAM 1000 according to the embodiment 1 employs no structure of increasing the invertor gains of the memory cell with a low power supply potential by forming P-channel MOS transistors on the major surface of the silicon substrate as load elements, dissimilarly to the prior art. Therefore, no problem such as a latch-up phenomenon or increase of the memory cell area results from employment of a low power supply potential.

In the SRAM 1000 according to the embodiment 1, further, the current extracted to the ground by the driver transistor connected with the storage node storing low-level data is amplified by the bipolar transistor. Therefore, a time required for amplifying the bit line is shortened, thereby enabling high-speed reading. In the SRAM 1000 according to the embodiment 1, further, the current flows only in the memory cell at the crosspoint between the selected row and column in operation, whereby the operating current can be suppressed.

[Modification 1 of Embodiment 1]

In a modification 1 of each memory cell of the SRAM 1000 according to the embodiment 1, absolute values of the threshold voltages of the access transistors Q3 and Q4 are set to be smaller than those of the threshold values of the driver transistors Q1 and Q2. Thus, the so-called eyes of the memory cell can be increased in size. The operation is now described in detail.

Figure 9:
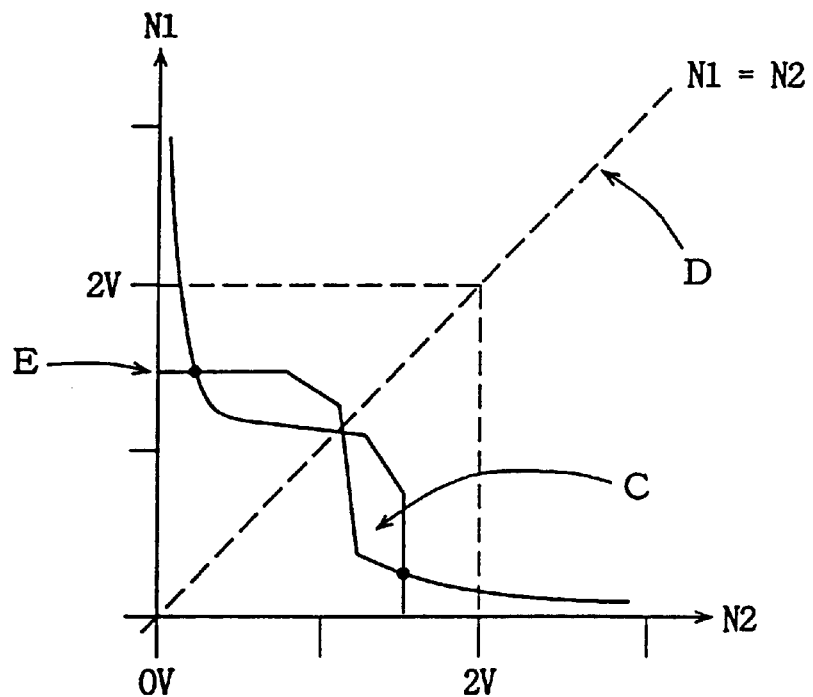
FIG. 9 illustrates transfer characteristics in a read operation state of a modification 1 of the embodiment 1 according to the present invention.

FIG. 9 illustrates transfer characteristics of the memory cell of the SRAM according to the modification 1 in a read operation state. The axes of ordinates and abscissas show the potentials of the storage nodes N1 and N2 (FIG. 1) respectively. The power supply potential Vcc is 2 V, for example.

Referring to FIG. 9, a high level of the transfer characteristics shown by arrow E is decided in the following manner, assuming that V(WL) represents the voltage of the word line WL, Vtha represents the threshold voltage of the access transistors Q3 and Q4, V(BL) represents the voltage of the pair of bit lines BL and /BL, and Vbe represents the base-to-emitter voltage of the bipolar transistors BP1 and BP2:

A smaller one of [V(WL)–Vtha] and [V(BL)–Vbe] forms the high level (arrow E) of the transfer characteristics. The base-to-emitter voltage Vbe of the bipolar transistors BP1 and BP2, which is decided by the concentration of impurities forming the base and the emitter, i.e., P-N junction, is about 0.4 to 0.8 V in general.

Further, it is assumed that selected word and bit lines are at the power supply voltage Vcc of 2 V. In this case, the threshold voltage Vtha of the access transistors Q3 and Q4 is set at a value smaller than the base-to-emitter voltage Vbe of the bipolar transistors BP1 and BP2. In other words, the threshold voltage Vtha of the access transistors Q3 and Q4 is set to be smaller than the threshold voltage Vthd of the driver transistors Q1 and Q2.

Thus, the high level (arrow E) of the transfer characteristics can be decided by V(BL)–Bve, thereby increasing the high level of the transfer characteristics as a result. The two points that the voltages Vbe and Vthd are substantially identical to each other and that the voltage Vthd is apparently smaller than the voltage Vtha due to a back gate effect in case of designing the memory cell so that the voltages Vthd and Vtha are equal to each other are taken into consideration. Due to the provision of the bipolar transistors BP1 and BP2, on the other hand, the invertor gains of the memory cell can be increased as shown by arrow C.

In the SRAM according to the modification 1 of the embodiment 1, as hereinabove described, the invertor gains can be increased (arrow C), and the high level of the transfer characteristics can also be increased (arrow E).

Thus, stability of data holding is effectively increased also when the semiconductor memory device operates with a low power supply voltage.

[Modification 2 of Embodiment 1]

A modification 2 of the embodiment 1 has a structure similar to that of the embodiment 1, except its section.

Figure 10:
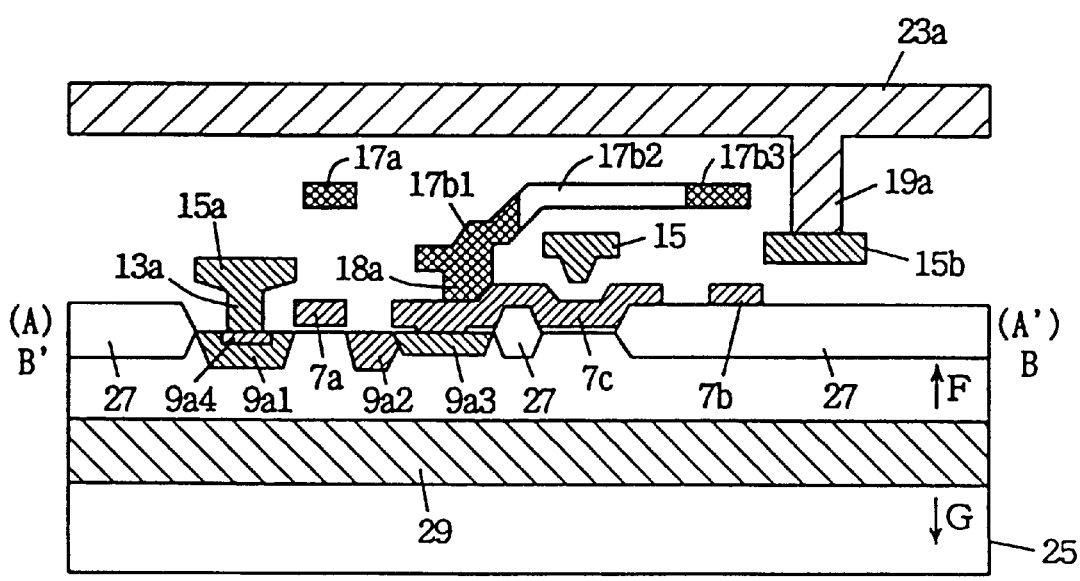
FIG. 10 is a sectional view of each memory cell according to a modification 2 of the embodiment 1 of the present invention.

FIG. 10 is a sectional view showing a memory cell of an SRAM according to the modification 2. The section shown in FIG. 10 is taken along the line A–A' or B–B' in FIG. 7. Portions similar to those in FIG. 8 are denoted by the same reference numerals, to omit redundant description.

Referring to FIG. 10, a high-concentration impurity layer 29 is provided in a silicon substrate 25. The high-concentration impurity layer 29, having a higher impurity concentration than the silicon substrate 25, is a low-resistance layer.

Thus, the high-concentration impurity layer 29 is provided in the silicon substrate 25 according to the modification 2, whereby a collector potential Vccc can be uniformly supplied to the overall memory cell array. In other words, it is possible to reduce influence by a distance from a power supply node in case of supplying the collector potential Vccc.

Further, the resistance values of the resistors serially connected with the collectors C of the bipolar transistors BP1 and BP2 (FIG. 2) can be controlled by adjusting the depth of the high-concentration impurity layer 29. Namely, formation of the high-concentration impurity layer 29 along arrow F corresponds to reduction of the resistance values of the resistors serially connected with the collectors C. On the other hand, formation of the high-concentration impurity layer 29 along arrow G corresponds to increase of the resistance values of the resistors serially connected with the collectors C.

Thus, in the SRAM according to the modification 2, the resistance values of the resistors serially connected with the collectors C of the bipolar transistors BP1 and BP2 can be controlled by adjusting the depth of the high-concentration impurity layer 29, thereby limiting the high currents temporarily flowing from the emitters E to the collectors C in writing.

Embodiment 2

Figure 11:
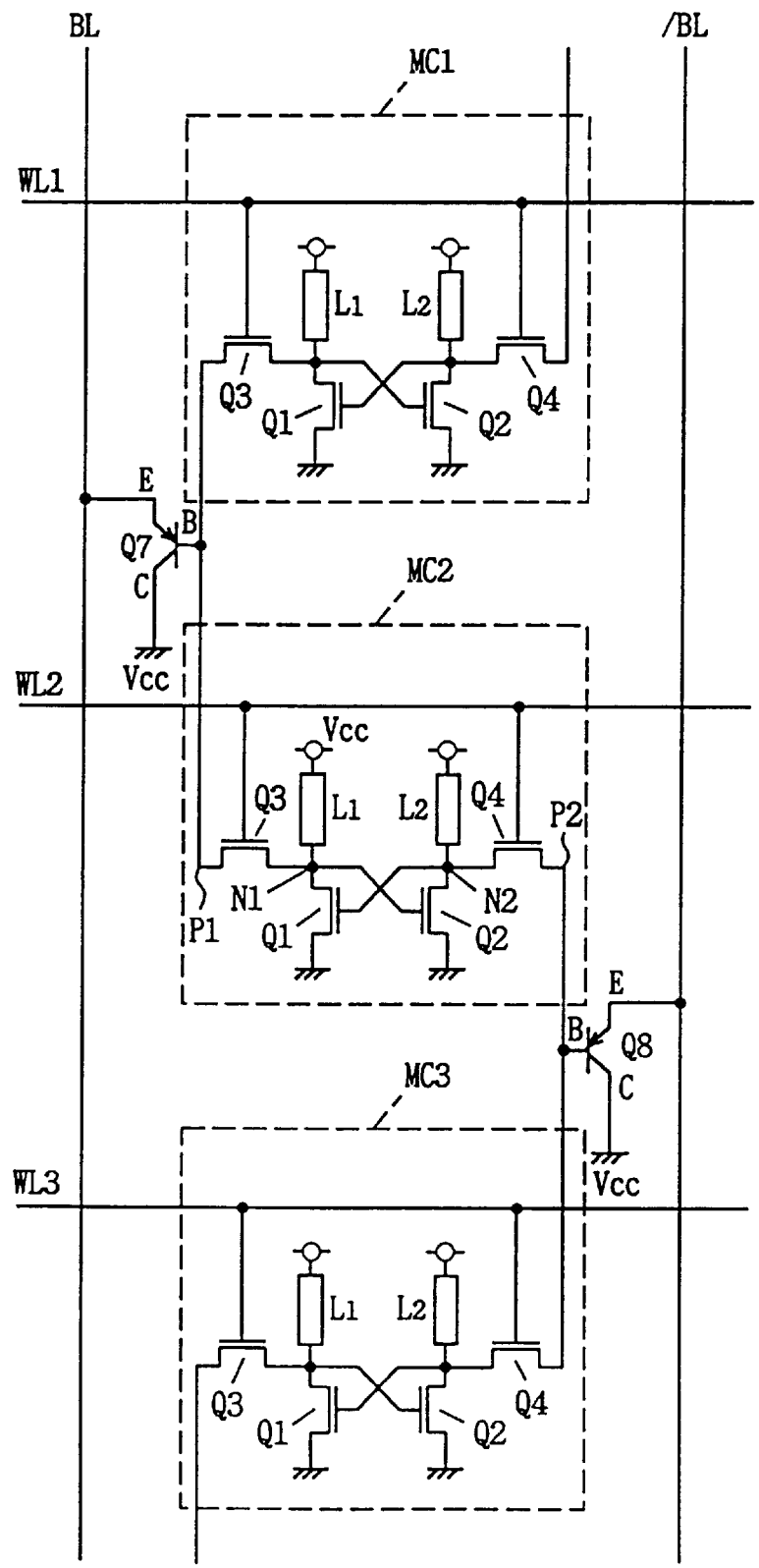
FIG. 11 is a partially enlarged view showing the structures of memory cells, bit lines and word lines according to an embodiment 2 of the present invention.

FIG. 11 is a partially enlarged view showing the structures of memory cells MC1 to MC3, word lines WL1 to WL3 and a pair of bit lines BL and /BL in an SRAM according to an embodiment 2 of the present invention.

The memory cells MC1 to MC3 of the SRAM according to the embodiment 2 are different from those of the SRAM 1000 according to the embodiment 1 in the following point: In each memory cell of the SRAM 1000 according to the embodiment 1, the bipolar transistors BP1 and BP2 are arranged in correspondence to the access transistors Q3 and Q4 respectively, for driving the potential levels of the corresponding bit lines. In the SRAM according to the embodiment 2, on the other hand, access transistors Q3 of the two memory cells MC1 and MC2 which are adjacent to each other along the column direction share a bipolar transistor Q7, and access transistors Q4 of the memory cells MC2 and MC3 which are adjacent to each other along the column direction share a bipolar transistor Q8.

While the structure including the bipolar transistors BP1 and BP2 is referred to as the memory cell in the embodiment 1, a part including a bistable element formed by cross connection of a first invertor consisting of a load element L1 and a driver transistor Q1 and a second invertor consisting of a load element L2 and a driver transistor Q2 and the access transistors Q3 and Q4 which are connected with first and second storage nodes N1 and N2 serving as connecting points cross-connecting the first and second invertors with each other is referred to as a memory cell in the embodiment 2.

As clarified in the later description, the bipolar transistors are integrally shared by the plane patterns of adjacent memory cells.

Among the three memory cells MC1 to MC3 shown in FIG. 11, the memory cell MC2 is noted and the structure and operation thereof are now described. A pattern absolutely similar to that of the memory cell MC2 is repeated along the column direction, thereby forming a memory cell array.

In each of the memory cells of the SRAM 1000 according to the embodiment 1 having two bipolar transistors which are arranged every 1-bit storage element, the bipolar transistors require base and emitter regions independently of each other although the collector regions thereof are shared with the back gates of the MOS transistors. In the SRAM according to the embodiment 2, on the other hand, a single bipolar transistor is present every memory cell, whereby it is possible to further suppress increase of the memory cell size resulting from the provision of the bipolar transistor as compared with the memory cell according to the embodiment 1.

Referring to FIG. 11, the memory cell MC2 includes the first invertor including the load element L1 and the driver MOS transistor Q1 which are serially connected between a power supply potential Vcc and a ground potential GND, and the second invertor including the load element L2 and the driver MOS transistor Q2 which are serially connected between another power supply potential Vcc and the ground potential GND. The first and second invertors are cross-connected with each other. Output nodes N1 and N2 of the first and second invertors are referred to as first and second storage nodes respectively. Thus, the potentials of the storage nodes N1 and N2 are maintained at complementary levels in response to data stored in the memory cell MC2.

The memory cell MC2 further includes the access transistor Q3 which is connected between the storage node N1 and an input/output node P1 so that its gate is connected with the word line WL2, and the access transistor Q4 which is connected between the storage node N2 and an input/output node P2 so that its gate is connected with the word line WL2.

The first input/output node P1 is connected with the base of the bipolar transistor Q7 whose emitter is connected with the bit line BL, and the second input/output node P2 is connected with the base of the bipolar transistor Q8 whose emitter is connected with the bit line /BL. The collectors of the bipolar transistors Q7 and Q8 are coupled with the ground potential GND respectively.

The memory cell area can be further reduced by making the collectors of the bipolar transistors Q7 and Q8 and back gates of the access transistors Q3 and Q4 and the driver transistors Q1 and Q2 common as described later, although the present invention is not restricted to this.

The base of the bipolar transistor Q7 is also coupled with a first input/output node Pl of the memory cell MC1 which is approximate to the memory cell MC2 in the column direction. On the other hand, the base of the bipolar transistor Q8 is also coupled with a second input/output node P2 of the memory cell MC3 which is approximate to the memory cell MC2 in the column direction.

While two bipolar transistors are required per 1-bit storage element in the memory cell according to the embodiment 1, the number of such bipolar transistors can be reduced to one by arranging memory cells having the structure shown in FIG. 11 in the form of an array. Thus, reduction of the memory cell size as well as the chip size can be implemented, and reduction of the fabrication cost can also be implemented.

Referring to FIG. 1, each of the word lines WL1, WL2 and WL3 is exclusively selected-in response to an externally supplied address signal, so that its potential is brought to a high level. Although two memory cells share each bipolar transistor, therefore, the base of an arbitrary bipolar transistor is not simultaneously connected two ON-state access MOS transistors. In other words, each memory cell according to the embodiment 2 basically operates similarly to that according to the embodiment 1 in write and read operations.

Figure 12:
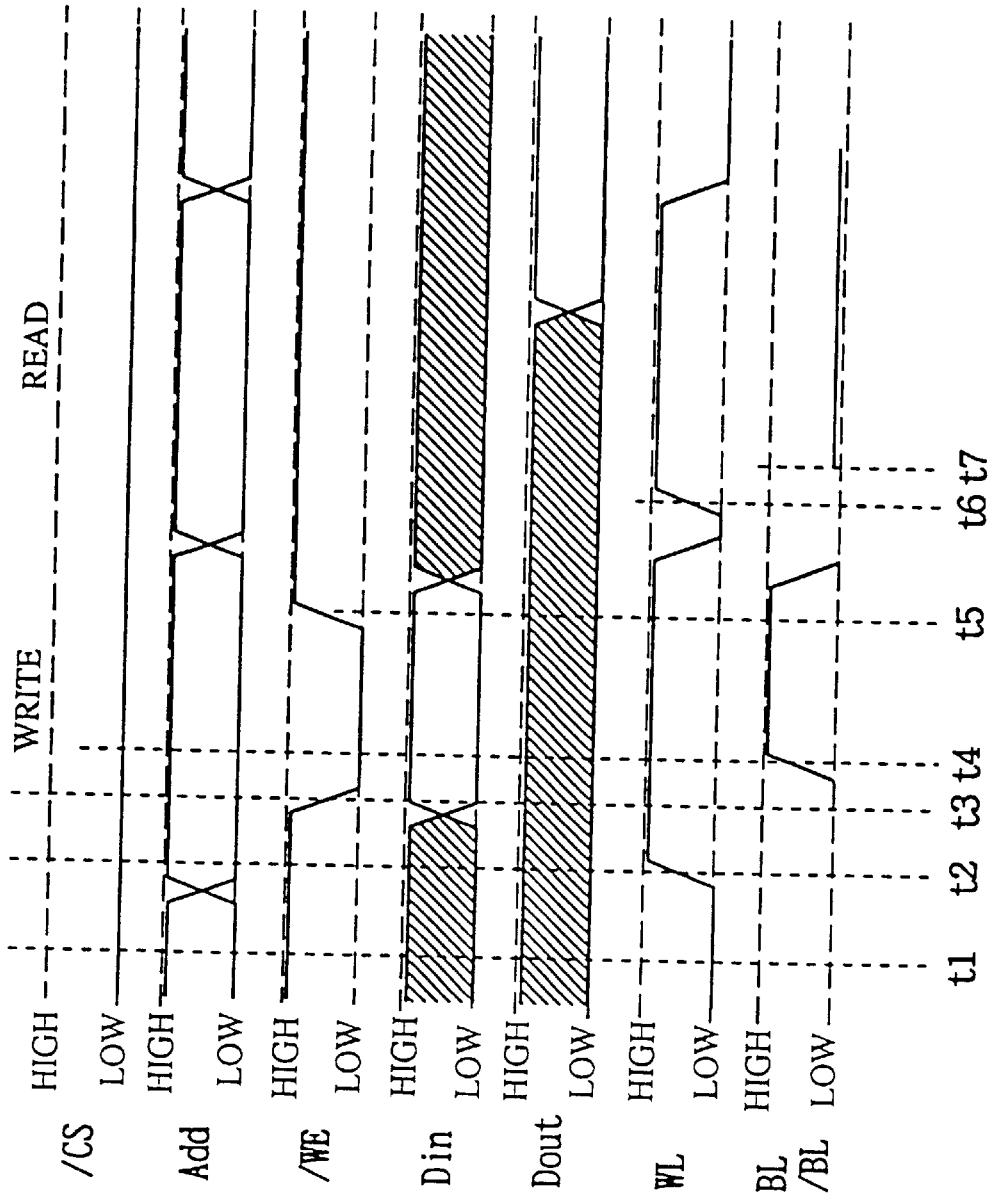
FIG. 12 is a timing chart for illustrating the operation of an SRAM according to the embodiment 2 of the present invention.

FIG. 12 is a timing chart for illustrating the write and read operations of the SRAM according to the embodiment 2 having the memory cells shown in FIG. 11.

Referring to FIG. 12, a chip select signal /CS, an address signal Add, a write enable signal /WE, input data Din and output data Dout are interfacial signals between the SRAM and the exterior.

A data write operation is now described. It is assumed that the chip select signal /CS is in an active state (low level) at a time t1.

At a time t2, a word line (row of the memory cell array) to be selected is specified in response to the externally supplied address signal Add, and the potential level of the corresponding word line responsively enters an active state (low level).

The write data Din is supplied to a data input/output terminal, and thereafter the write enable signal /WE enters an active state (low level) at a time t3, to specify the write operation. In response to this, the potentials of the pair of bit lines BL and /BL which have been precharged at low levels are driven to corresponding complementary potential levels respectively. Considering that the storage node N1 originally stores a low level and the potential of the bit line BL is driven to a high level, for example, the base-to-emitter potential difference of the bipolar transistor Q7 which is connected with the bit line BL exceeds the threshold voltage of this bipolar transistor Q7. Thus, the bipolar transistor Q7 conducts, whereby the storage node N1 is charged so that its potential level goes high. In response to this, the driver transistor Q2 enters a conducting state, and the storage node N2 is discharged so that its potential level goes low. On the other hand, the driver transistor Q1 enters a cutoff state, whereby the storage node N1 is charged so that its potential level goes high. Namely, the state of the bistable element holding storage data is inverted, for writing the corresponding data.

At a time t5, the write enable signal /WE enters an inactive state (high level), thereby completing the write operation.

The read operation is now described.

The address signal Add is switched, whereby a corresponding word line is selected and the potential level of the selected word line goes high at a time t6. Thus, the access transistors Q3 and Q4 enter conducting states, and the first input/output node P1 and the first storage node N1 as well as the second input/output node P2 and the second storage node N2 are connected with each other. At a time t7, on the other hand, the potential levels of the pair of bit lines BL and /BL are pulled up toward the power supply potential Vcc. Considering that the storage node N2 holds a low level at this time, for example, the emitter-to-base potential difference of the bipolar transistor Q8 connected with the bit line /BL exceeds the threshold voltage, and this bipolar transistor Q8 enters a conducting state. The potential level of the bit line /BL is reduced in response. On the other hand, the bipolar transistor Q7 which is connected with the bit line BL remains in a non-conducting state since the potential of the storage node N1 is at a high level. Therefore, the potential level of the bit line BL is increased.

The potential difference between the bit lines BL and /BL caused in the aforementioned manner is detected and amplified, thereby outputting read data at the data input/output terminal at a time t8.

FIGS. 13A, 13B and 13C are plan views showing the plane pattern of an active region and a first polysilicon layer, a second polysilicon layer, and a third polysilicon layer and a bit line in each memory cell of the SRAM according to the embodiment 2 shown in FIG. 11 respectively.

This plane pattern is different from that of the SRAM 1000 according to the embodiment 1 shown in FIGS. 5 to 7 in a point that the boundary of the memory cell is present on second buried contacts 13a and 13b in the embodiment 2, although the bit-line direction boundary of the memory cell is present outside the second buried contacts 13a and 13b in the embodiment 1.

The remaining points of this plane pattern are similar to those shown in FIGS. 5 to 7, and identical portions are denoted by the same reference numerals, to omit redundant description.

Figure 14:
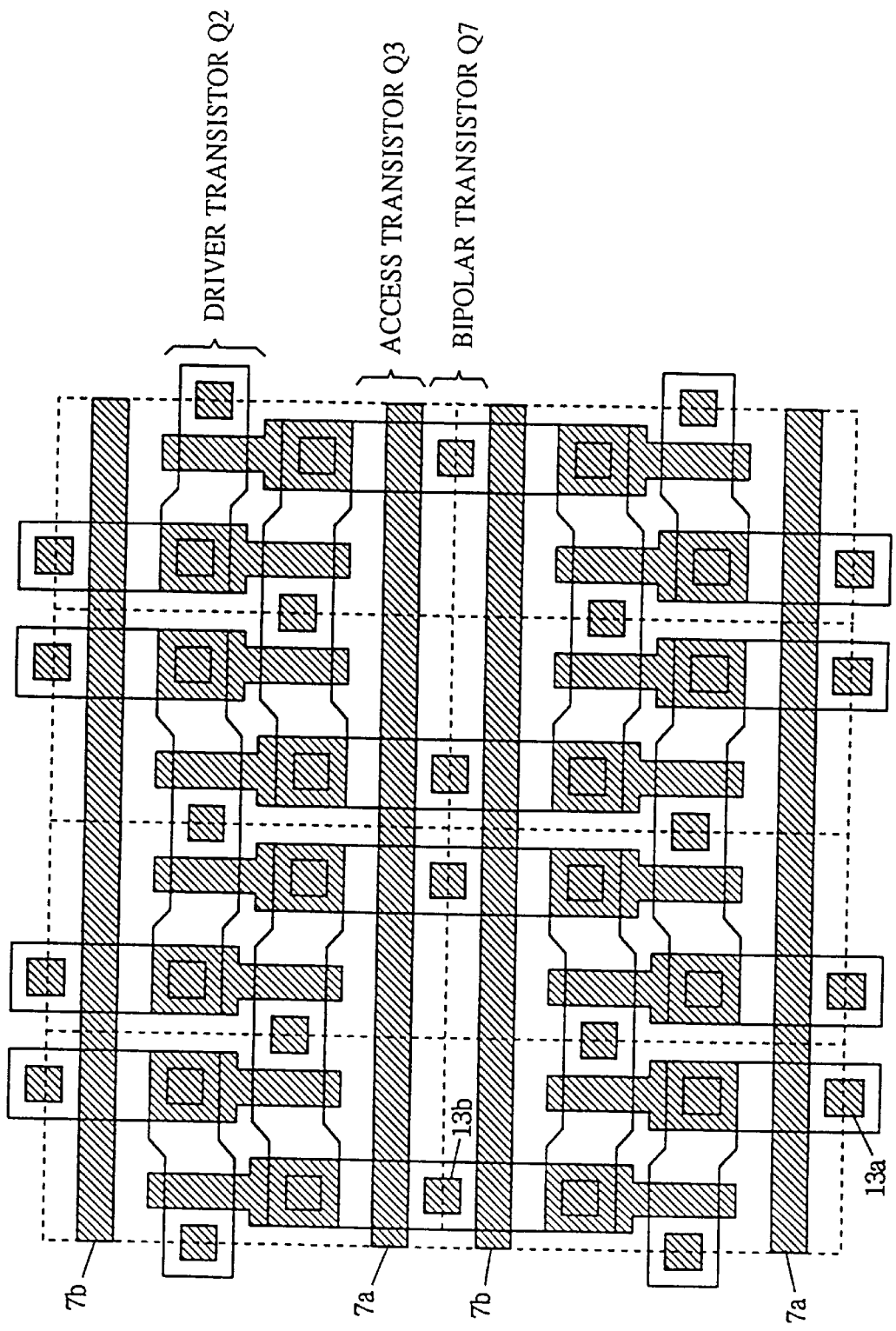
FIG. 14 is a plan view showing arrangement of memory cells, each having the structure shown in FIGS. 13A to 13C, in the form of a two-dimensional array.

FIG. 14 is a plan view showing arrangement of memory cells each having the structure shown in FIGS. 13A to 13C in the form of an array.

Referring to FIG. 14, two adjacent memory cells share the second buried contact 13a or 13b. As described with reference to FIG. 8, the second buried contact 13a or 13b is a connection hole connecting the emitter of a bipolar transistor provided in a region which is in common with a source/drain region of an access transistor with a second polysilicon layer 15a or 15b.

Due to the arrangement of the memory cells shown in FIG. 14, therefore, it is possible to implement such a structure that two adjacent memory cells share a single bipolar transistor as to the bit line direction, i.e., the column direction of the memory cell array.

Due to this structure, the memory cell area can be reduced as compared with the memory cell according to the embodiment 1 as to the column direction of the memory cell.

Embodiment 3

Figure 15:
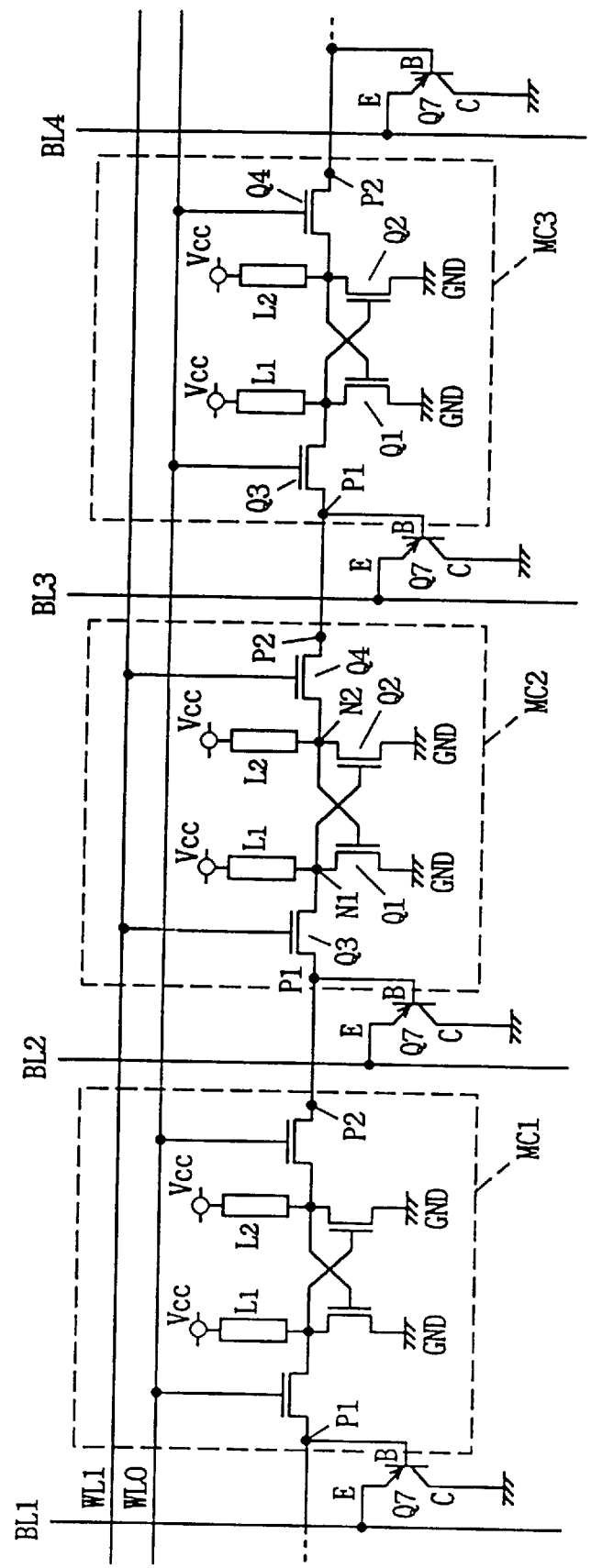
FIG. 15 is a partially enlarged view showing the structures of memory cells, bit lines and word lines of an SRAM according to an embodiment 3 of the present invention.

FIG. 15 is a partially enlarged view showing the structures of memory cells MC1 to MC3, bit lines BL1 to BL4 and word lines WL0 and WL1 of an SRAM according to an embodiment 3 of the present invention.

In the memory cell array of the SRAM according to the embodiment 2, two memory cells which are adjacent to each other along the bit line direction (column direction) share the bipolar transistor driving the potential level of the corresponding bit line. In the memory cell array of the SRAM according to the embodiment 3, on the other hand, memory cells which are adjacent to each other along the word line direction (row direction) share a bipolar transistor driving a corresponding bit line.

In the memory cell array of the SRAM according to the embodiment 2, the memory cells arranged along the word line direction are connected to the same word line. In the memory cell array of the SRAM according to the embodiment 3, on the other hand, two memory cells which are adjacent to each other along the word line direction are connected with the different word lines WL0 and WL1 respectively. When a specific memory cell is selected, therefore, memory cells adjacent to each other along the word line direction are exclusively selected.

Therefore, it is possible to inhibit the base of a bipolar transistor which is shared by two memory cells adjacent in the word line direction from simultaneous connection with two access MOS transistors which are in ON states (selected states).

Due to this structure, it is possible to reduce the number of bipolar transistors per 1-bit storage element, thereby reducing the memory cell area.

According to the embodiment 3, further, memory cells which are adjacent to each other in the row direction are not simultaneously selected. Therefore, when the memory cell MC2 is selected, for example, data can be read or written by employing the bit lines BL2 and BL3 as a pair. Thus, the number of bit lines per memory cell can be reduced from two in the embodiment 2 to one, whereby wiring pitches for metal wires can be relaxed. This means improvement of resistance against a defect such as a metal-to-metal shorting, while the fabrication yield can also be improved.

Among the memory cells MC1 to MC3 shown in FIG. 15, the structure of the memory cell MC2 is now mainly described.

The memory cell MC2 includes a first invertor including a first load element L1 and a first driver transistor Q1, which are serially connected between a power supply potential Vcc and a ground potential GND, and a second invertor including a second load element L2 and a second driver transistor Q2 which are serially connected between another power supply potential Vcc and the ground potential GND.

The first and second invertors are cross-connected with each other, and output nodes N1 and N2 of the first and second invertors correspond to first and second storage nodes respectively. The memory cell MC2 further includes an access transistor Q3 which is connected between the first storage node N1 and a first input/output node P1 so that its gate is connected with the word line WL1, and a second access transistor Q4 which is connected between the second storage node N2 and a second input/output node P2 so that its gate is connected to the word line WL1.

Access transistors Q3 and Q4 of the memory cells MC1 and MC3 are connected with the word line WL0.

The base of a bipolar transistor Q7 whose emitter is connected with the bit line BL2 is connected with the input/output nodes P2 and P1 of the memory cells MC1 and MC2. On the other hand, another bipolar transistor Q7 whose emitter is connected with the bit line BL3 is connected with the input/output nodes P2 and P1 of the memory cells MC2 and MC3.

The collectors of the bipolar transistors Q7 are coupled with the ground potential GND.

The memory cell area can be further reduced by making the collectors of the bipolar transistors Q7 and back gates of the driver transistors Q1 and Q2 and the access transistors Q3 and Q4 share common regions as described later, although the present invention is not restricted to this.

As hereinabove described, either bipolar transistor Q7 enters a conducting or cutoff state in response to the potential levels of the storage nodes N1 and N2 of the memory cell MC2 when the word line WL1 is in a selected state, for example, so that the bit lines BL2 and BL3 are driven to potential levels corresponding to the storage data.

Read and write operations of the SRAM according to the embodiment 3 are similar to those of the embodiment 2 described with reference to FIG. 12, except that the memory cells are alternately connected to the word lines WL0 and WL1 every column of the memory cell array.

Figure 16:
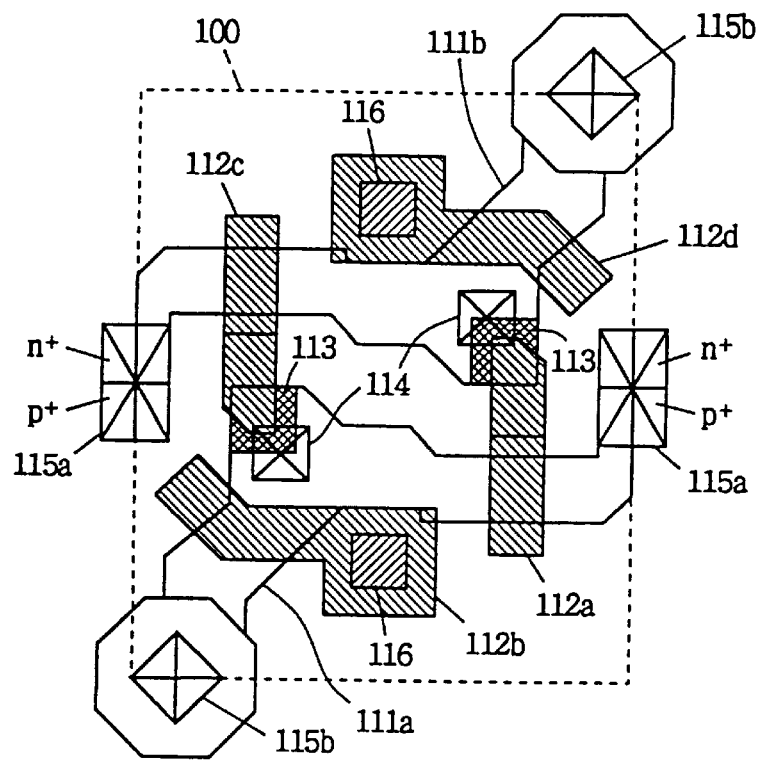
FIG. 16 is a plan view showing patterns of active regions and first polysilicon layers in each memory cell according to the embodiment 3 of the present invention.

FIG. 16 is a plan view showing the plane pattern of each memory cell of the SRAM according to the embodiment 3 shown in FIG. 15.

FIG. 16 shows active region patterns 111 and first polysilicon layer patterns 112 serving as the gates of the access or driver transistors. Referring to FIG. 16, the plan view is line-symmetrically folded on the respective sides of a memory cell boundary frame 100 about this cell frame, thereby forming a two-dimensional arrangement. An overlapping part between an active region 111a and a first polysilicon layer 112b corresponds to the access transistor Q3. An overlapping part between the active region 111a and a first polysilicon layer 112a corresponds to the driver transistor Q1.

An overlapping part between an active region 111b and a first polysilicon layer 112d corresponds to the access transistor Q4, and an overlapping part between the active region 111b and a first polysilicon layer 112c corresponds to the driver transistor Q2.

The first polysilicon layers 112a and 112c are connected with the active regions 111b and 111a respectively through first buried contacts 113 which are connection holes provided in a gate oxide film provided on a surface of a semiconductor substrate.

A region 115b in the active region 111a is a contact hole as described later, and this portion corresponds to an emitter region of a bipolar transistor. This also applies to a contact hole 115b in the active region 111b.

Figure 17:
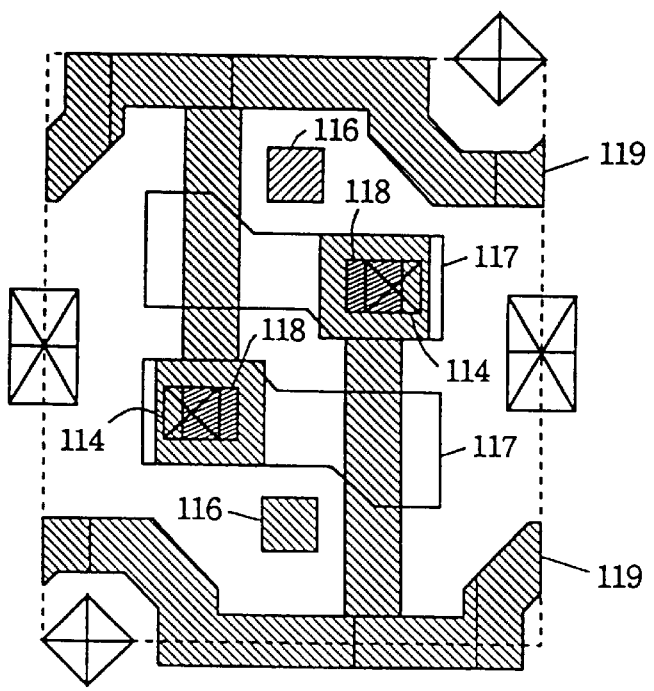
FIG. 17 is a plan view showing patterns of second and third polysilicon layers in each memory cell according to the embodiment 3 of the present invention.

FIG. 17 is a plan view showing patterns of second polysilicon layers 117 stacked on the plane pattern shown in FIG. 16 through an insulating layer (not shown) and third polysilicon layers 119 formed on the second polysilicon layers 117 through an insulating film (not shown).

Referring to FIG. 17, the active regions 111 and the like are properly omitted, in order to facilitate easy understanding of the patterns.

The second polysilicon layers 117 form gate electrodes of thin-film transistors (hereinafter referred to as TFTS) forming the load elements L1 and L2 shown in FIG. 15. The second polysilicon layers 117 are connected with the active regions 111 and the first polysilicon layers 112a and 112c through second buried contacts 114 provided in the insulating film (not shown). The third polysilicon layers 119 form channel and source/drain regions of the TFTs. Overlapping parts between the second and third polysilicon layers 117 and 119 correspond to the TFTs. The third polysilicon layers 119 are connected with the second polysilicon layers 117 through third buried contacts 118 provided in the insulating layer (not shown).

Figure 18:
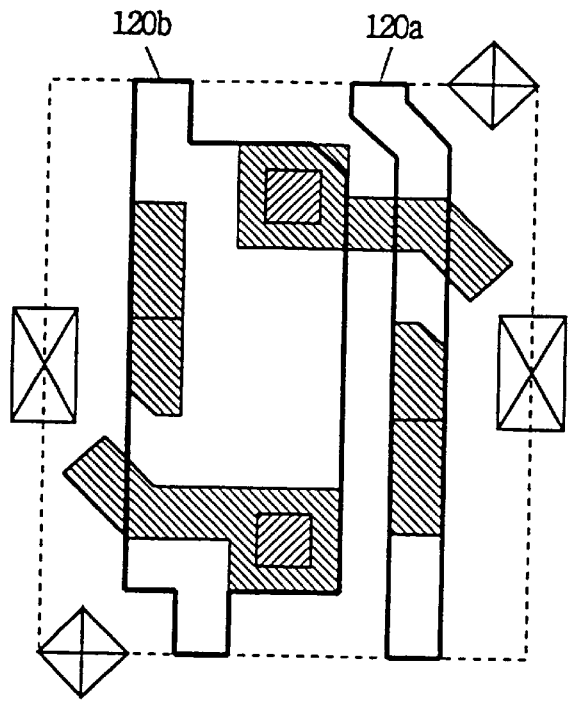
FIG. 18 is a plan view showing patterns of fourth polysilicon layers in each memory cell according to the embodiment 3 of the present invention.

FIG. 18 is a plan view showing patterns of fourth polysilicon layers 120a and 120b stacked on the plane pattern shown in FIG. 17 through an insulating layer (not shown). Also in FIG. 18, patterns other than those of the first polysilicon layers 112 are properly omitted, to facilitate easy understanding.

The fourth polysilicon layers 120a and 120b form word lines. Referring to FIG. 18, the word line 120b is connected with the lower first polysilicon layers 112b and 112d through fourth buried contacts 116.

Figure 19:
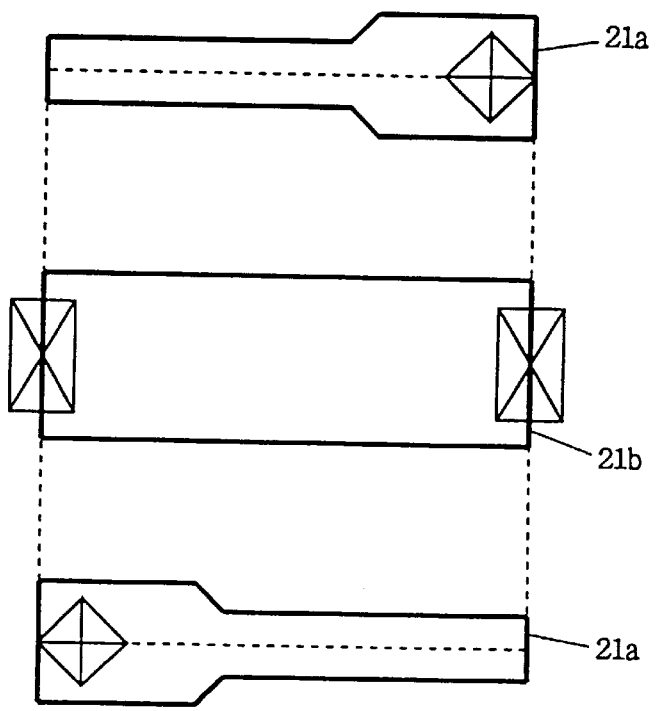
FIG. 19 is a plan view showing each bit line and ground wires of the memory cell according to the embodiment 3 of the present invention.

FIG. 19 is a plan view showing patterns of metal wires 21a and 21b formed on the plane pattern shown in FIG. 18 through an insulating layer (not shown).

The metal wire 21b, which is a ground potential wire (ground wire), supplies the ground potential to source regions of the driver MOS transistors Q1 and Q2 and the substrate (well) through contact holes 115a. As shown in FIG. 19, the type of the impurity ion-implanted into the contact holes 115a is changed from a P type to an N type in the central portions. The N-type regions are contact parts with the source regions of the driver transistors Q1 and Q2, and the P-type regions are contact parts with the substrate.

The metal wires 21a, which are bit lines, are connected with the active regions 111a and 111b through the contact holes 115b.

As hereinabove described, the portions of the contact holes 115b are emitter regions of bipolar transistors, which are P-type regions.

Source regions of N-type access transistors are present to enclose the emitter regions 115b.

Further, the substrate (well) is of a P type, and hence the aforementioned emitter regions, the source regions of the access transistors and the substrate (well) form PNP bipolar transistors. Therefore, the structures of impurity regions of the bipolar and access transistors in the substrate are similar to those in the embodiment 1 shown in FIG. 8.

Figure 20:
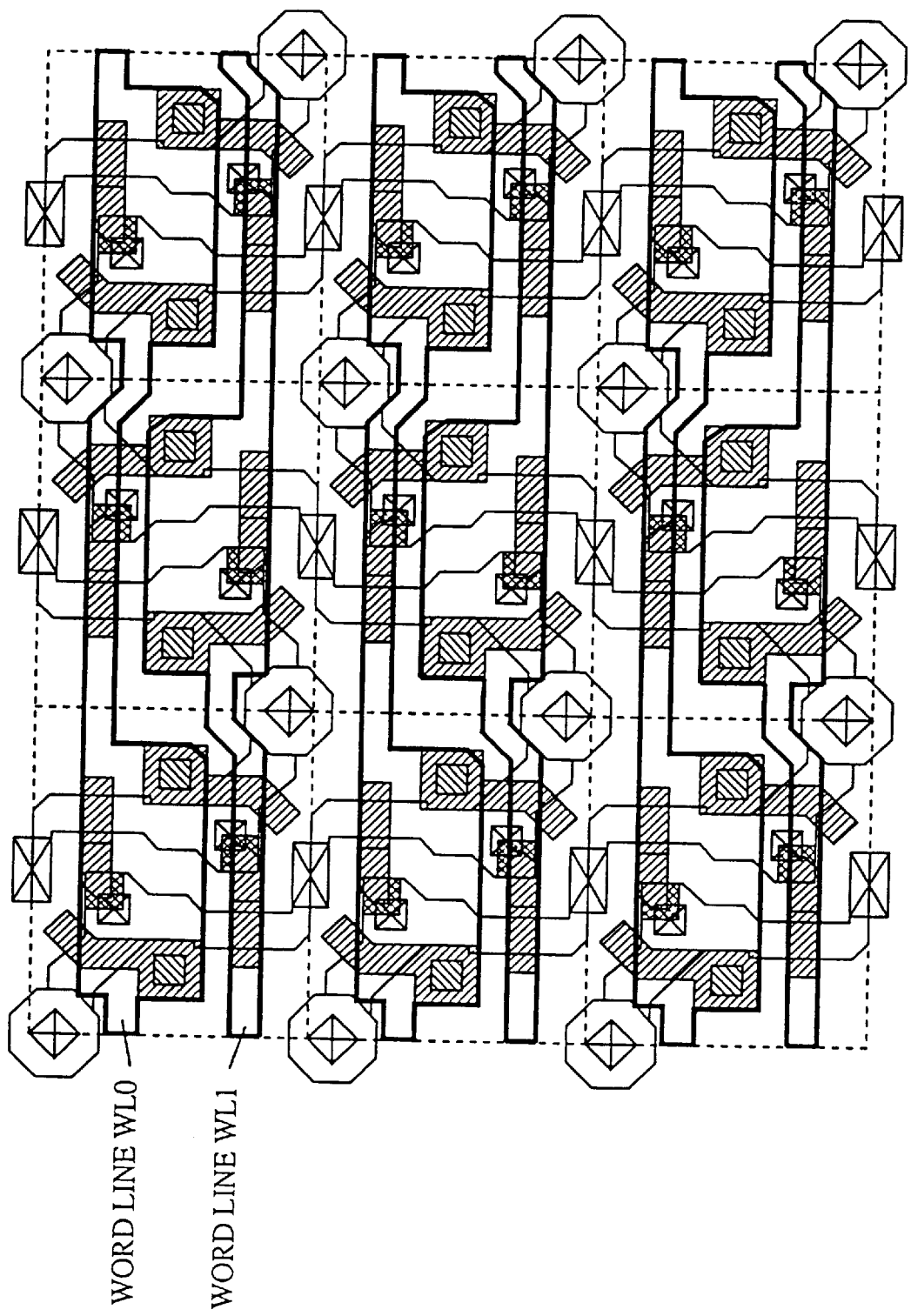
FIG. 20 is a plan view showing arrangement of memory cells, each having the structure shown in FIGS. 16 to 19, in the form of a two-dimensional array.

FIG. 20 is a plan view showing arrangement of the memory cells according to the embodiment 3 shown in FIGS. 16 to 19 in the form of an array. As shown in FIG. 16, each contact hole 115b corresponding to an emitter region of a bipolar transistor is shared by two memory cells which are adjacent to each other in the word line direction. On the other hand, the word lines WL0 and WL1 are connected with the access transistors Q3 and Q4 of the memory cells which are alternately arranged in the word line direction.

As described with reference to FIG. 15, therefore, the number of the bipolar transistors can be reduced to one although two bipolar transistors are required per 1-bit storage element in the embodiment 1, whereby reduction of the memory cell size as well as the chip size can be implemented thereby implementing reduction of the fabrication cost.

Embodiment 4

Figure 21:
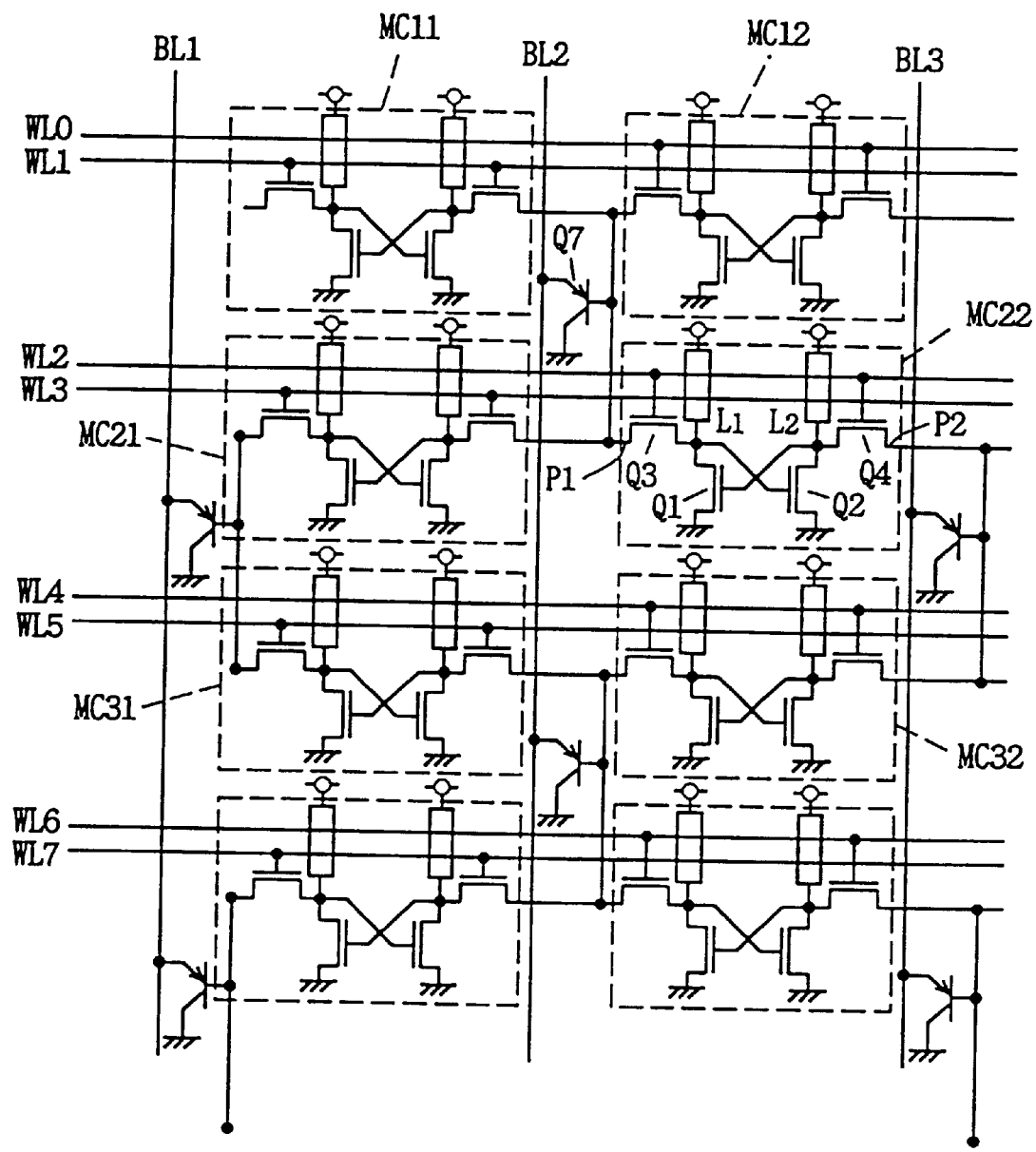
FIG. 21 is a partially enlarged view showing the structures of memory cells, bit lines and word lines in an SRAM according to an embodiment 4 of the present invention.

FIG. 21 is a partially enlarged view showing the structures of memory cells, bit lines and word lines of an SRAM according to an embodiment 4 of the present invention.

The structure of this embodiment is similar to that of the SRAM according to the embodiment 1 shown in FIG. 1, except a memory cell array part.

The memory cell array of the SRAM according to the embodiment 4 is obtained by combining the structures of the memory cell arrays according to the embodiments 2 and 3 with each other. Namely, four adjacent memory cells share a single bipolar transistor in a two-dimensionally arranged memory cell array.

Referring to FIG. 21, a memory cell MC11 is selected by a word line WL1, and its second input/output node P2 is connected with the base of a bipolar transistor Q7 whose emitter is connected with a bit-line BL2. On the other hand, a memory cell MC12 is selected by a word line WL0, and its first input/output node P1 is connected with the base of the bipolar transistor Q7 whose emitter is connected with the bit line BL2.

A memory cell MC21 is selected by a word line WL3, and its second input/output node P2 is connected with the base of the bipolar transistor Q7. A memory cell MC22 is selected by a word line WL2, and its first input/output node P1 is connected with the base of the bipolar transistor Q7.

The collector of the bipolar transistor Q7 is coupled with the ground potential. Similarly to the memory cells according to the embodiments 2 and 3, the memory cell area can be further reduced by making the collector region of the bipolar transistor Q7 and back gates of driver transistors Q1 and Q2 and access transistors Q3 and Q4 of the memory cells share common regions.

Due to the structure of the memory cell array shown in FIG. 21, memory cells belonging to two adjacent columns (bit line direction) are selected by different word lines respectively, whereby the memory cells MC11 and MC12 are not simultaneously selected, for example. Also as to the row direction (direction of the word lines), on the other hand, the memory cells MC11 and MC21 are not simultaneously selected, for example. Therefore, two or more ones of the four access transistors connected with the base of the bipolar transistor Q7 do not enter conducting states at the same time. Thus, the bipolar transistor Q7 can drive the potential level of the bit line BL2 in response to the potential levels of the input/output nodes of the selected memory cell in a read or write operation.

While two bipolar transistors are necessary per 1-bit storage element in the embodiment 1, the memory cell according to the embodiment 4 includes 2/1 bipolar transistor, whereby the memory cell area can be further reduced.

FIGS. 22, 23, 24 and 25 illustrate the plane pattern of the memory cell according to the embodiment 4 shown in FIG. 21, in comparison with FIGS. 16 to 19 showing the embodiment 3 respectively.

The plane pattern of the embodiment 4 is different from that of the embodiment 3 in a point that a memory cell frame 100 includes ¼ of every contact hole 115b, while the memory cell frame 100 divides each contact hole 115b into two in the memory cell according to the embodiment 3 as shown in FIG. 16. Thus, a half contact hole 115b is present in the memory cell frame 100 in the embodiment 4.

As described with reference to FIG. 16, each contact hole 115b corresponds to the source region of the access transistor Q3 or Q4 and the emitter region of the bipolar transistor sharing its base region. Thus, a half bipolar transistor is present in each memory cell according to the embodiment 4. The remaining portions identical to those in FIGS. 16 to 19 are denoted by the same reference numerals, to omit redundant description.

Figure 26:
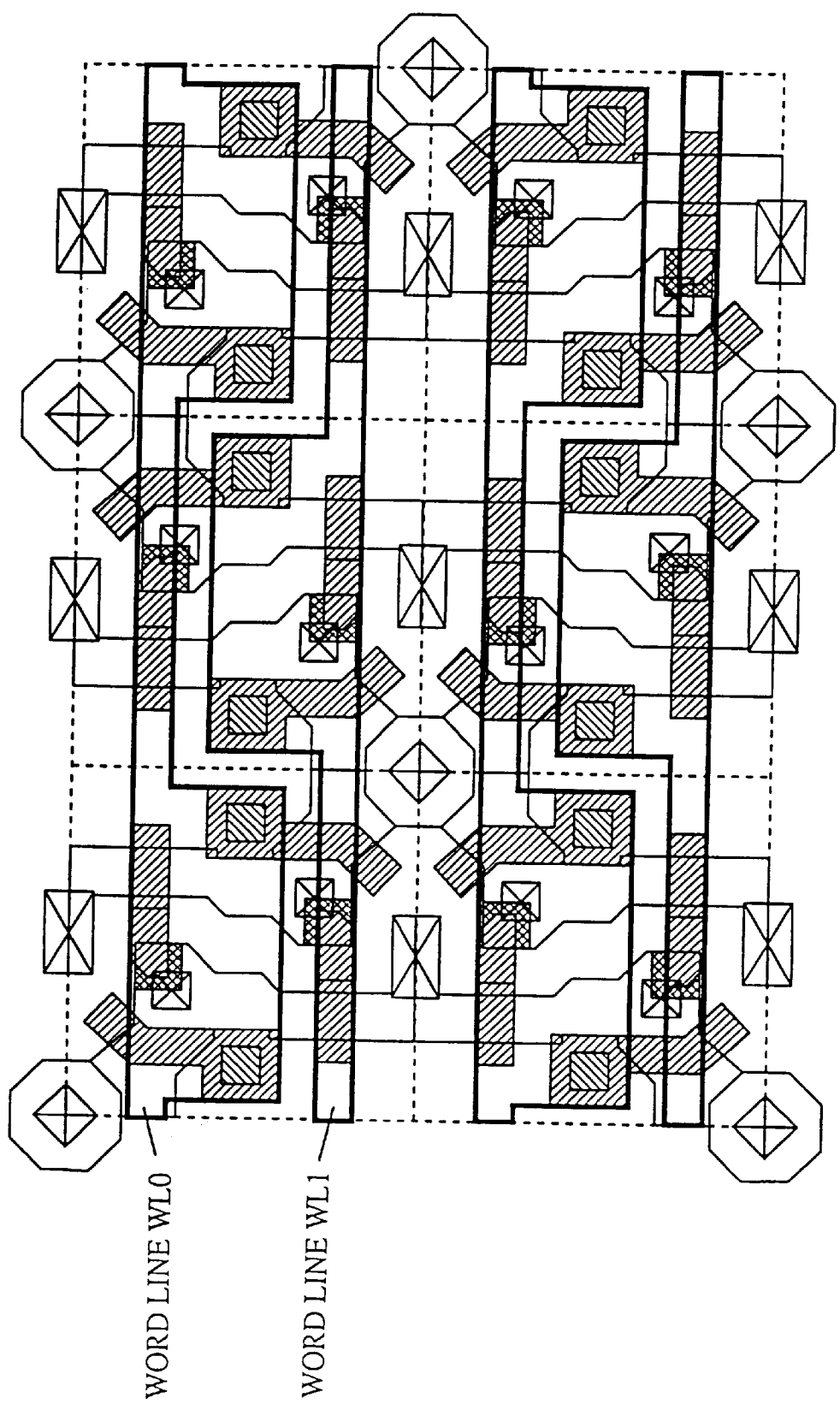
FIG. 26 is a plan view showing arrangement of memory cells, each having the structure shown in FIGS. 22 to 25, in the form of a two-dimensional array.

FIG. 26 is a plan view showing arrangement of the memory cells according to the embodiment 4 shown in FIGS. 22 to 25 in the form of a two-dimensional array.

With reference to the word line direction (row direction), the access transistors of adjacent memory cells are alternately connected with the word lines WL0 and WL1 through fourth buried contacts 116.

Each contact hole 115b corresponding to an emitter of a bipolar transistor is shared by four adjacent memory cells. Thus, the memory cell area can be further reduced as compared with the embodiment 3 shown in FIG. 20 by arranging the memory cells as shown in FIG. 26, whereby reduction of the chip size, i.e., reduction of the fabrication cost can be implemented.

Similarly to the memory cells of the embodiment 3, further, the number of the bit line per memory cell can be reduced from two in the memory cell according to the embodiment 1 to one, whereby the pitches of metal wires can be relaxed. Thus, resistance against a defect such as wire-to-wire shorting can be improved, and the fabrication yield can also be improved.

Embodiment 5

Figure 27:
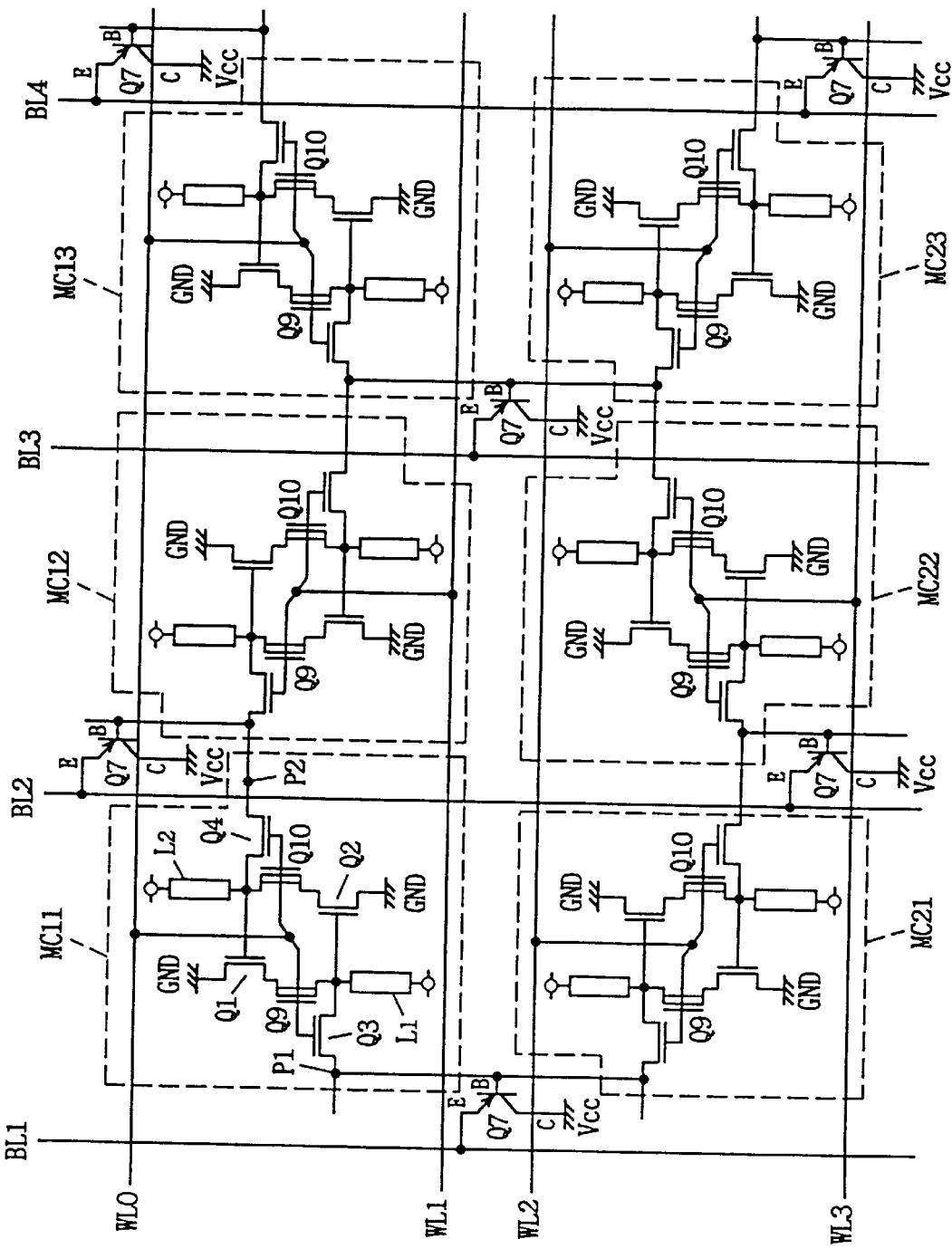
FIG. 27 is a partially enlarged view showing the structures of memory cells, bit lines and word lines according to an embodiment 5 of the present invention.

FIG. 27 is a partially enlarged view showing the structures of memory cells, bit lines and word lines in an SRAM according to an embodiment 5 of the present invention.

The structure of this embodiment is similar to that of the SRAM 1000 according to the embodiment 1 shown in FIG. 1, except a memory cell array.

Each memory cell of the embodiment 5 is different from that of the embodiment 4 shown in FIG. 21 in the following two points:

First, two invertors forming a bistable element in the memory cell include load elements, depletion MOS transistors and driver MOS transistors which are serially connected between power supply potentials Vcc and ground potentials GND.

In this case, connection points between the load elements and the depletion transistors correspond to output nodes of the invertors, i.e., storage nodes of the bistable element.

Second, the gates of two access transistors Q3 and Q4 and the depletion transistors Q9 and Q10 included in the invertors are connected in common, and these gates are connected to a corresponding word line.

Namely, each memory cell according to the embodiment 5 includes a first invertor including a load element L1, the depletion MOS transistor Q9 and a driver MOS transistor Q1 which are serially connected between the power supply potential Vcc and the ground potential GND, and a second invertor including a load element L2, the depletion MOS transistor Q10 and a driver transistor Q2 which are serially connected between another power supply potential Vcc and the ground potential GND. The connection point between the load element L1 and the depletion MOS transistor Q9 corresponds to an output node of the first invertor, i.e., a first storage node N1, and that between the load element L2 and the depletion transistor Q10 corresponds to an output node of the second invertor, i.e., a second storage node N2. The first and second invertors are cross-connected with each other, to form a bistable element. Namely, the storage node N1 is connected with the gate of the driver transistor Q2, and the storage node N2 is connected with the gate of the driver transistor Q1.

Each memory cell according to the embodiment 5 further includes the access MOS transistor Q3 which is connected between the first storage node N1 and the first input/output node P1, and the second access MOS transistor Q4 which is connected between the second storage node N2 and the second input/output node P2. The gates of the access transistors Q3 and Q4 and the depletion MOS transistors Q9 and Q10 are connected with a word line WL1.

The access transistors Q3 and Q4 enter conducting states in response to a selected state (low level) of the corresponding word line WL1, while the depletion transistors Q9 and Q10 are in conducting states whether the word line WL1 is in a selected or non-selected state.

Referring to FIG. 27, memory cells MC12, MC13, MC22 and MC23 share one bipolar transistor Q7, for example. Namely, the second input/output node P2 of the memory cell MC12, the first input/output node P1 of the memory cell MC13, the second input/output node P2 of the memory cell MC22 and the first input/output node P1 of the memory cell MC23 are connected with the base of the bipolar transistor Q7, whose emitter is connected with a bit line BL3.

The collector of the bipolar transistor Q7 is coupled with the ground potential.

Similarly to the embodiments 1 to 4, the memory cell area can be further reduced by making the collector region of the bipolar transistor Q7 and back gates of the driver transistors Q1 and Q2, the depletion MOS transistors Q9 and Q10 and the access transistors Q3 and Q4 in the memory cells have common regions.

As shown in FIG. 27, memory cells belonging to adjacent columns are selected by different word lines. Namely, the memory cells MC11 and MC13 are selected by a word line WL0, while the memory cell MC12 belonging to a column which is held between the memory cells MC11 and MC13 is selected by the word line WL1.

The depletion MOS transistors Q9 and Q10, which are present in the first and second invertors forming the bistable element included in each memory cell, are regularly in conducting states whether the corresponding word line is in a selected or non-selected state, and hence the operation of the memory cell is basically similar to that of the memory cell shown in FIG. 21.

However, the memory cell area can be further reduced due to the presence of the depletion MOS transistors Q9 and Q10, as described below.

FIGS. 28 to 31 are plan views showing the plane pattern of each memory cell shown in FIG. 27, in correspondence to FIGS. 22 to 25 showing the embodiment 4 respectively.

Figure 22:
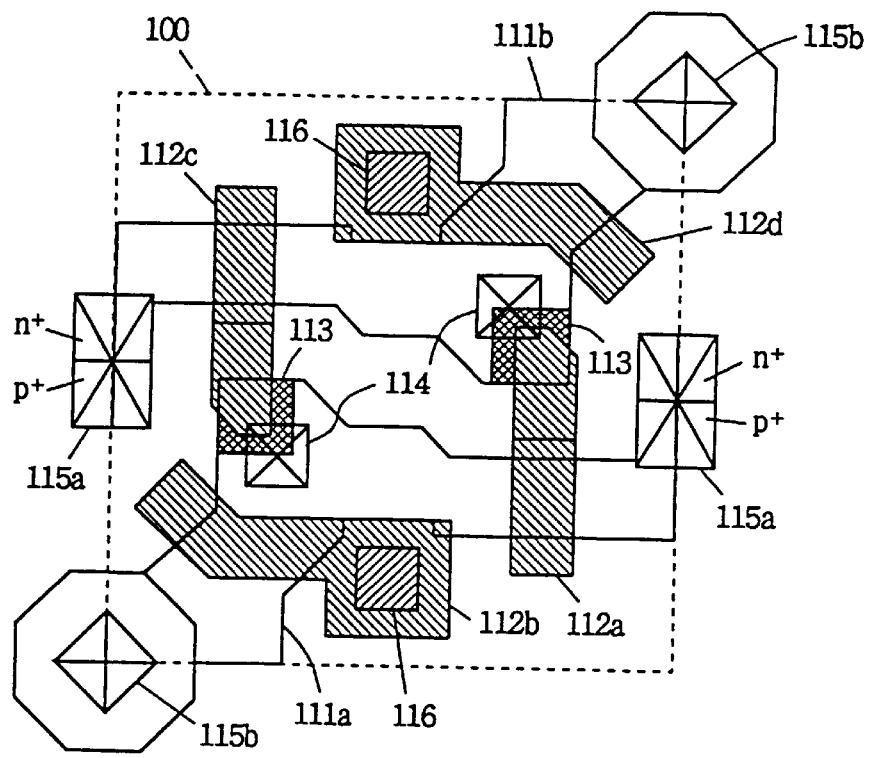
FIG. 22 is a plan view showing patterns of active regions and first polysilicon layers of each memory cell according to the embodiment 4 of the present invention.
Figure 23:
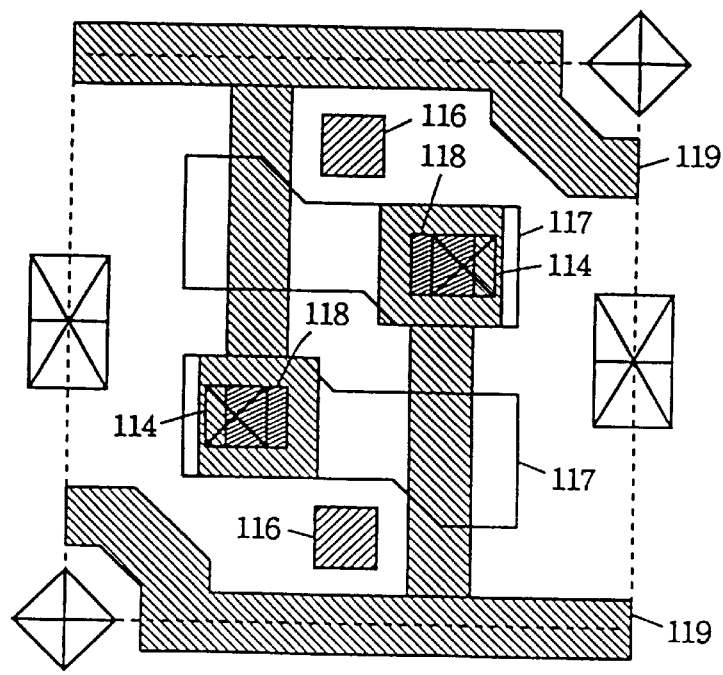
FIG. 23 is a plan view showing patterns of second and third polysilicon layers of each memory cell according to the embodiment 4 of the present invention.
Figure 24:
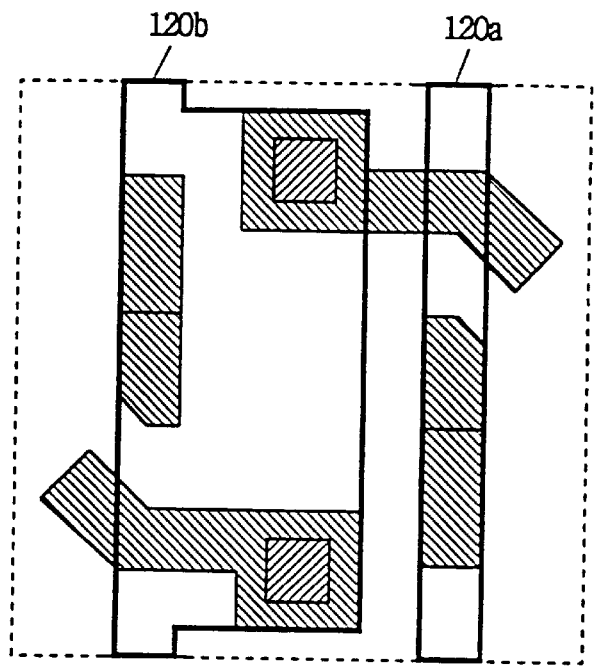
FIG. 24 is a plan view showing patterns of fourth polysilicon layers of each memory cell according to the embodiment 4 of the present invention.
Figure 25:
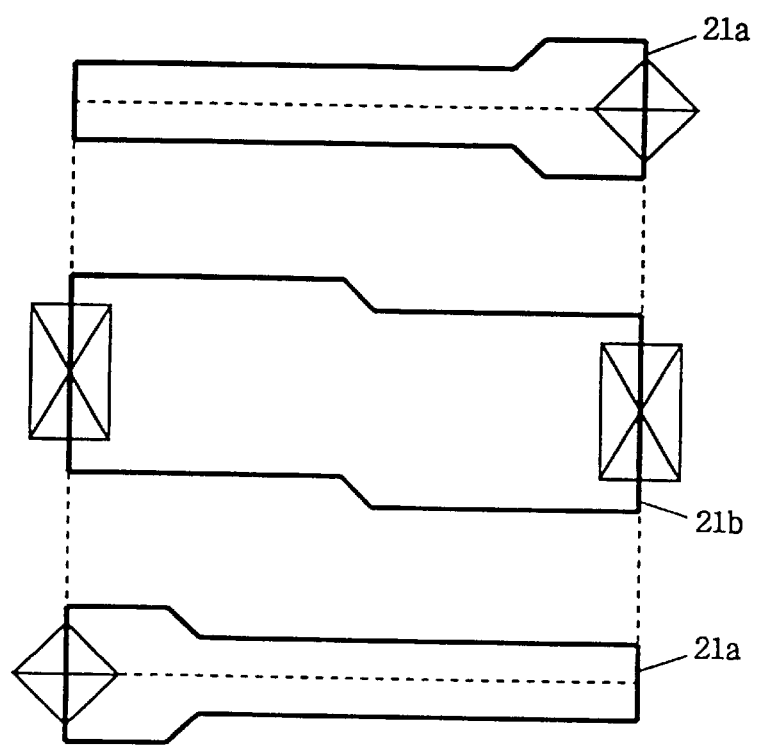
FIG. 25 is a plan view showing patterns of a ground wire and a bit line of each memory cell according to the embodiment 4 of the present invention.

The plane pattern of the memory cell of the SRAM according to the embodiment 5 is different from that of the memory cell according to the embodiment 4 in the following points:

While the first polysilicon layers 112b and 112d corresponding to the gate electrodes of the access transistors Q3 and Q4 are independent patterns in the memory cell according to the embodiment 4 as shown in FIG. 22, a first polysilicon layer 112e corresponding to the gates of the access transistors Q3 and Q4 and the depletion MOS transistors Q9 and Q10 is an integral pattern in the memory cell according to the embodiment 5.

Second, a single fourth buried contact 116 is formed with respect to the first polysilicon layer 112e, so that a fourth polysilicon layer 120b forming a word line is connected with the first polysilicon layer 112e through the fourth buried contact 116.

Third, the threshold values of the depletion MOS transistors Q9 and Q10 are reduced as compared with the access transistors Q3 and Q4 and the driver transistors Q1 and Q2 by previously implanting ions into parts of an active region 111 in a prescribed dose and prescribed injection energy so that portions of an overlapping part between the first polysilicon layer 112e and the active region 111 corresponding to the depletion MOS transistors Q9 and Q10 define the depletion MOS transistors Q9 and Q10.

As hereinabove described, only a single fourth buried contact 116 may be formed per memory cell in the embodiment 5, whereby the memory cell area can be further reduced.

Figure 28:
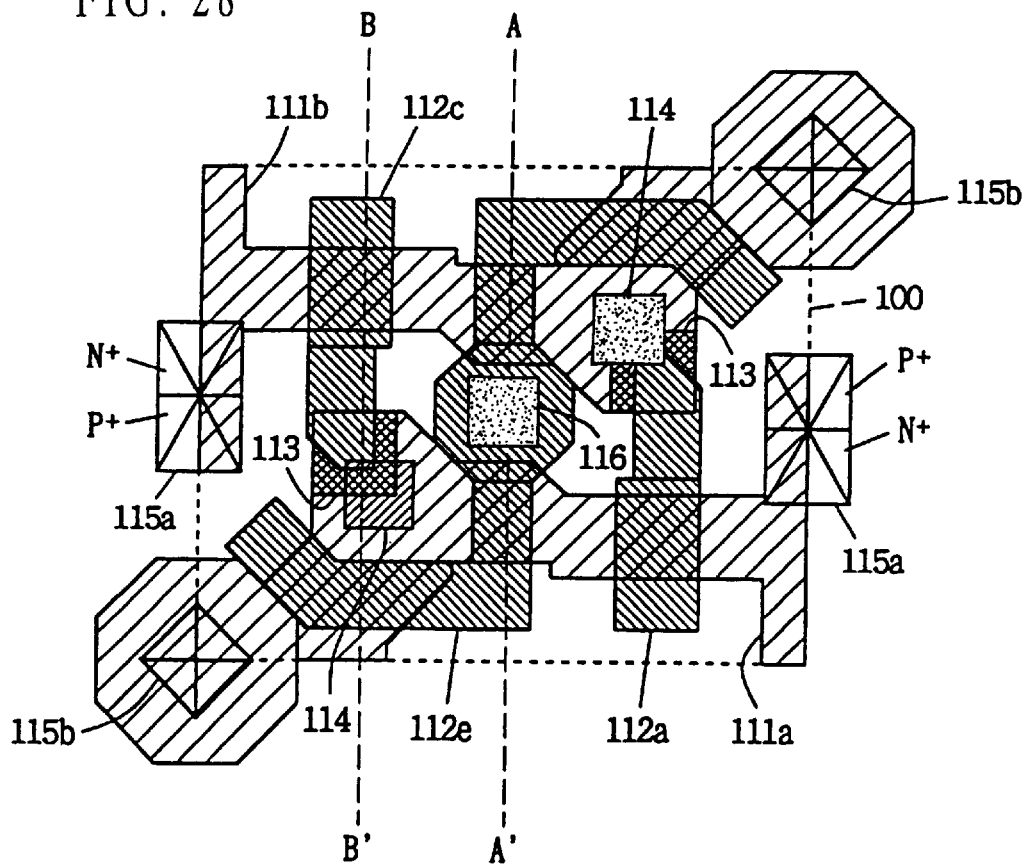
FIG. 28 is a plan view showing patterns of active regions and first polysilicon layers of each memory cell according to the embodiment 5 of the present invention.

FIG. 28 is a plan view showing the plane pattern of the memory cell of the SRAM according to the embodiment 5 shown in FIG. 27.

FIG. 28 shows the patterns of active regions 111 and first polysilicon layers 112 serving as the gates of the access or driver transistors. Referring to FIG. 28, the plan view is line-symmetrically folded on the respective edges of a memory cell boundary frame 100, for forming a two-dimensional arrangement. In an overlapping part between the active region 111a and the first polysilicon layer 112e, a region closer to a contact hole 115b corresponds to the access transistor Q3, and a region closer to the fourth buried contact 116 corresponds to the depletion MOS transistor Q9. An overlapping part between the active region 111a and a first polysilicon layer 112a corresponds to the driver transistor Q1.

In an overlapping part between an active region 111b and the first polysilicon layer 112e, a region closer to the contact hole 115b corresponds to the access transistor Q4, and a region closer to the fourth buried contact 116 corresponds to the depletion MOS transistor Q10. An overlapping part between the active region 111b and a first polysilicon layer 112c corresponds to the driver transistor Q2.

The first polysilicon layers 112a and 112c are connected with the active regions 111b and 111a through first buried contacts 113 which are connection holes provided in a gate oxide film on a surface of a semiconductor substrate respectively.

The region 115b of the active region 111a is a contact hole as described later, and this part corresponds to an emitter region of a bipolar transistor. This also applies to the contact hole 115b in the active region 111b.

Figure 29:
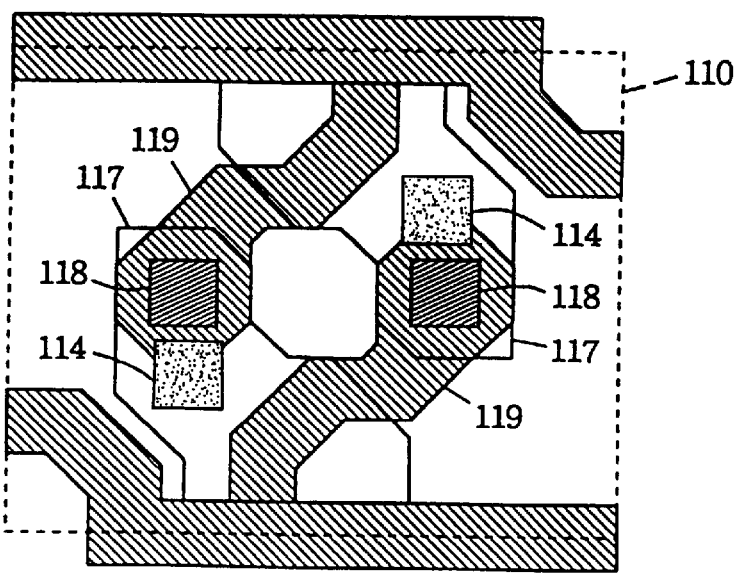
FIG. 29 is a plan view showing patterns of second and third polysilicon layers of each memory cell according to the embodiment 5 of the present invention.

FIG. 29 is a plan view showing patterns of second polysilicon layers 117 stacked on the plane pattern shown in FIG. 28 through an insulating layer (not shown) and third polysilicon layers 119 formed on the second polysilicon layers 117 through an insulating film (not shown).

Referring to FIG. 29, the active regions 111 and the like are properly omitted, in order to facilitate easy understanding.

The second polysilicon layers 117 form gate electrodes of thin-film transistors (hereinafter referred to as TFTs) forming the load elements L1 and L2 shown in FIG. 27. The polysilicon layers 117 are connected with the active regions 111 and the first polysilicon layers 112a and 112c through second buried contacts 114 provided in the insulating film (not shown). The third polysilicon layers 119 form channel and source/drain regions of the TFTs. Overlapping parts between the second and third polysilicon layers 117 and 119 correspond to the TFTs. The third polysilicon layers 119 are connected with the second polysilicon layers 117 through third buried contacts 118 provided in the insulating layer (not shown).

Figure 30:
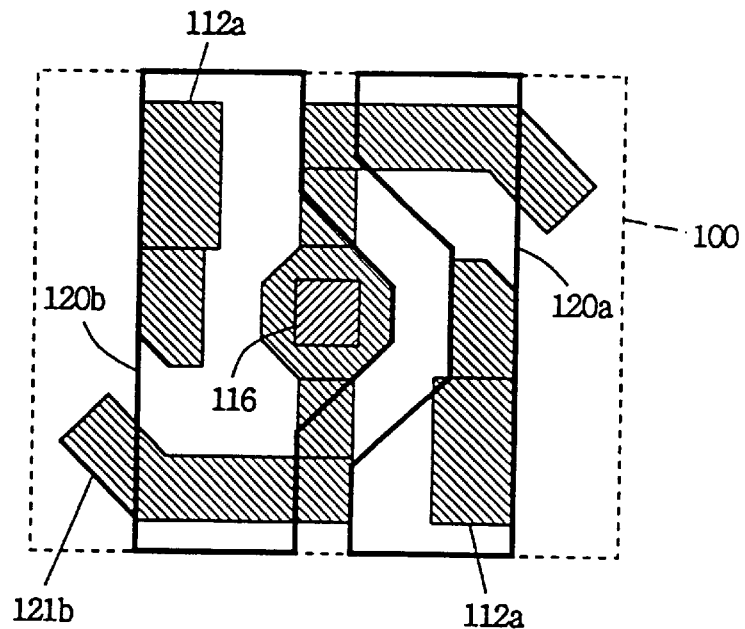
FIG. 30 is a plan view showing patterns of fourth polysilicon layers of each memory cell according to the embodiment 5 of the present invention.

FIG. 30 is a plan view showing patterns of fourth polysilicon layers 120a and 120b stacked on the plane pattern shown in FIG. 29 through an insulating layer (not shown). Also referring to FIG. 30, patterns other than those of the first polysilicon layers 112 are properly omitted, to facilitate easy understanding.

The fourth polysilicon layers 120a and 120b form word lines. Referring to FIG. 30, the word line 120b is connected with the lower first polysilicon layers 112b and 112d through a fourth buried contact 116.

Figure 31:
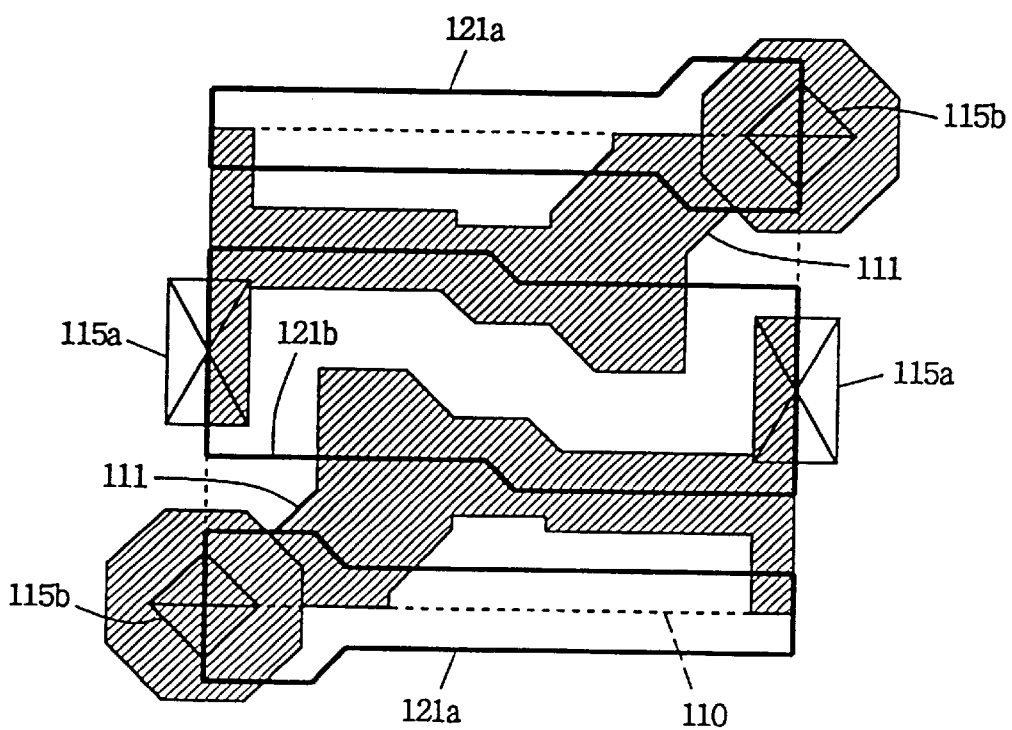
FIG. 31 is a plan view showing patterns of a ground wire and a bit line of each memory cell according to the embodiment 5 of the present invention.

FIG. 31 is a plan view showing metal wires 121a and 121b formed on the plane pattern shown in FIG. 30 through an insulating layer (not shown).

The metal wire 121b, which is a ground potential line (ground wire), supplies the source regions of the driver MOS transistors Q1 and Q2 and the substrate (well) with the ground potential through contact holes 115a. As shown in FIG. 31, the type of the impurity ion-implanted into the contact holes 115a is changed from a P type to an N type in the central portions. The N-type regions are contact parts with the source regions of the driver transistors Q1 and Q2, and the P-type regions are contact parts with the substrate.

The metal wires 121a, which are bit lines, are connected with the active regions 111a and 111b through contact holes 115b.

As hereinabove described, the parts of the contact holes 115b are P-type emitter regions of bipolar transistors.

Source regions of N-type access transistors are present to enclose the emitter regions 115b.

Further, the substrate (well) is of a P type, and hence the aforementioned emitter regions, the source regions of the access transistors and the substrate (well) form PNP bipolar transistors. Therefore, the structures of impurity regions of the bipolar and access transistors in the substrate are similar to those in the embodiment 1 shown in FIG. 8.

Due to the aforementioned structure, the memory cell area can be further reduced as compared with the memory cell according to the embodiment 4.

Figure 32:
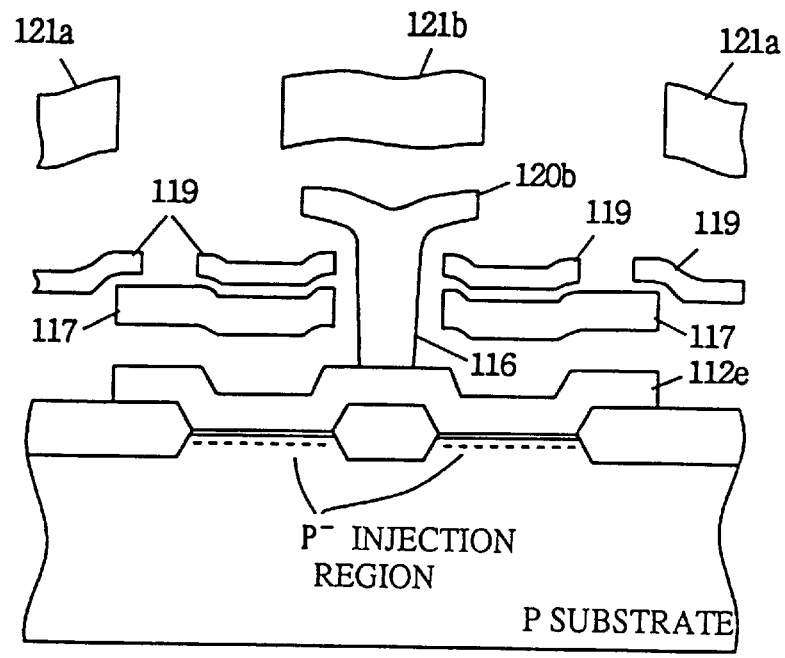
FIG. 32 is a sectional view taken along the line A–A' in FIG. 28.

FIG. 32 is a sectional view taken along the line A–A' in FIG. 28.

The fourth polysilicon layer 120b is connected with the first polysilicon layer 112e through the fourth buried contact 116.

A low-concentration P-type impurity is injected into surface parts of the P-type substrate which are in contact with the first polysilicon layers 112e through a gate oxide film, and the transistors Q9 and Q10 having channel regions defined by these parts are depletion type transistors.

Figure 33:
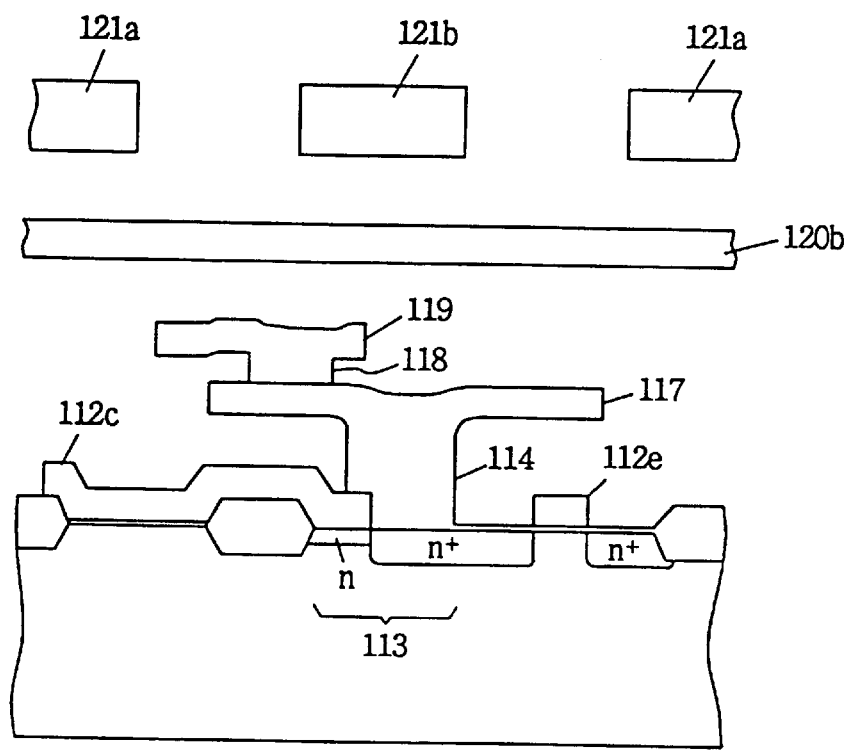
FIG. 33 is a sectional view taken along the line B–B' in FIG. 28.

FIG. 33 is a sectional view taken along the line B–B' in FIG. 28.

The first polysilicon layer 112c is connected with an n-type region of the substrate through the first buried contact hole 113 formed through the gate oxide film. On the other hand, the second polysilicon layer 117 is connected with a substrate surface exposed from the first polysilicon layer 112c and the first buried contact hole 113 through the second buried contact hole 114.

Thus, the drains of the TFTs serving as load elements are connected with the source region of the access transistor Q3 and the gate of the driver transistor Q2.

The third polysilicon layer 119 forming the gate electrode of the TFT defining the load element L3 is connected with the second polysilicon layer 117 through the third buried contact 118.

Due to the aforementioned structure, four adjacent memory cells share the same bipolar transistor and the number of the fourth buried contact holes can be reduced, whereby the memory cell area can be reduced. Thus, reduction of the chip size, i.e., reduction of the fabrication cost can be implemented.

Also in the embodiment 5, further, the number of the bit lines per memory cell can be reduced from two in the memory cell according to the embodiment 1 to one, whereby the pitches of metal wires can be relaxed. Thus, resistance against a defect such as wire-to-wire shorting can be improved, and the fabrication yield can also be improved.

Embodiment 6

Figure 34:
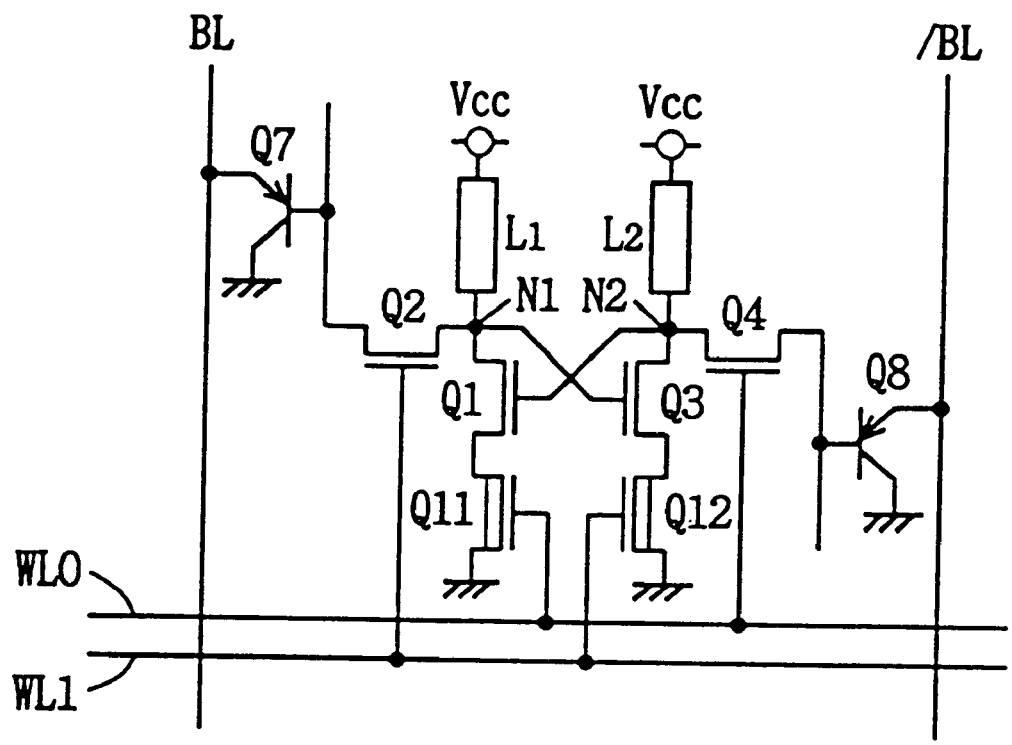
FIG. 34 is a partially enlarged view showing the structures of each memory cell, bit lines and word lines of an SRAM according to an embodiment 6 of the present invention.

FIG. 34 is a partially enlarged view showing each memory cell, bit lines and word lines in an SRAM according to an embodiment 6 fo the present invention.

The memory cell according to the embodiment 6 is different in structure from that of the embodiment 2 shown in FIG. 11 in the following points:

First, a first invertor forming a bistable element included in the memory cell includes a load element L1, a driver MOS transistor Q1 and a depletion MOS transistor Q11 which are serially connected between a power supply potential Vcc and a ground potential GND.

Similarly, a second invertor forming the bistable element also includes a load element L2, a driver MOS transistor Q2 and a depletion MQS transistor Q12 serially connected between another power supply potential Vcc and the ground potential GND.

Second, two word lines WL0 and WL1 are arranged every memory cell. The word line WL0 is connected with the gates of the depletion MOS transistor Q11 and an access transistor Q4, while the word line WL1 is connected with the depletion MOS transistor Q12 and an access transistor Q3.

Due to the aforementioned structure, the depletion MOS transistors Q11 and Q12 are in conducting states even if both of the word lines WL0 and WL1 are in non-selected states (low levels), to exert no influence on an operation for holding storage data.

Data read and write operations for the memory cell shown in FIG. 34 are now described.

Figure 35:
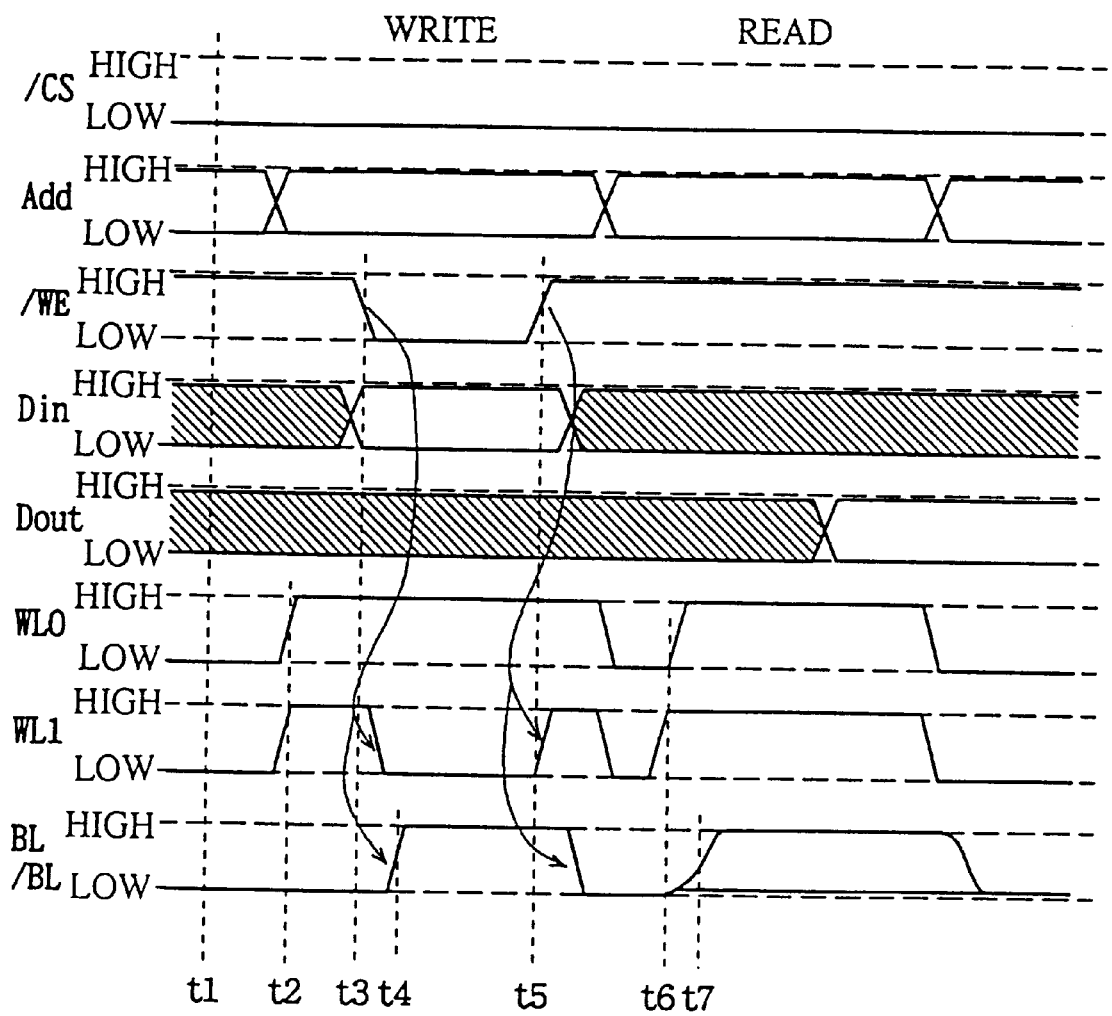
FIG. 35 is a timing chart for illustrating the operation of the SRAM according to the embodiment 6.

FIG. 35 is a timing chart for illustrating the write and read operations with respect to the memory cell shown in FIG. 34, in comparison with FIG. 12 showing the embodiment 2.

First, the write operation is described.

It is assumed that a chip select signal /CS is in an active state (low level) at a time t1.

A corresponding row is selected in response to an externally supplied address signal Add, and the word lines WL0 and WL1 of the corresponding row are changed to active states (high levels) at a time t2. In the following description, low levels are written in storage nodes N1 and N2 respectively.

A write enable signal /WE enters an active state (low level) at a time t3, whereby the word line WL0 is maintained in a selected state (high level), while the word line WL1 is changed to a non-selected state (low level). From this state, the potentials of the bit lines BL and /BL are pulled up to high levels. At this time, only the access transistor Q4 which is connected with the word line WL0 is in a conducting state. Therefore, assuming that the storage node N2 previously holds a low level, for example, a bipolar transistor Q8 enters a conducting state in response to the high potential level of the bit line /BL, to raise up the potential level of the storage node N2. At this time, the word line WL1 is in a non-selected state, and a current flowing through the depletion MOS transistor Q12 is suppressed as compared with the case where the word line WL1 is at a high level.

Therefore, the value of a current transiently flowing through the access transistor Q4, the driver transistor Q2 and the depletion MOS transistor Q12 can be suppressed to be smaller than that in the embodiment 1 shown in FIG. 11. With the transiently flowing current serving as a base current, therefore, the value of a current flowing from the bit line /BL to the ground through the bipolar transistor Q8 is also suppressed, whereby current consumption can be suppressed in the write operation.

The read operation is now described.

In response to new supply of the external address signal Add, the word lines WL0 and WL1 corresponding to the selected row enter selected states (high levels) at a time t6. At this time, the write enable signal /WE remains in an inactive state (high level), whereby the word lines WL0 and WL1 maintain the high levels throughout the read operation.

When the potentials of the bit lines BL and /BL are pulled up to high levels, either a bipolar transistor Q7 or the bipolar transistor Q8 enters a conducting state in response to the potential levels held by the storage nodes N1 and N2 respectively to discharge the corresponding bit line, since both of the access transistors Q3 and Q4 are in conducting states. Therefore, the potential levels of the bit lines BL and /BL are complimentarily changed in accordance with the information stored in the storage nodes N1 and N2. The change of the potential levels of the bit lines BL and /BL are externally outputted, thereby outputting read data to a data input/output terminal Dout.

Namely, the depletion transistors Q11 and Q12 are strongly in ON states in the read operation, whereby the value of the transient current flowing through the bistable element is substantially similar to that of the read operation shown in FIG. 12.

Due to the aforementioned structure, current consumption in data writing can be reduced as compared with that in data reading.

Figure 36:
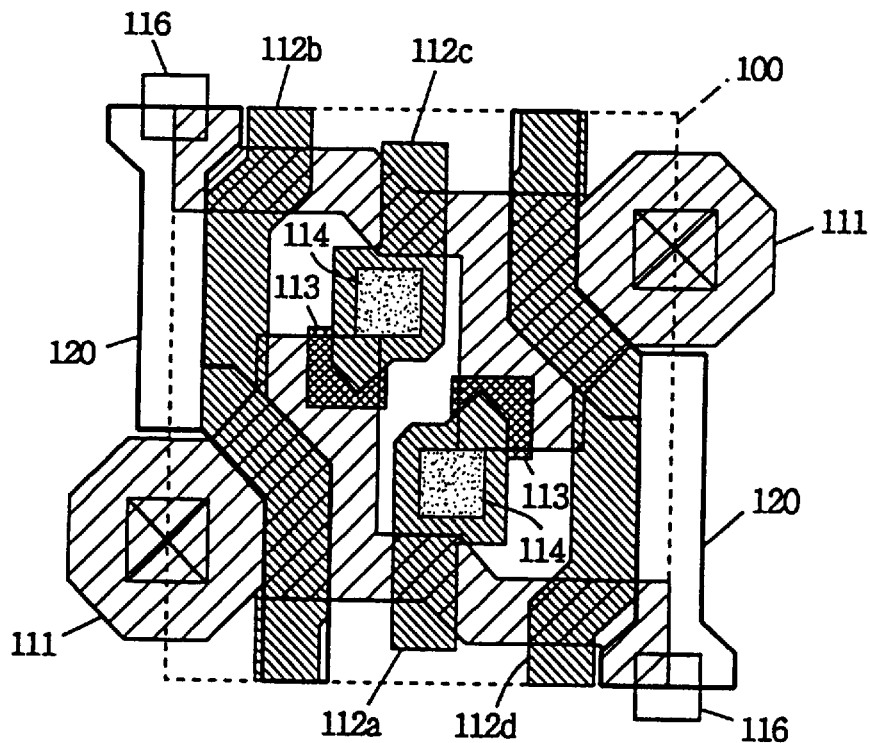
FIG. 36 is a plan view showing patterns of active regions and first and second polysilicon layers of each memory cell according to the embodiment 6 of the present invention.
Figure 37:
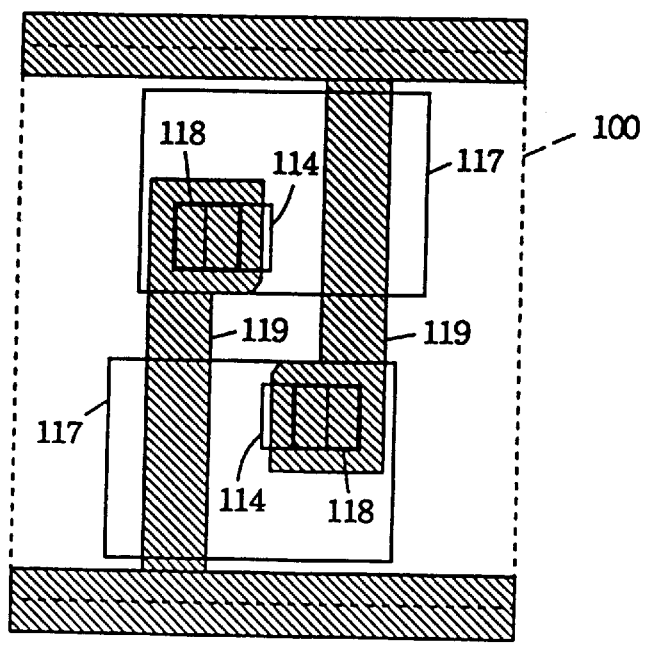
FIG. 37 is a plan view showing the structures of third and fourth polysilicon layer patterns of each memory cell according to the embodiment 6 of the present invention.
Figure 38:
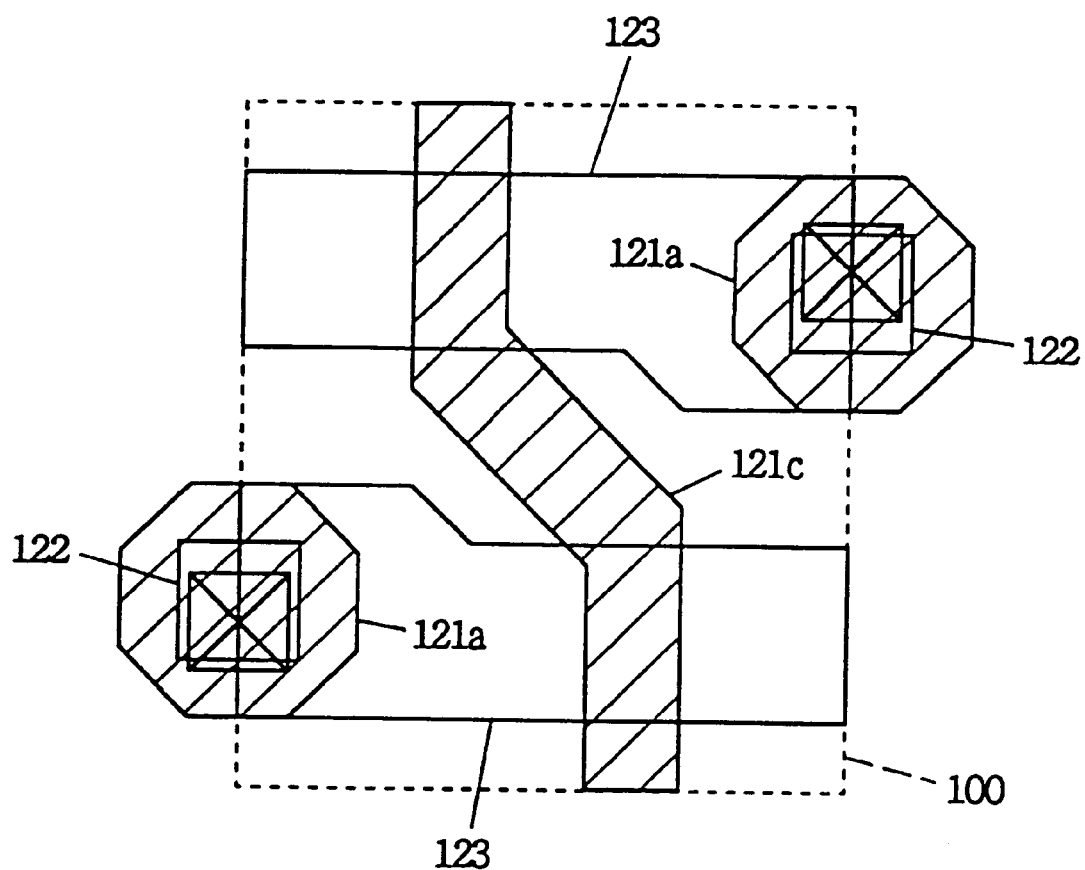
FIG. 38 is a plan view showing a metal wire pattern of each memory cell according to the embodiment 6 of the present invention.

FIGS. 36 to 38 are plan views showing the plane pattern of the memory cell shown in FIG. 34, in comparison with the plan views shown in FIGS. 28 to 31 in relation to the embodiment 5.

Portions identical to those in FIGS. 28 to 31 are denoted by the same reference numerals, to omit redundant description.

The plane pattern of the embodiment 6 is different from that of the embodiment 5 in the following points:

First polysilicon layers 112b, which are the gate electrodes of the access transistor Q3 and the depletion MOS transistor Q12, also serve as word lines. On the other hand, first polysilicon layers 112d, which are the gate electrodes of the access transistor Q4 and the depletion MOS transistor Q11, also serve as word lines. Therefore, no fourth polysilicon layers are employed as the word lines, dissimilarly to the embodiment 5 shown in FIG. 30.

Namely, the MOS transistors Q1, Q12, Q2 and Q11 are adjacently arranged along the word lines, whereby the word lines may not be wired through other wiring layers.

Fourth polysilicon layers 120 are employed as ground wires.

In the embodiment 6 shown in FIG. 38, bit lines 123 are formed by second metal layers, and connected to a first metal wire 121c via through holes 122, although the present invention is not restricted to this structure.

Although not restricted, the first metal wire 121c can be employed for signal transmission of a row selection circuit.

Embodiment 7

Figure 39:
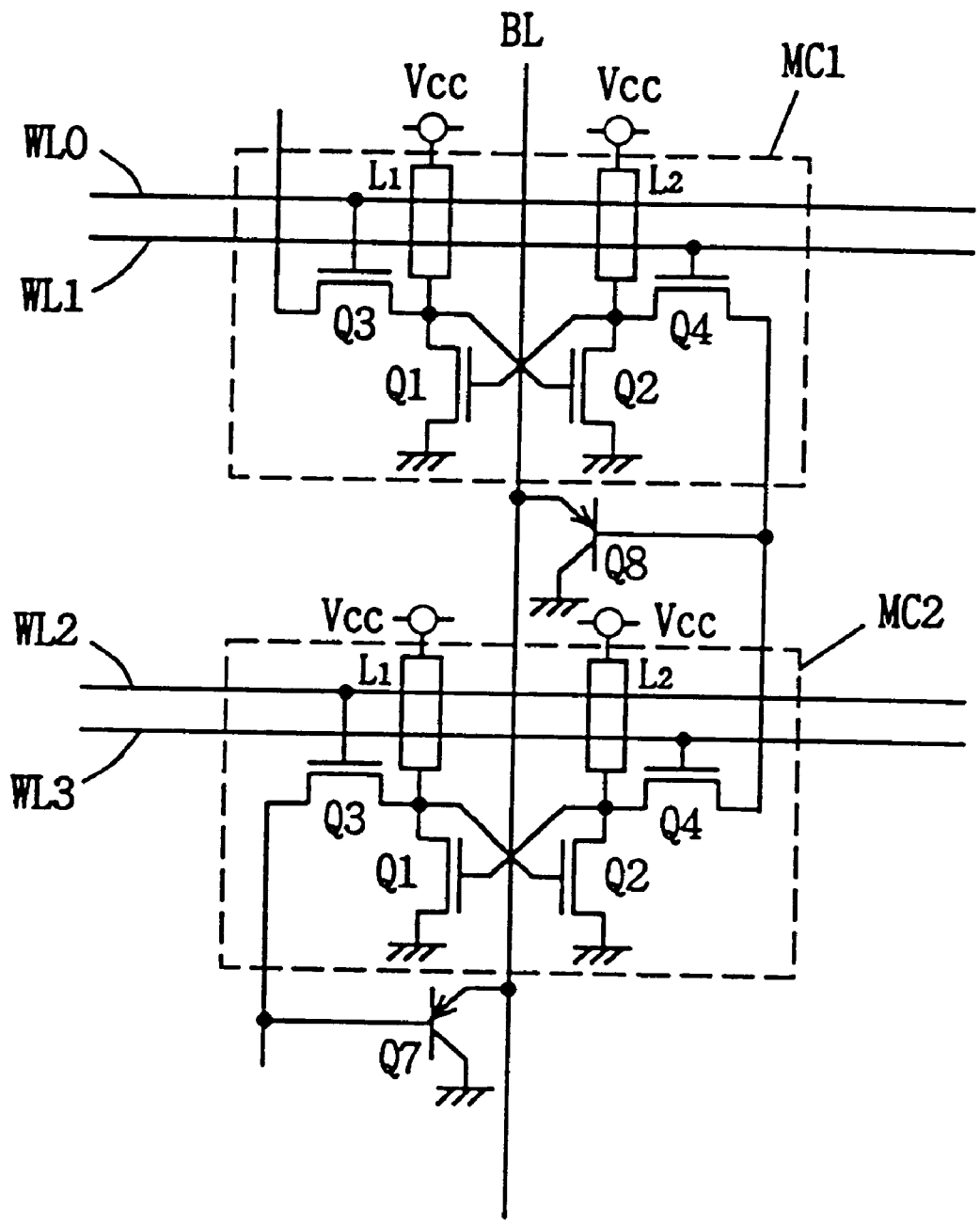
FIG. 39 is a partially enlarged view showing the structures of memory cells, a bit line and word lines of an SRAM according to an embodiment 7 of the present invention.

FIG. 39 is a partially enlarged view showing the structures of memory cells, a bit line and word lines of an SRAM according to an embodiment 7 of the present invention.

The structures of the memory cells according to the embodiment 7 are different from those of the memory cells according to the embodiment 1 in the following points:

First, a single bit line is arranged every memory cell.

Second, a pair of word lines are arranged every memory cell, in order to prevent access MOS transistors Q3 and Q4 included in the same memory cell from simultaneously entering conducting states in response to the single bit line.

Also due to this structure, the number of the bipolar transistors required for a 1-bit memory cell can be reduced from two required in the embodiment 1 to one, and the memory cell area can be reduced.

Referring to FIG. 39, it is assumed that a predetermined one of two word lines is selected in a data read operation, in correspondence to each memory cell. For example, even word lines WL0 and WL2 are selected for driving potentials of the corresponding bit lines in response to read data.

In a write operation, on the other hand, one of the two word lines corresponding to each memory cell is selected in response to written data.

Figure 40:
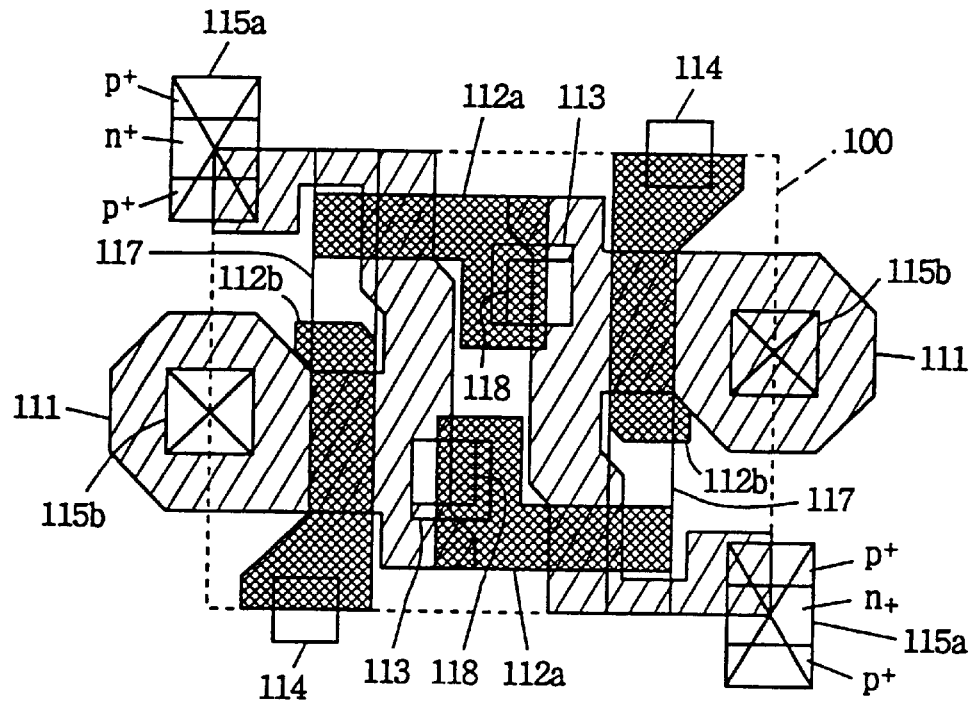
FIG. 40 is a plan view showing patterns of active regions and first and second polysilicon layers of each memory cell according to the embodiment 7 of the present invention.
Figure 41:
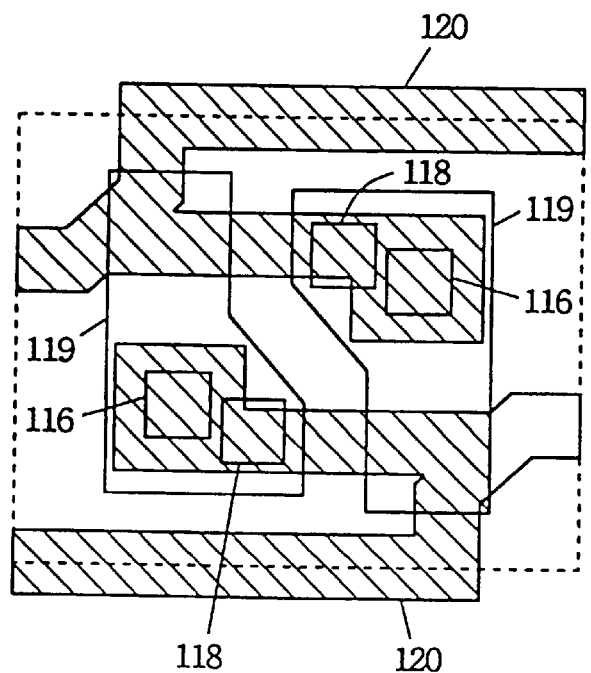
FIG. 41 is a plan view showing patterns of third and fourth polysilicon layers of each memory cell according to the embodiment 7 of the present invention.
Figure 42:
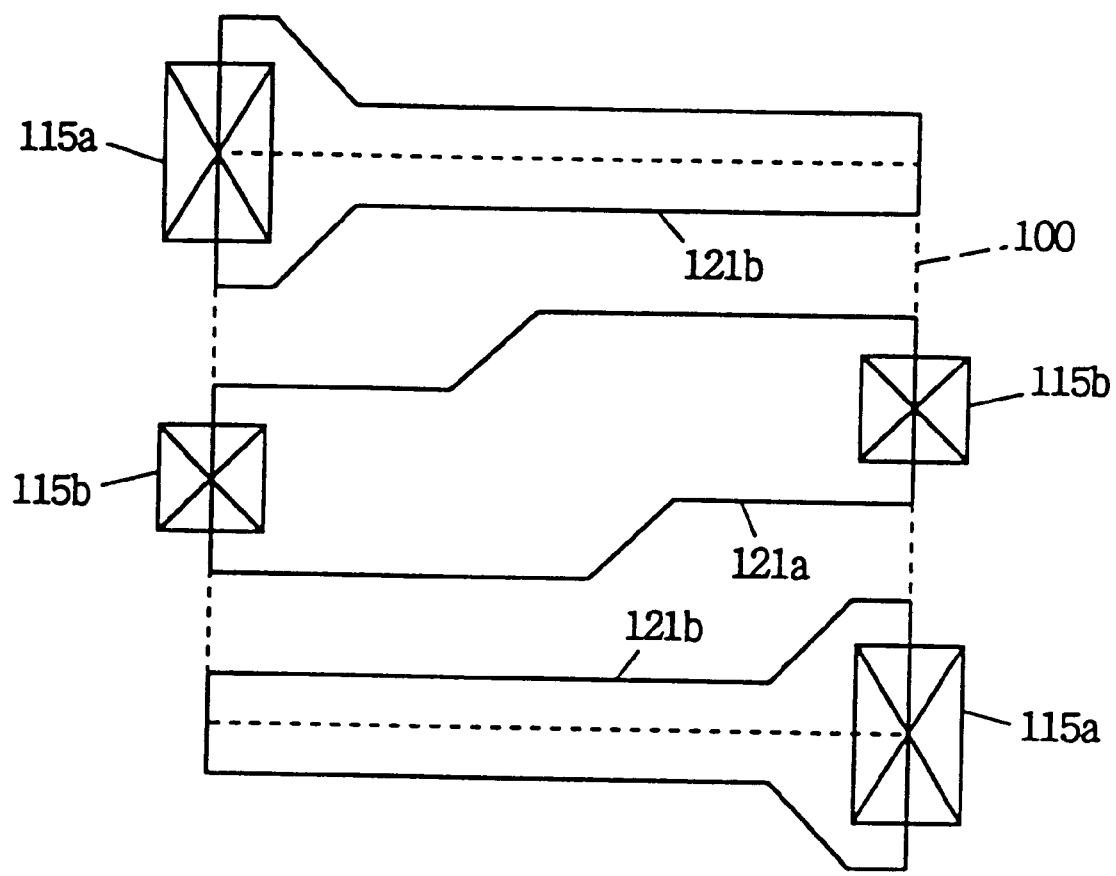
FIG. 42 is a plan view showing each bit line and ground wires of the memory cell according to the embodiment 7 of the present invention.
Figure 43:
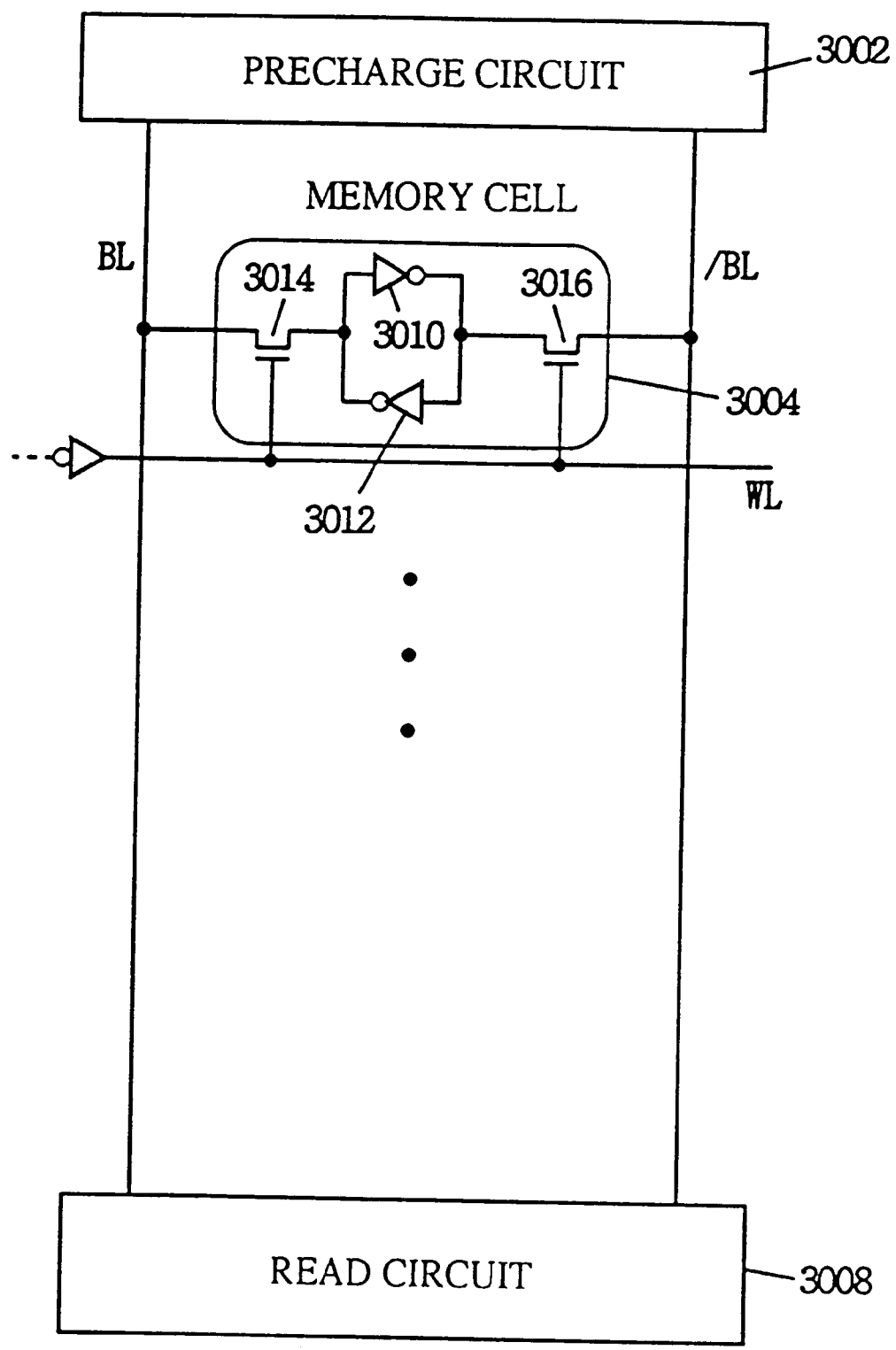
FIG. 43 is a schematic block diagram showing the structure of a read-system circuit of a conventional SRAM.

FIGS. 40 to 42 are plan views showing the plane pattern of each memory cell according to the embodiment 7, in correspondence to the plan views shown in FIGS. 36 to 38 in relation to the embodiment 6.

Portions identical to those of the embodiment 5 shown in FIGS. 28 to 31 are denoted by the same reference numerals. In the memory cell according to the embodiment 7, second polysilicon layers 117 define word lines, third polysilicon layers 119 define gate electrodes of TFTs, and fourth polysilicon layers 120 form channel and source/drain layers of TFTs which are load elements.

Metal wires 121b, which are ground wires, supply the ground potential to a substrate (well) and sources of driver transistors Q1 and Q2 through contact holes 115a.

The metal wires 121b are bit wires.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device, comprising:
    a plurality of word lines;
    a plurality of bit lines being provided across said word lines; and
    a memory cell array including a plurality of memory cells being arranged in the form of a matrix in correspondence to intersections between said word lines and said bit lines, each said memory cell including:
        two input/output nodes,
        a bistable element holding storage data, and
        switching means for switching connection between said bistable element and said input/output nodes in response to selection of corresponding said word line,
    said static semiconductor memory device further comprising:
        a plurality of bipolar transistors each being provided for at least every two said input/output nodes respectively belonging to adjacent said memory cells in each line of said memory cells aligned in a predetermined direction for driving the potential level of corresponding said bit line in response to potential levels of said input/output nodes of selected said memory cell.

2. The static semiconductor memory device in accordance with claim 1, wherein
    said word lines are provided in correspondence to respective rows of said memory cell array,
    said bit lines are provided in pairs in correspondence to respective columns of said memory cell array,
    each said bistable element has first and second storage nodes,
    each said switching means includes:
        first and second access MOS transistors for switching connection between said first storage node and a first one of said two input/output nodes and connection between said second storage node and a second one of said two input/output nodes respectively in response to selection of corresponding said word line,
    said plurality of bipolar transistors include:
        a plurality of first bipolar transistors each provided between first one of said paired bit lines and said memory cells both belonging to a corresponding column for corresponding one of pairs of memory cells being adjacently arranged in the column direction, and
        a plurality of second bipolar transistors each provided between second one of said paired bit lines and said memory cells both belonging to said corresponding column for corresponding one of pairs of memory cells deviating from said pairs of memory cells being connected with said first bipolar transistors by single memory cells in the column direction,
    each said first bipolar transistor has an emitter being connected with corresponding said bit line and a base being connected with two said first input/output nodes of corresponding said memory cells,
    each said second bipolar transistor has an emitter being connected with corresponding said bit line and a base being connected with two said second input/output nodes of corresponding said memory cells, and collectors of said first and second bipolar transistors are connected with back gates of said first and second access MOS transistors.

3. The static semiconductor memory device in accordance with claim 2, wherein said first and second bipolar transistors and said first and second access MOS transistors are formed on a major surface of a semiconductor substrate being provided with said static semiconductor memory device, base regions of said first bipolar transistors, said first input/output nodes and either source or drain regions of said first access MOS transistors share regions on said major surface, and base regions of said second bipolar transistors, said second input/output nodes and either source or drain regions of said second access MOS transistors share regions on said major surface.

4. The static semiconductor memory device in accordance with claim 1, wherein said word lines are provided in pairs in correspondence to respective rows of said memory cell array, said bit lines are provided in correspondence to respective columns of said memory cell array, each said bistable element has first and second storage nodes, each said switching means includes:
first and second access MOS transistors for switching connection between said first storage node and a first one of said two input/output nodes and connection between said second storage node and a second one of said two input/output nodes respectively in response to selection of corresponding said word line,
one and the other of said paired word lines are connected with both gates of said first and second access MOS transistors alternately with respect to said memory cells belonging to corresponding said row,
said plurality of bipolar transistors are provided in correspondence to pairs of memory cells being adjacently arranged in the row direction,
each said bipolar transistor has an emitter being connected with corresponding said bit line and a base being connected with said first input/output node of one of corresponding said memory cells and said second input/output node of the other one of said corresponding memory cells, and
a collector of each said bipolar transistor is connected with back gates of said first and second access MOS transistors.

5. The static semiconductor memory device in accordance with claim 4, wherein said bipolar transistors and said first and second access MOS transistors are formed on a major surface of a semiconductor substrate being provided with said static semiconductor memory device, and base regions of said bipolar transistors, corresponding said first and second input nodes, either source or drain regions of corresponding said first access MOS transistors, and either source or drain regions of corresponding said second access MOS transistors share regions on said major surface.

6. The static semiconductor memory device in accordance with claim 1, wherein said word lines are provided in pairs in correspondence to respective rows of said memory cell array, said bit lines are provided in correspondence to respective columns of said memory cell array, each said bistable element has first and second storage nodes, each said switching means includes:
first and second access MOS transistors for switching connection between said first storage node and one of said two input/output nodes and connection between said second storage node and the other one of said two input/output nodes respectively in response to selection of corresponding said word line,
one and the other of said paired word lines are connected with both gates of said first and second access MOS transistors alternately with respect to said memory cells belonging to corresponding said row,
each of said plurality of bipolar transistors is provided in correspondence to four said input/output nodes belonging to adjacent said memory cells of two rows and two columns respectively,
each said bipolar transistor is so arranged that another most approximate bipolar transistor is present in a diagonal direction of said memory cell array,
each said bipolar transistor has an emitter being connected with corresponding said bit line and a base being connected with said four input/output nodes of corresponding said memory cells, and
a collector of each said bipolar transistor is connected with back gates of said first and second access MOS transistors.

7. The static semiconductor memory device in accordance with claim 6, further comprising:

a first power source supplying a first potential corresponding to a first level of said storage data, and a second power source supplying a second potential corresponding to a second level of said storage data, each said bistable element includes:
a first invertor including a first load element, a first depletion MOS transistor and a first driver MOS transistor being serially connected between said first and second power sources, and
a second invertor including a second load element, a second depletion MOS transistor and a second driver MOS transistor being serially connected between said first and second power sources,
said first storage node being a connection point between said first load element and said first depletion MOS transistor is connected with a gate of said second driver MOS transistor,
said second storage node being a connection point between said second load element and said second depletion MOS transistor is connected with a gate of said first driver MOS transistor, and
said first and second depletion MOS transistors and said first and second access MOS transistors are formed on a major surface of a semiconductor substrate being provided with said static semiconductor memory device, with gate electrodes being formed by an integral polysilicon layer.

8. The static semiconductor memory device in accordance with claim 6, wherein said bipolar transistors and said first and second access MOS transistors are formed on a major surface of a semiconductor substrate being provided with said static semiconductor memory device, and base regions of said bipolar transistors, corresponding said first and second input/output nodes, either source or drain regions of corresponding said first access MOS transistors, and either source or drain regions of corresponding said second access MOS transistors share regions on said major surface.

9. The static semiconductor memory device in accordance with claim 1, wherein said word lines are provided in pairs in correspondence to respective rows of said memory cell array, said bit lines are provided in pairs in correspondence to respective columns of said memory cell array, each said bistable element includes:
 first and second storage nodes, and
 first and second invertors being cross-connected with each other so that connection points therebetween correspond to said first and second storage nodes,
said first and second invertors have first and second operating current control means controlling an operation current respectively,
each said switching means includes:
 a first access MOS transistor for switching connection between said first storage node and a first one of said two input/output nodes in response to selection of a first one of corresponding said paired word lines, and
 a second access MOS transistor for switching connection between said second storage node and a second one of said two input/output nodes in response to selection of a second one of corresponding said paired word lines,
said first and second operating current control means limit said operating current as compared with that in selection when said second and first word lines are in non-selected states respectively,
said plurality of bipolar transistors include:
 a plurality of first bipolar transistors each provided between first one of said paired bit lines and said memory cells both belonging to a corresponding column for corresponding one of pairs of memory cells being adjacently arranged in the column direction, and
 a plurality of second bipolar transistors each provided between second one of said paired bit lines and said memory cells both belonging to said corresponding column for corresponding one of pairs of memory cells deviating from said pairs of memory cells being connected with said first bipolar transistors by single memory cells in the column direction,
 each said first bipolar transistor has an emitter being connected with corresponding said bit line and a base being connected with two said first input/output nodes of corresponding said memory cells,
 each said second bipolar transistor has an emitter being connected with corresponding said bit line and a base being connected with two said second input/output nodes of corresponding said memory cells, and
 collectors of said first and second bipolar transistors are connected with back gates of said first and second access MOS transistors.

10. The static semiconductor memory device in accordance with claim 9, further comprising:

a first power source supplying a first potential corresponding to a first level of said storage data, and a second power source supplying a second potential corresponding to a second level of said storage data, wherein each said first invertor has a first load element, a first driver MOS transistor and a first depletion MOS transistor which is said first operating current control means, being serially connected between said first and second power sources, a connection point between said first load element and said first driver MOS transistor corresponds to said first storage node, each said second invertor has a second load element, a second driver MOS transistor and a second depletion MOS transistor which is said second operating current control means, being serially connected between said first and second power sources, a connection point between said second load element and said second driver MOS transistor corresponds to said second storage node, said first and second storage nodes are connected with gates of said second and first driver MOS transistors respectively, and gates of said first and second depletion MOS transistors are connected with said second and first word lines respectively.

11. The static semiconductor memory device in accordance with claim 10, wherein said first and second depletion MOS transistors and said first and second access MOS transistors are formed on a major surface of a semiconductor substrate being provided with said static semiconductor memory device, gate electrodes of said first access MOS transistor and said second depletion MOS transistor are formed by an integral polysilicon layer, and gate electrodes of said second access MOS transistor and said first depletion MOS transistor are formed by an integral polysilicon layer.

12. The static semiconductor memory device in accordance with claim 9, wherein said first and second bipolar transistors and said first and second access MOS transistors are formed on a major surface of a semiconductor substrate being provided with said static semiconductor memory device, base regions of said first bipolar transistors, said first input/output nodes aid either source or drain regions of said first MOS transistors share regions on said major surface, and base regions of said second bipolar transistors, said second input/output nodes and either source or drain regions of said second access MOS transistors share regions on said major surface.

13. The static semiconductor memory device in accordance with claim 1, wherein said word lines are provided in pairs in correspondence to respective rows of said memory cell array, said bit lines are provided in correspondence to respective columns of said memory cell array, each said bistable element has first and second storage nodes, each said switching means includes:
 a first access MOS transistor for switching connection between said first storage node and a first one of said two input/output nodes in response to selection of a first one of corresponding said paired word lines, and
 a second access MOS transistor for switching connection between said second storage node and a second one of said two input/output nodes in response to selection of a second one of corresponding said paired word lines, said plurality of bipolar transistor include:

a plurality of first bipolar transistors each provided between said bit line and said memory cells both belonging to a corresponding column for corresponding one of pairs of memory cells being adjacently arranged in the column direction for driving potential levels of corresponding said bit line in response to potential level of said first input/output nodes of corresponding said memory cell, and a plurality of second bipolar transistors each provided between said bit line and said memory cells both belonging to said corresponding column for corresponding one of pairs of adjacent memory cells deviating from said pairs of memory cells being connected with said first bipolar transistors by single memory cells in the column direction for driving potential levels of corresponding said bit line in response to potential level of said second input/output nodes of corresponding said memory cell, each said first bipolar transistor has an emitter being connected with corresponding said bit line and a base being connected with two said first input/output nodes of corresponding said memory cells, each said second bipolar transistor has an emitter being connected with corresponding said bit line and a base being connected with two said second input/output nodes of corresponding said memory cells, and collectors of said first and second bipolar transistors are connected with back gates of said first and second access MOS transistors.

14. The static semiconductor memory device in accordance with claim 13, wherein said first and second bipolar transistors and said first and second access MOS transistors are formed on a major surface of a semiconductor substrate being provided with said static semiconductor memory device, base regions of said first bipolar transistors, said first input/output nodes and either source or drain regions of said first access MOS transistors share regions on said major surface, and base regions of said second bipolar transistors, said second input/output nodes and either source or drain regions of said second access MOS transistors share regions on said major surface.

15. The static semiconductor memory device in accordance with claim 1, wherein the plurality of bipolar transistors are each provided for the at least every two said input/output nodes respectively and each belong to adjacent said memory cells in each line of said memory cells aligned in a predetermined direction for driving the potential level of a corresponding one of said bit lines in response to the potential levels of said input/output nodes of selected said memory cell.

* * * * *